United States Patent
Kim et al.

(10) Patent No.: US 9,876,176 B2
(45) Date of Patent: Jan. 23, 2018

(54) ARYL AMINE CONDENSED CYCLIC COMPOUND COMPRISING PYRENE MOIETIES AND ORGANIC LIGHT-EMITTING DIODE (OLED) INCLUDING THE SAME

(71) Applicant: Samsung Display Co., Ltd., Gyeonggi-Do (KR)

(72) Inventors: Soo-Yon Kim, Yongin (KR); Seok-Hwan Hwang, Yongin (KR); Young-Kook Kim, Yongin (KR); Jun-Ha Park, Yongin (KR); Hye-Jin Jung, Yongin (KR); Eun-Young Lee, Yongin (KR); Sang-Hyun Han, Yongin (KR); Jin-O Lim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 740 days.

(21) Appl. No.: 14/087,485

(22) Filed: Nov. 22, 2013

(65) Prior Publication Data

US 2014/0353617 A1 Dec. 4, 2014

(30) Foreign Application Priority Data

Jun. 4, 2013 (KR) ........................ 10-2013-0064322

(51) Int. Cl.
*H01L 51/00* (2006.01)
*H01L 51/50* (2006.01)

(52) U.S. Cl.
CPC ........ *H01L 51/006* (2013.01); *H01L 51/0054* (2013.01); *H01L 51/0058* (2013.01);
(Continued)

(58) Field of Classification Search
None
See application file for complete search history.

(56) References Cited

U.S. PATENT DOCUMENTS 7,053,255 B2 5/2006 Ikeda et al.
7,233,019 B2 6/2007 Ionkin et al.
(Continued)

FOREIGN PATENT DOCUMENTS

JP 2000-309566 11/2000
JP 2008-063340 3/2008
(Continued)

OTHER PUBLICATIONS

Yin et al. (A Quantitative Structure-Property Relationship Study of the Glass Transition Temperature of OLED Materials, J. Chem. Inf. Comput. Sci. 2003, 43, 970-977; Yin).*
(Continued)

*Primary Examiner* — Francisco Tschen
(74) *Attorney, Agent, or Firm* — Lee & Morse, P.C.

(57) ABSTRACT

A condensed compound is represented by Formula 1 below:

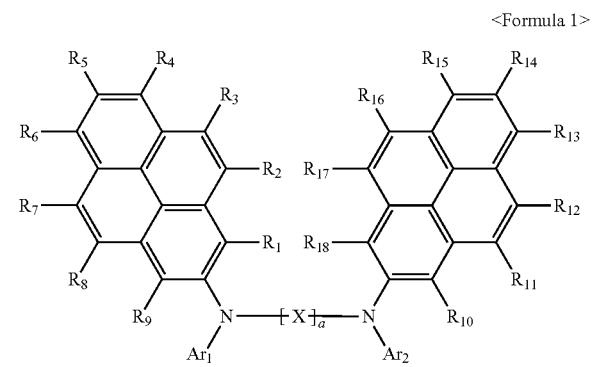

<Formula 1>

An organic light-emitting diode includes a substrate, a first electrode on the substrate, a second electrode disposed
(Continued)

opposite to the first electrode, and an organic layer interposed between the first electrode and the second electrode. The organic layer includes at least one layer including a compound of Formula 1.

15 Claims, 1 Drawing Sheet

(52) U.S. Cl.
CPC ...... *H01L 51/0061* (2013.01); *H01L 51/0067* (2013.01); *H01L 51/0072* (2013.01); *H01L 51/0073* (2013.01); *H01L 51/0074* (2013.01); *H01L 51/0094* (2013.01); *H01L 51/5012* (2013.01); *H01L 51/5056* (2013.01); *H01L 51/5088* (2013.01)

(56) References Cited

U.S. PATENT DOCUMENTS

| | | | |
|---|---|---|---|
| 2003/0072964 A1* | 4/2003 | Kwong | C07D 215/04 428/690 |
| 2004/0253389 A1* | 12/2004 | Suzuki | C07C 13/567 428/1.1 |
| 2005/0156164 A1 | 7/2005 | Sotoyama | |
| 2008/0233434 A1 | 9/2008 | Kawamura et al. | |
| 2009/0134781 A1 | 5/2009 | Jang et al. | |
| 2010/0187504 A1 | 7/2010 | Jang et al. | |

FOREIGN PATENT DOCUMENTS

| | | | | |
|---|---|---|---|---|
| JP | 2009-292806 | 12/2009 | | |
| KR | 10-2006-0006760 | 1/2006 | | |
| KR | 10-2008-0034137 | 4/2008 | | |
| KR | 10-2008-0071969 | 8/2008 | | |
| KR | 10-2008-0096440 | 10/2008 | | |
| KR | WO 2011136484 A1 * | 11/2011 | ............ | C07C 211/61 |
| WO | WO 2006011880 A1 * | 2/2006 | ............ | C07C 209/84 |
| WO | WO 2011136484 A1 * | 11/2011 | ............ | C07C 211/61 |

OTHER PUBLICATIONS

Barbosa-da-Silva et al. (QSPR based on support vector machines to predict the glass transition temperature of compounds used in manufacturing OLEDs, Molecular Simulation, 39, 3, 2003, 234-244; DaSilva).*

* cited by examiner

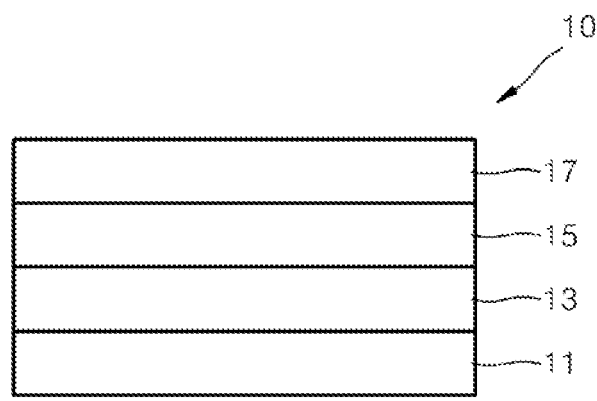

ARYL AMINE CONDENSED CYCLIC COMPOUND COMPRISING PYRENE MOIETIES AND ORGANIC LIGHT-EMITTING DIODE (OLED) INCLUDING THE SAME

CROSS-REFERENCE TO RELATED APPLICATION

The present application claims priority under 35 U.S.C. §119 to Korean Patent Application No. 10-2013-0064322, filed on Jun. 4, 2013, in the Korean Intellectual Property Office, and entitled: "Condensed Cyclic Compound and Organic Light-Emitting Diode Including the Same," which is incorporated by reference herein in its entirety.

BACKGROUND

1. Field of the Invention

The present invention relates to a condensed cyclic compound and an organic light-emitting diode including the same.

2. Description of the Related Art

Organic light-emitting diodes (OLEDs), which are self-emitting diodes, have advantages, such as wide viewing angles, excellent contrast, quick responses, high luminance, and low driving voltages, and provide multi-color images.

A typical OLED has a structure including an anode formed one a substrate, and a hole transport layer (HTL), an emission layer (EML), an electron transport layer (ETL), and a cathode that are sequentially stacked on the substrate. In this regard, the HTL, the EML, and the ETL are organic thin films formed of organic compounds.

An operating principle of an OLED having the above-described structure is as follows. When a voltage is applied between the anode and cathode, holes injected from the anode move to the EML via the HTL, and electrons injected from the cathode move to the EML via the ETL. Carriers such as the holes and electrons recombine in the EML to generate excitons. When the exitons drop from an excited state to a ground state, light is emitted.

A novel material that can manufacture an OLED having high luminous, high efficiency, and long lifetime is needed.

SUMMARY

The present invention provides a novel condensed cyclic compound for an organic light-emitting diode (OLED) and an OLED including an organic layer having the condensed cyclic compound. The OLED has characteristics of low voltages, high luminosity, high efficiency, high color purity, and long lifetime.

Embodiments are directed to a condensed cyclic compound represented by Formula 1 below:

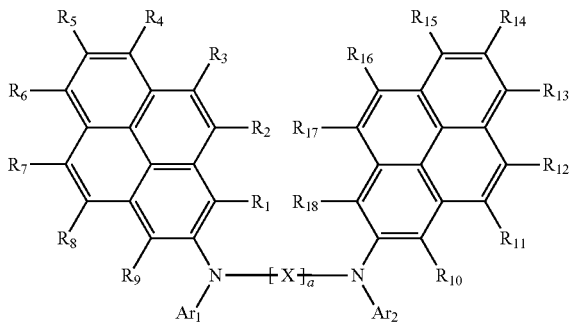

<Formula 1> wherein:

X is a substituted or unsubstituted $C_6$-$C_{60}$ arylene group or a substituted or unsubstituted $C_3$-$C_{60}$ heteroarylene group;

a is an integer ranging from 1 to 3, and when a is 2 or 3, the Xs are identical to or different from each other;

$Ar_1$ and $Ar_2$ are each independently at least one of a substituted or unsubstituted $C_6$-$C_{60}$ aryl group or a substituted or unsubstituted $C_3$-$C_{60}$ heteroaryl group;

$R_1$ to $R_{18}$ are each independently a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ aryloxy group, a substituted or unsubstituted $C_6$-$C_{60}$ arylthio group, —Si($Q_1$)($Q_2$)($Q_3$), or —N($Q_4$)($Q_5$); and $Q_1$ to $Q_5$ are each independently a substituted or unsubstituted $C_1$-$C_{60}$ alkyl group, a substituted or unsubstituted $C_6$-$C_{60}$ aryl group, or a substituted or unsubstituted $C_2$-$C_{60}$ heteroaryl group.

Embodiments may be realized by providing a compound wherein X is:

a substituted or unsubstituted phenylene group, a substituted or unsubstituted biphenylene group, a substituted or unsubstituted terphenylene group, a substituted or unsubstituted pentaphenylene group, a substituted or unsubstituted pentalenylene group, a substituted or unsubstituted indenylene group, a substituted or unsubstituted naphthylene group, a substituted or unsubstituted azulenylene group, a substituted or unsubstituted indacenylene group, a substituted or unsubstituted acenaphthylene group, a substituted or unsubstituted phenalenylene group, a substituted or unsubstituted fluorenylene group, a substituted or unsubstituted phenanthrenylene group, a substituted or unsubstituted anthrylene group, a substituted or unsubstituted fluoranthenylene group, a substituted or unsubstituted dibenzofluorenylene group, a substituted or unsubstituted pyrenylene group, a substituted or unsubstituted naphthacenylene group, a substituted or unsubstituted chrysenylene group, a substituted or unsubstituted triphenylenylene group, a substituted or unsubstituted perylenylene group, a substituted or unsubstituted picenylene group, a substituted or unsubstituted hexacenylene group, a substituted or unsubstituted spirofluorenylene group, a substituted or unsubstituted pyrrolylene group, a substituted or unsubstituted furylene group, a substituted or unsubstituted pyrazolylene group, a substituted or unsubstituted imidazolylene group, a substituted or unsubstituted oxazolylene group, a substituted or unsubstituted isoxazolylene group, a substituted or unsubstituted triazolylene group, a substituted or unsubstituted tetrazolylene group, a substituted or unsubstituted oxadiazolylene group, a substituted or unsubstituted pyridylene group, a substituted or unsubstituted pyrimidinylene group, a substituted or unsubstituted pyrazinylene group, a substituted or unsubstituted pyridazinylene group, a substituted or unsubstituted triazinylene group, a substituted or unsubstituted pyranylene group, a substituted or unsubstituted thiophenylene group, a substituted or unsubstituted thiazolylene group, a substituted or unsubstituted isothiazolylene group, a substituted or unsubstituted indolylene group, a substituted or unsubstituted isoindolylene group, a substituted or unsubstituted indolizinylene group, a substituted or unsubstituted benzofurylene group, a substituted or unsubstituted isobenzofurylene group, a substituted or unsubstituted indazolylene group, a substituted or unsubstituted benzimidazolylene group, a substituted or unsubstituted benzoxazolylene group, a substituted or unsubstituted benzisoxazolylene group, a substituted or unsubstituted imidazopyridylene group, a substituted or unsubstituted purinylene group, a substituted or unsubstituted quinolylene group, a substituted or unsubstituted isoquinolylene group, a substituted or unsubstituted phthalazinylene group, a substituted or unsubstituted quinazolinylene group, a substituted or unsubstituted quinoxalinylene group, a substituted or unsubstituted naphthyridinylene group, a substituted or unsubstituted cinnolinylene group, a substituted or unsubstituted benzothiophenylene group, a substituted or unsubstituted benzothiazolylene group, a substituted or unsubstituted carbazolylene group, a substituted or unsubstituted benzocarbazolylene group, a substituted or unsubstituted pyridoindolylene group, a substituted or unsubstituted dibenzofurylene group, a substituted or unsubstituted phenanthridinylene group, a substituted or unsubstituted benzoquinolylene group, a substituted or unsubstituted phenazinylene group, a substituted or unsubstituted dibenzosilolylene group, or a substituted or unsubstituted dibenzothiophenylene group, provided that:
when X is an anthrylene group, a is 2, and
when X is a phenanthrylene group, the phenanthrylene group is a 3,6-phenanthrylene group or a 9,10-phenanthrylene group.

Embodiments may be realized by providing a compound wherein X is a substituted or unsubstituted phenylene group, a substituted or unsubstituted biphenylene group, a substituted or unsubstituted terphenylene group, a substituted or unsubstituted naphthylene group, a substituted or unsubstituted fluorenylene group, a substituted or unsubstituted phenanthrenylene group, a substituted or unsubstituted anthrylene group, a substituted or unsubstituted pyrenylene group, a substituted or unsubstituted dibenzofluorenylene group, a substituted or unsubstituted carbazolylene group, a substituted or unsubstituted benzocarbazolylene group, a substituted or unsubstituted dibenzosilolylene group, or a substituted or unsubstituted dibenzothiophenylene group, wherein:
when X is an anthrylene group, a is 2, and when X is a phenanthrylene group, the phenanthrylene group is a 3,6-phenanthrylene group or a 9,10-phenanthrylene group.

Embodiments may be realized by providing a compound wherein X is a group represented by one of Formulas 2A to 2N below, provided that when X includes a group of Formula 2D, a is 2:

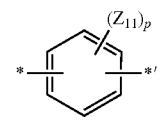

Formula 2A

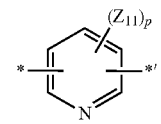

Formula 2B

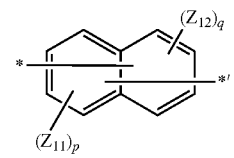

Formula 2C

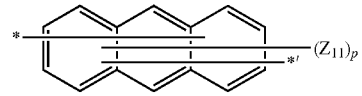

Formula 2D

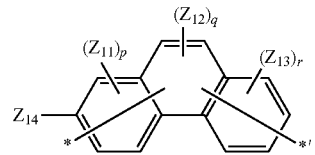

Formula 2E

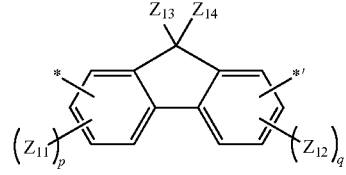

Formula 2F

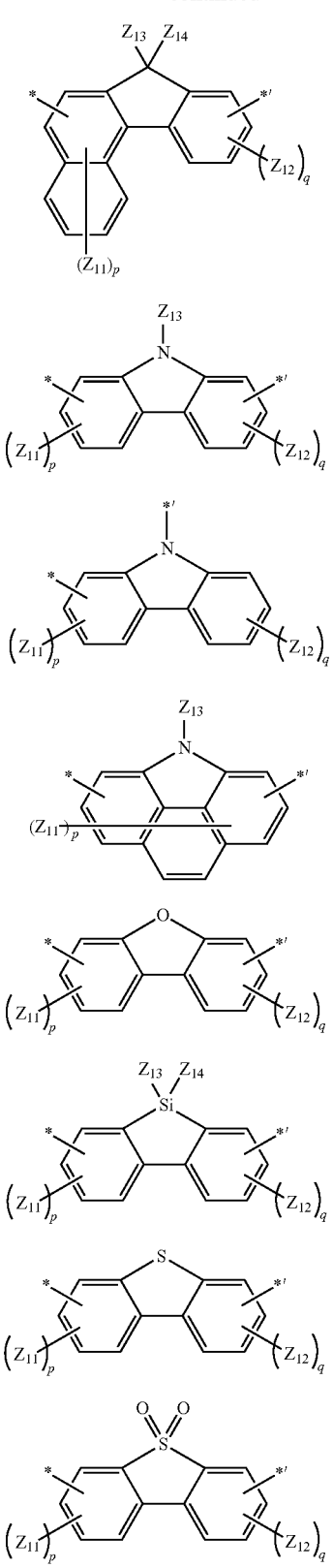

Formula 2G

Formula 2H

Formula 2I

Formula 2J

Formula 2K

Formula 2L

Formula 2M

Formula 2N wherein:
$Z_{11}$ to $Z_{14}$ are each independently:
a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, or a $C_2$-$C_{20}$ heteroaryl group;

a $C_1$-$C_{20}$ alkyl group or a $C_1$-$C_{20}$ alkoxy group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, or a phosphoric acid group or a salt thereof; or a $C_6$-$C_{20}$ aryl group or a $C_2$-$C_{20}$ heteroaryl group, each substituted with at least one of a deuterium atom, a halogen group, a hydroxyl group, a cyano group, a nitro group, an amino group, an amidino group, a hydrazine, a hydrazone group, a carboxyl group or a salt thereof, a sulfonic acid group or a salt thereto, a phosphoric acid group or a salt thereof, a $C_1$-$C_{20}$ alkyl group, a $C_1$-$C_{20}$ alkoxy group, a $C_6$-$C_{20}$ aryl group, or a $C_2$-$C_{20}$ heteroaryl group, wherein a plurality of $Z_{11}$ to $Z_{14}$ are identical to or different from each other, and $Z_{13}$ and $Z_{14}$ optionally form a part of a ring, and wherein p is an integer ranging from 2 to 8, q is an integer ranging from 2 to 4, r is 3 or 4, and * and *' are binding sites.

Embodiments may be realized by providing a compound wherein $Z_{11}$ to $Z_{14}$ are each independently:

a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a methyl group, an ethyl group, a propyl group, a butyl group, a methoxy group, an ethoxy group, a propoxy group, a butoxy group, a pentoxy group, a phenyl group, a naphthyl group, an anthryl group, a phenanthrenyl group, a pyrenyl group, a fluorenyl group, a pyridinyl group, a pyrimidinyl group, a triazinyl group, a quinolyl group, or a carbazole group;

a methyl group, an ethyl group, a propyl group, a butyl group, a methoxy group, an ethoxy group, a propoxy group, a butoxy group, or a pentoxy group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, or a phosphoric acid group or a salt thereof; or a pyridinyl group, a pyrimidinyl group, a triazinyl group, a quinolyl group, or a carbazole group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a $C_1$-$C_{20}$ alkyl group, or a $C_1$-$C_{20}$ alkoxy group.

Embodiments may be realized by providing a compound wherein X is a group represented by one of Formulas 3A to 3AC below:

Formula 3A
Formula 3B
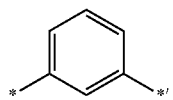
Formula 3C
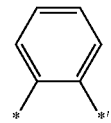
Formula 3D
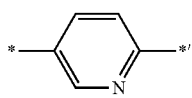
Formula 3E
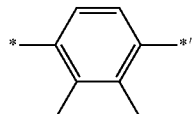
Formula 3F
Formula 3G
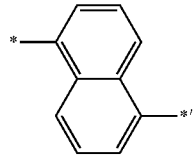
Formula 3H
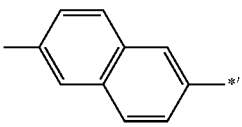
Formula 3I
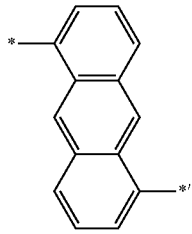
Formula 3J
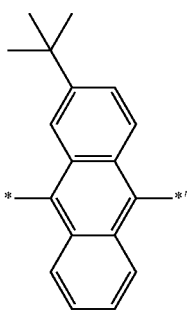
Formula 3K
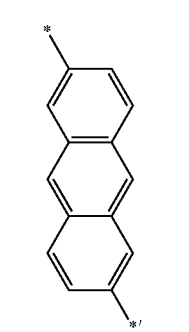
Formula 3L
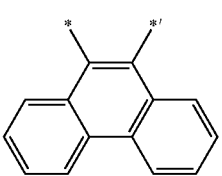
Formula 3M
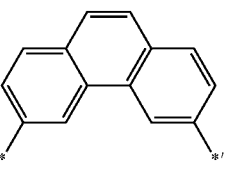
Formula 3N
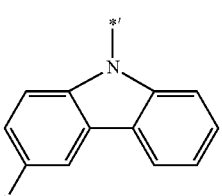
Formula 3O
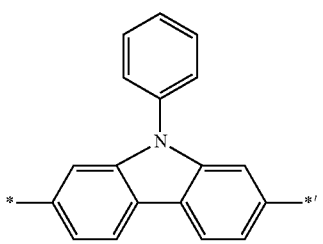

-continued

Formula 3P

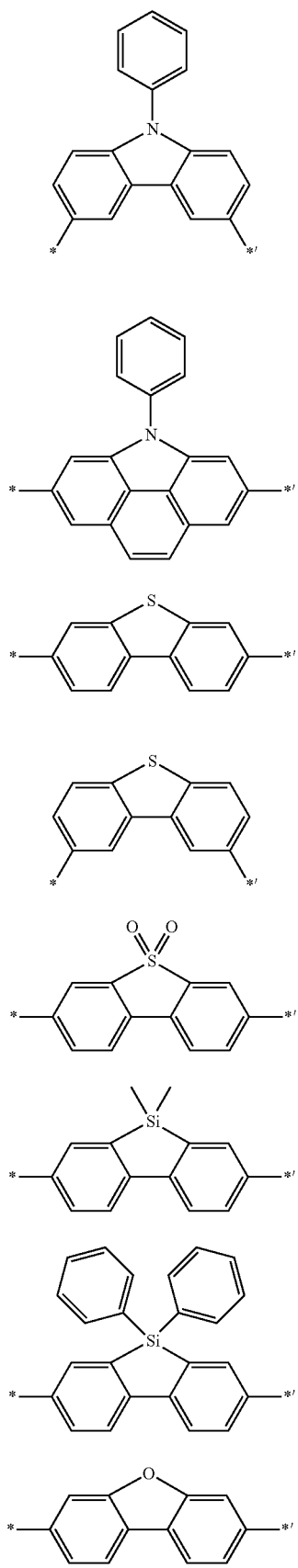

Formula 3Q

Formula 3R

Formula 3S

Formula 3T

Formula 3U

Formula 3V

Formula 3W

-continued

Formula 3X

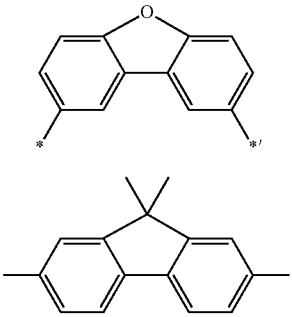

Formula 3Y

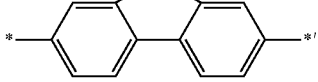

Formula 3Z

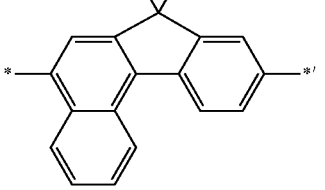

Formula 3AA

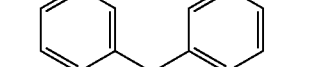

Formula 3AB

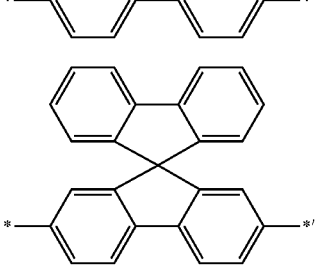

Formula 3AC provided that:
when X includes a group of Formulas 3H to 3K, a is 2, and
* and *' are binding sites.

Embodiments may be realized by providing a compound wherein $Ar_1$ and $Ar_2$ are each independently:
a substituted or unsubstituted phenyl group, a substituted or unsubstituted biphenyl group, a substituted or unsubstituted terphenyl group, a substituted or unsubstituted pentaphenyl group, a substituted or unsubstituted pentalenyl group, a substituted or unsubstituted indenyl group, a substituted or unsubstituted naphthyl group, a substituted or unsubstituted zulenyl group, a substituted or unsubstituted indacenyl group, a substituted or unsubstituted cenaphthyl group, a substituted or unsubstituted phenalenyl group, a substituted or unsubstituted fluorenyl group, a substituted or unsubstituted phenanthrenyl group, a substituted or unsubstituted nthryl group, a substituted or unsubstituted fluoranthenyl group, a substituted or unsubstituted dibenzofluorenyl group, a substituted or unsubstituted pyrenyl group, a substituted or unsubstituted naphthacenyl group, a substituted or unsubstituted chrysenyl group, a substituted or unsubstituted triphenylenyl group, a substituted or unsubstituted perylenyl group, a substituted or unsubstituted picenyl group, a substituted or unsubstituted hexacenyl group, a substituted or unsubstituted spiro-fluorenyl group, a substituted or unsubstituted pyrrolyl group, a substituted or unsubstituted furyl group, a substituted or unsubstituted pyrazolyl group, a substituted or unsubstituted imidazolyl group, a substituted or unsubstituted oxazolyl group, a substituted or unsubstituted isoxazolyl group, a substituted or unsubstituted triazolyl group, a substituted or unsubstituted tetrazolyl group, a substituted or unsubstituted oxadiazolyl group, a substituted or unsubstituted pyridyl group, a substituted or unsubstituted pyrimidinyl group, a substituted or unsubstituted pyrazinyl group, a substituted or unsubstituted pyridazinyl group, a substituted or unsubstituted triazinyl group, a substituted or unsubstituted pyranyl group, a substituted or unsubstituted thiophenyl group, a substituted or unsubstituted thiazolyl group, a substituted or unsubstituted isothiazolyl group, a substituted or unsubstituted indolyl group, a substituted or unsubstituted isoindolyl group, a substituted or unsubstituted indolizinyl group, a substituted or unsubstituted benzofuryl group, a substituted or unsubstituted isobenzofuryl group, a substituted or unsubstituted indazolyl group, a substituted or unsubstituted benzimidazolyl group, a substituted or unsubstituted benzoxazolyl group, a substituted or unsubstituted benzisoxazolyl group, a substituted or unsubstituted imidazopyridyl group, a substituted or unsubstituted purinyl group, a substituted or unsubstituted quinolyl group, a substituted or unsubstituted isoquinolyl group, a substituted or unsubstituted phthalazinyl group, a substituted or unsubstituted quinazolinyl group, a substituted or unsubstituted quinoxalinyl group, a substituted or unsubstituted naphthyridinyl group, a substituted or unsubstituted cinnolinyl group, a substituted or unsubstituted benzothiophenyl group, a substituted or unsubstituted benzothiazolyl group, a substituted or unsubstituted carbazolyl group, a substituted or unsubstituted benzocarbazolyl group, a substituted or unsubstituted pyridoindolyl group, a substituted or unsubstituted dibenzofuryl group, a substituted or unsubstituted phenanthridinyl group, a substituted or unsubstituted benzoquinolyl group, a substituted or unsubstituted phenazinyl group, a substituted or unsubstituted dibenzosilolyl group, or a substituted or unsubstituted dibenzothiophenyl group.

Embodiments may be realized by providing a compound wherein $Ar_1$ and $Ar_2$ are each independently:

a substituted or unsubstituted phenyl group, a substituted or unsubstituted biphenyl group, a substituted or unsubstituted naphthyl group, a substituted or unsubstituted fluorenyl group, a substituted or unsubstituted phenanthrenyl group, a substituted or unsubstituted pyridyl group, a substituted or unsubstituted dibenzofuryl group, a substituted or unsubstituted dibenzosilolyl group, or a substituted or unsubstituted dibenzothiophenyl group.

Embodiments may be realized by providing a compound wherein $Ar_1$ and $Ar_2$ are each independently a group represented by Formulas 4A to 4G below:

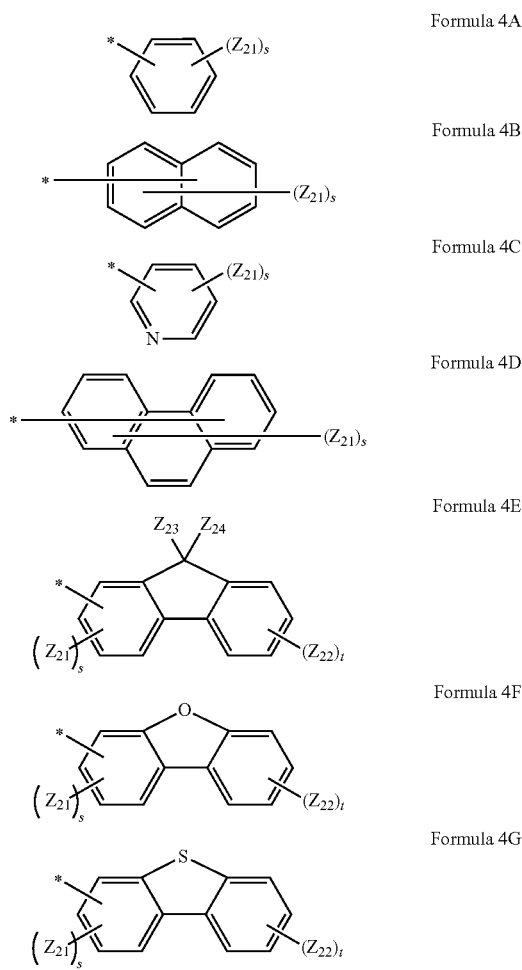

wherein:

$Z_{21}$ and $Z_{22}$ are each independently:

a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, or a $C_2$-$C_{20}$ heteroaryl group;

a $C_1$-$C_{20}$ alkyl group or a $C_1$-$C_{20}$ alkoxy group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, or a phosphoric acid group or a salt thereof; or a $C_6$-$C_{20}$ aryl group or a $C_2$-$C_{20}$ heteroaryl group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, or a $C_2$-$C_{20}$ heteroaryl group, wherein:
s is an integer ranging from 3 to 9,
t is 4,
* is a binding site, and
optionally 2 or more of $Z_{21}$ form a ring.
Embodiments may be realized by providing a compound wherein $Ar_1$ and $Ar_2$ are each independently a group represented by one of Formulas 5A to 5V below:
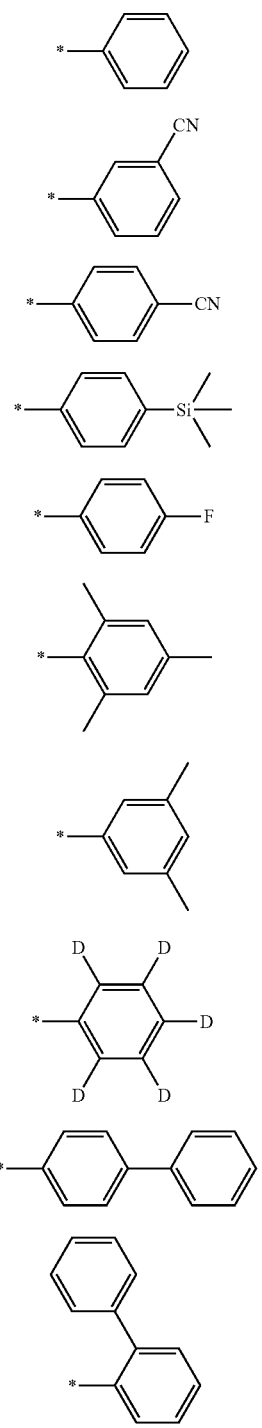
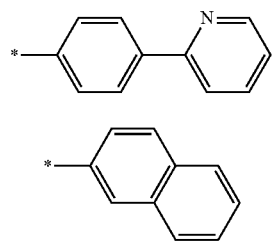

-continued

Formula 5T

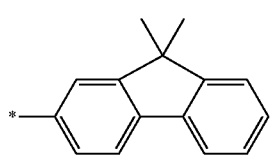

Formula 5U

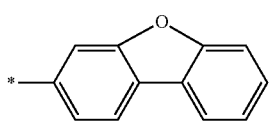

Formula 5V

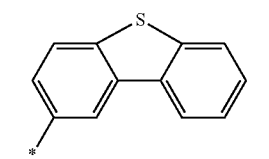

wherein
* is a binding site.

Embodiments may be realized by providing a compound wherein $R_1$ to $R_{18}$ are each independently:

a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, an anthryl group, a fluorenyl group, a dibenzofuranyl group, or a dibenzothiophenyl group; or a $C_1$-$C_{10}$ alkyl group, a $C_1$-$C_{10}$ alkoxy group, a phenyl group, a naphthyl group, an anthryl group, a fluorenyl group, a dibenzofuranyl group, or a dibenzothiophenyl group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, or a phosphoric acid group or a salt thereof.

Embodiments may be realized by providing a compound wherein $R_1$ to $R_{18}$ are each independently:

a hydrogen atom, a deuterium atom, a halogen group, a methyl group, an ethyl group, a propyl group, a butyl group, a methoxy group, an ethoxy group, a propoxy group, a butoxy group, or a pentoxy group.

Embodiments may be realized by providing a compound represented by Formulas 1 to 70 below:

1

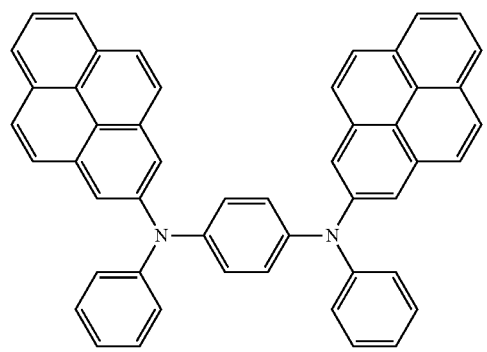

2

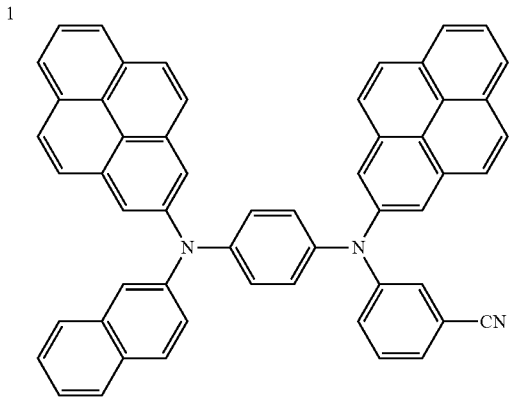

3

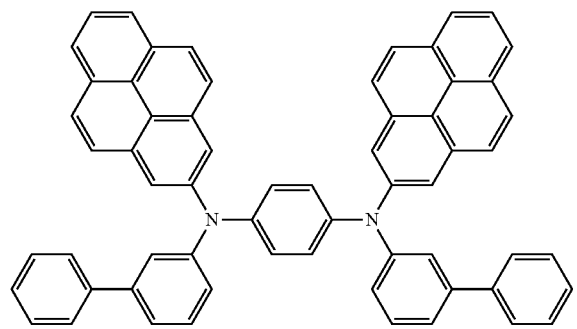

4

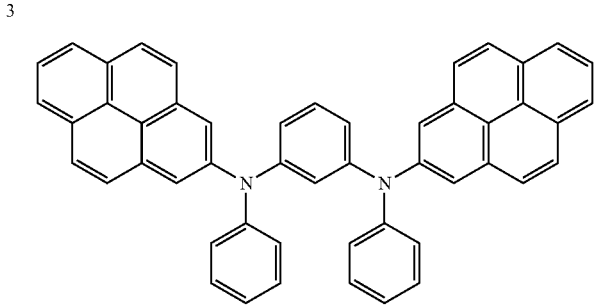

-continued
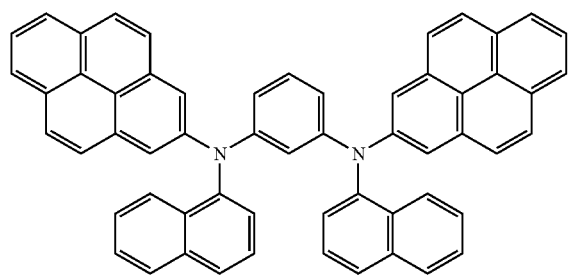
5
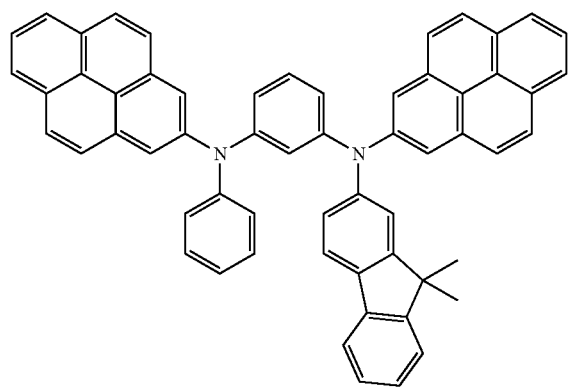
6
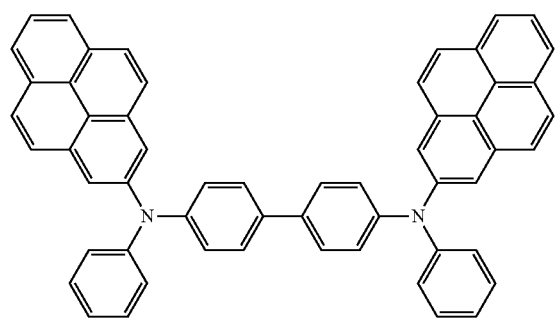
7
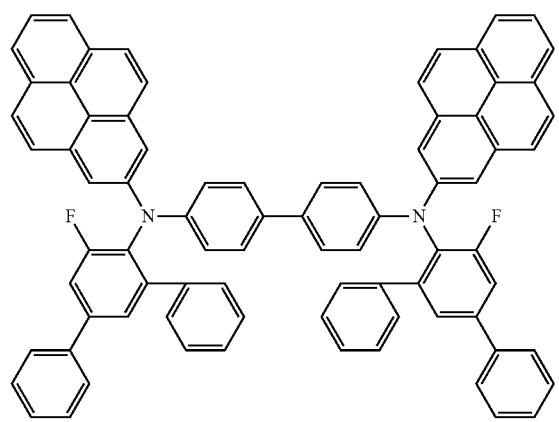
8
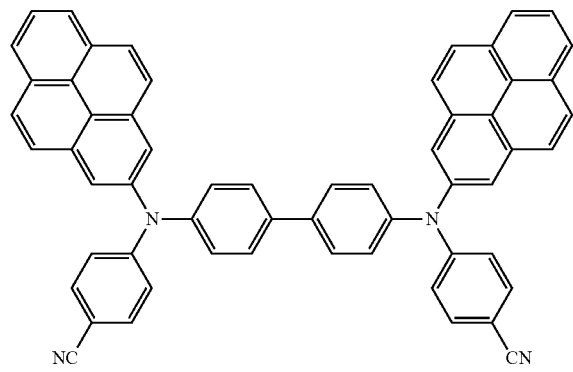
9
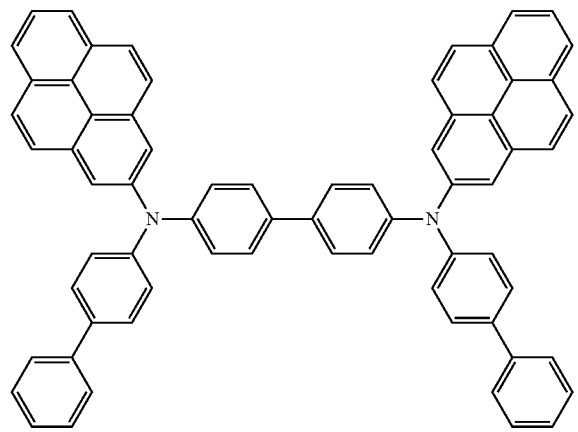
10
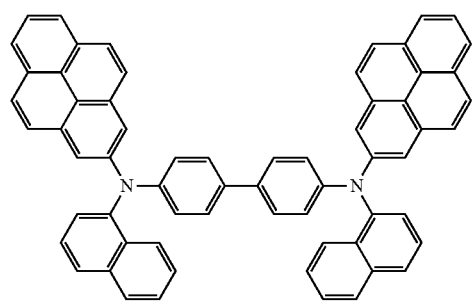
11
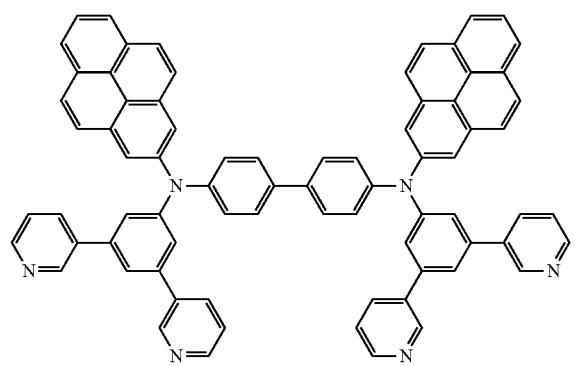
12

-continued
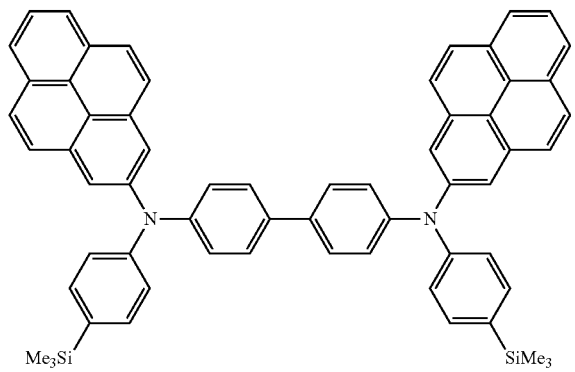
13
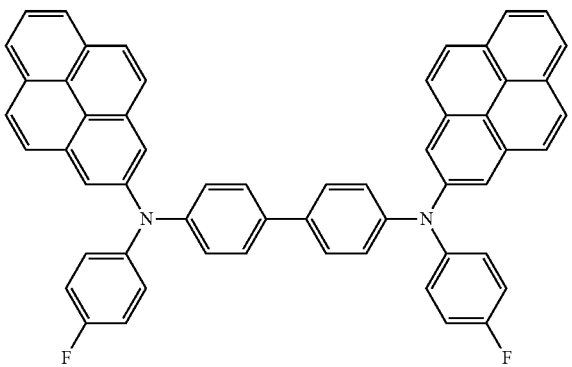
14
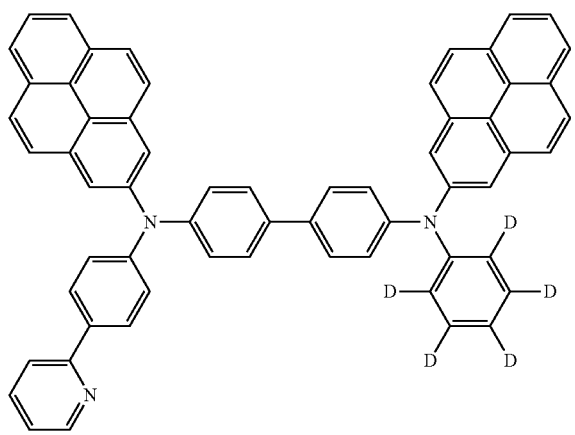
15
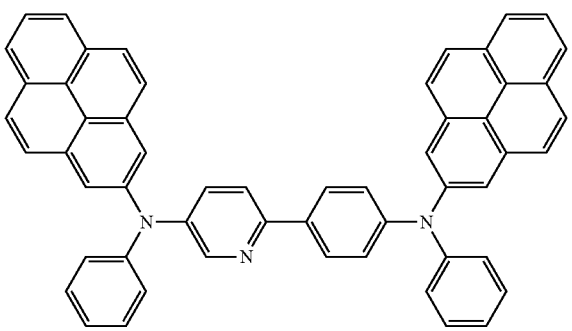
16
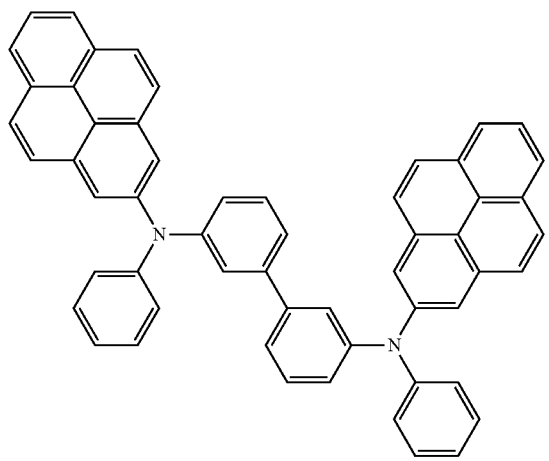
17
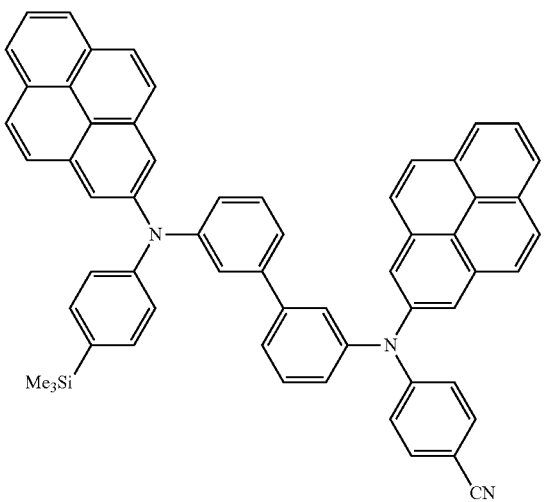
18

-continued
19
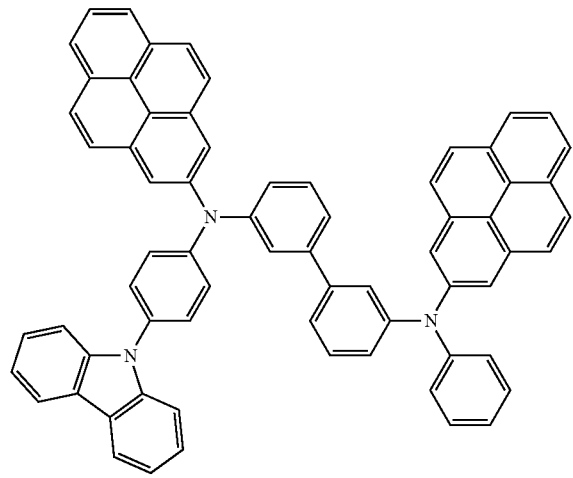
20
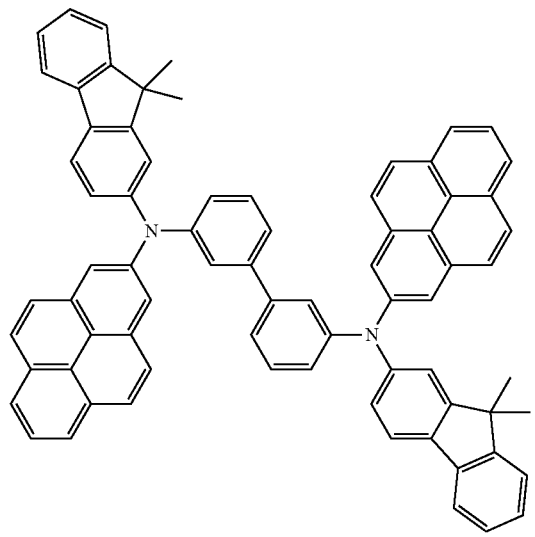
21
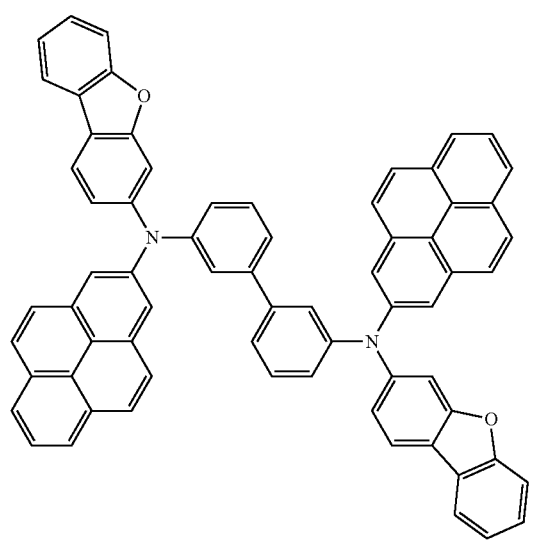
22
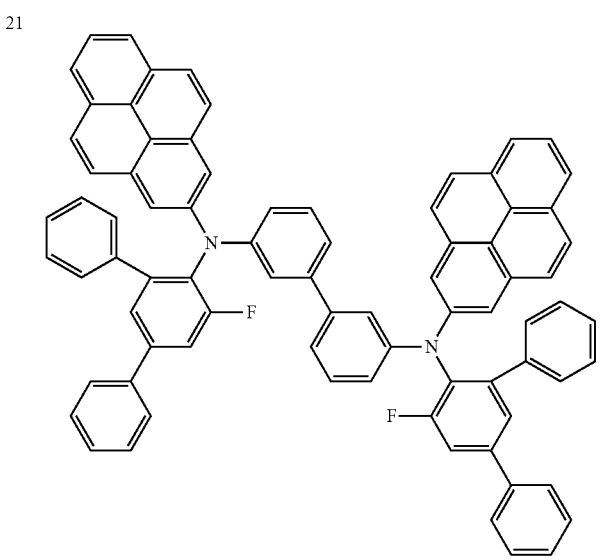
23
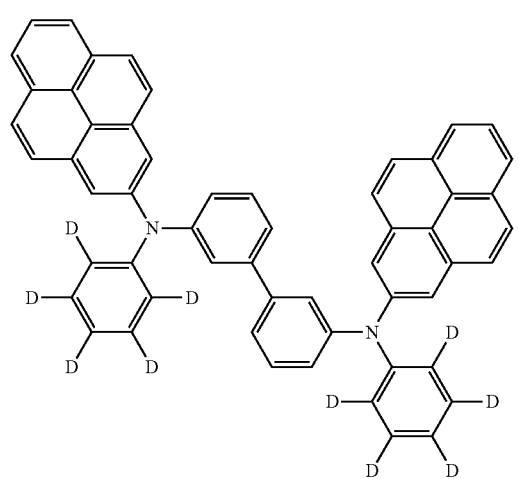
24
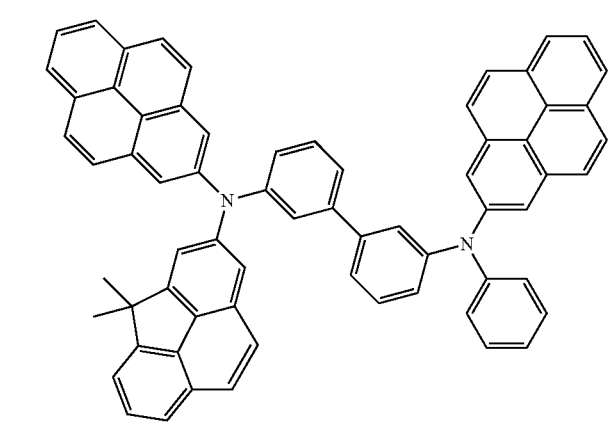

-continued
25
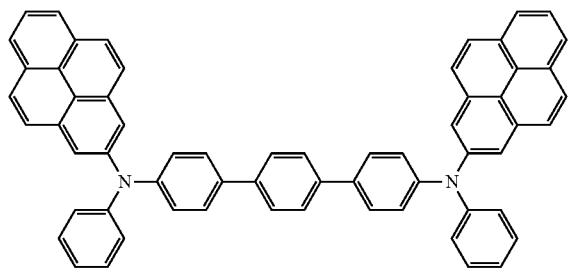
26
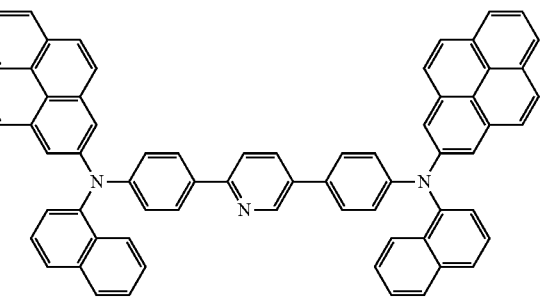
27
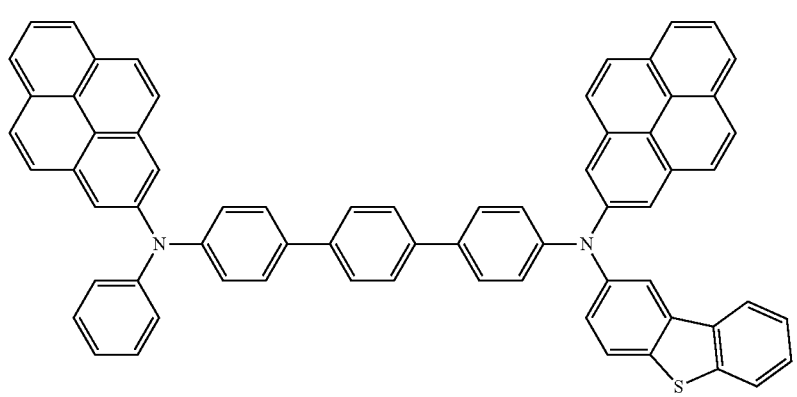
28
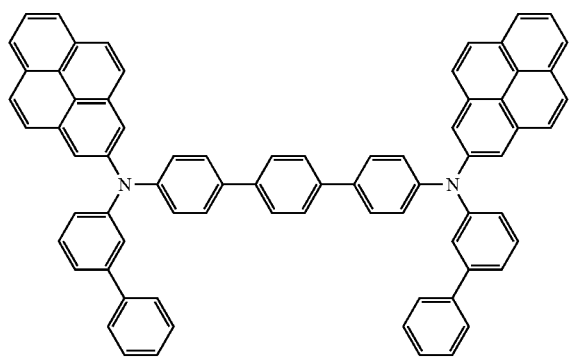
29
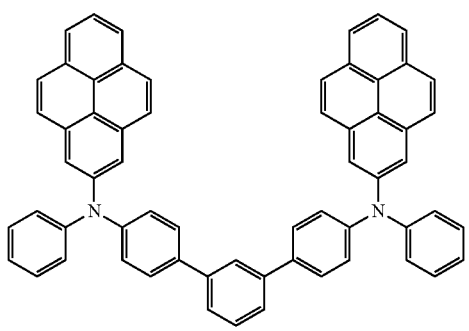
30
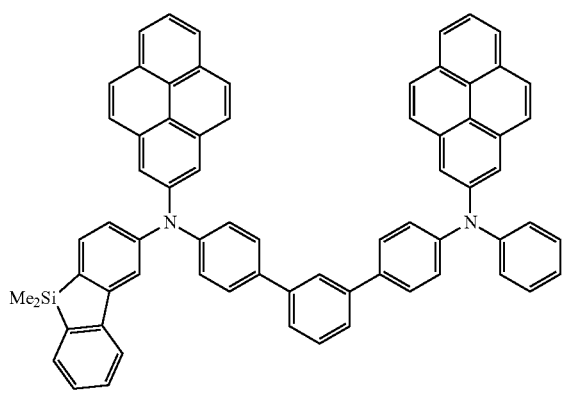
31
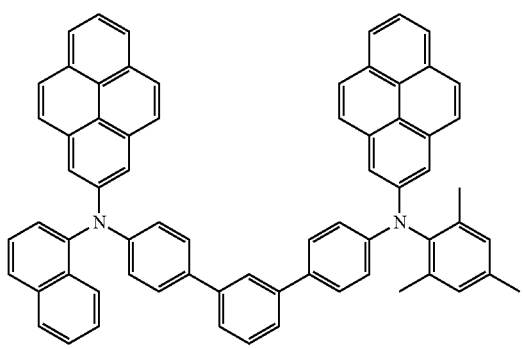

-continued
32
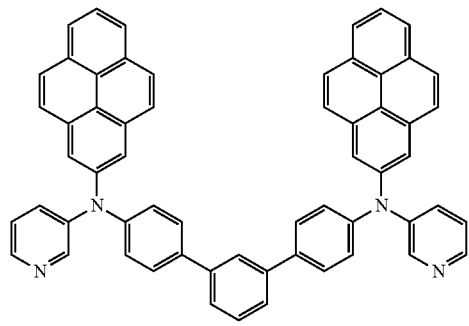
33
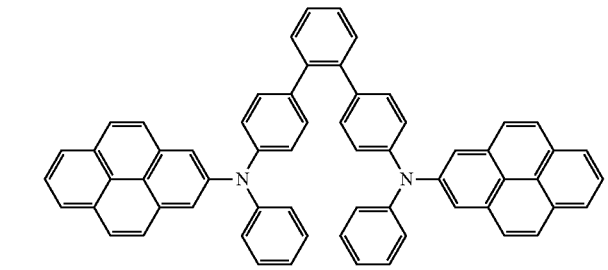
34
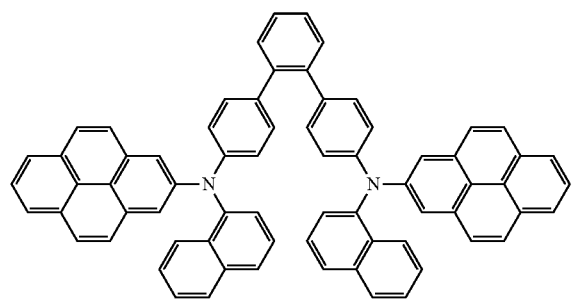
35
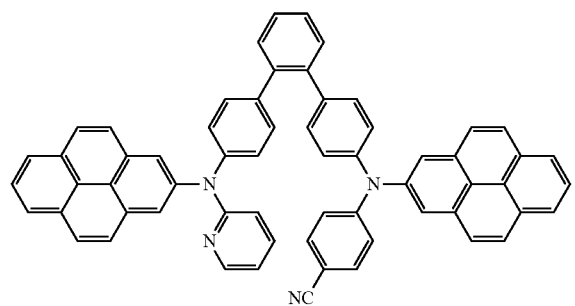
36
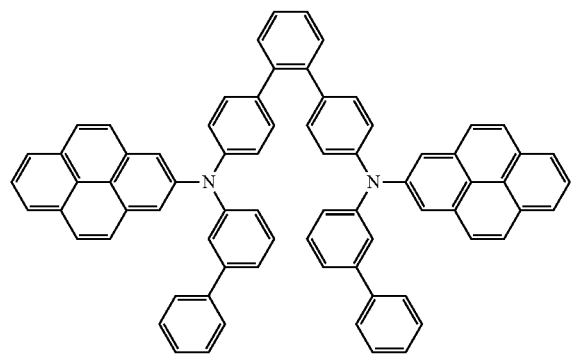
37
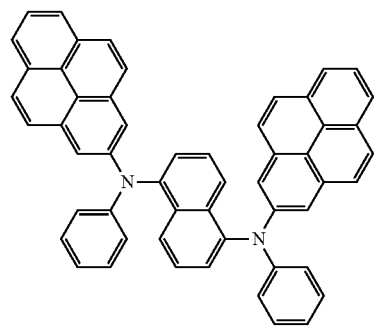
38
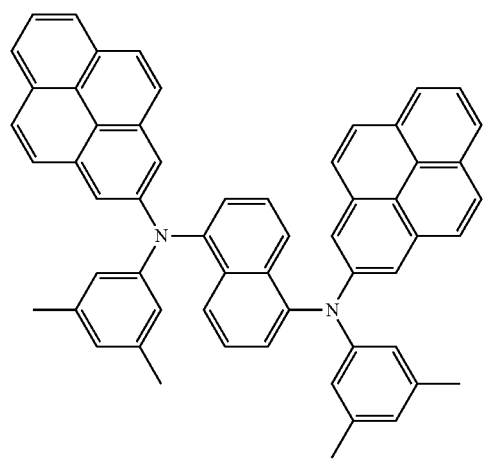
39
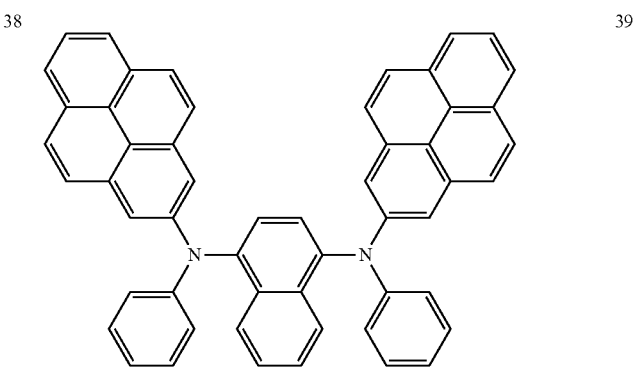

-continued
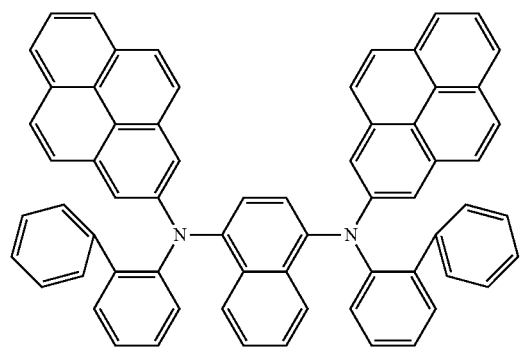
40
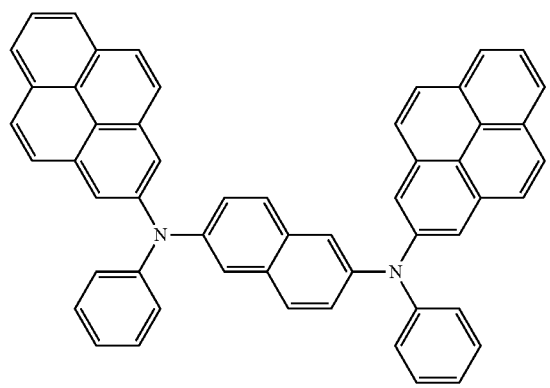
41
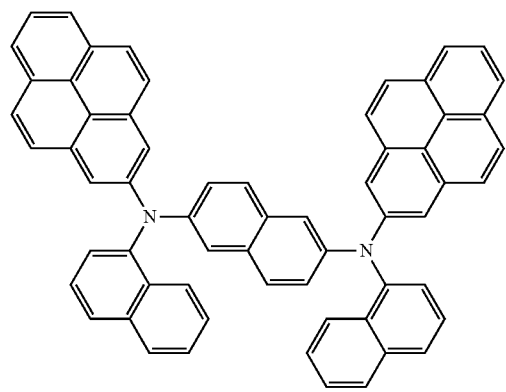
42
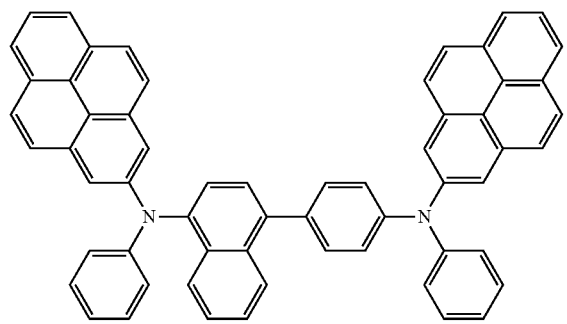
43
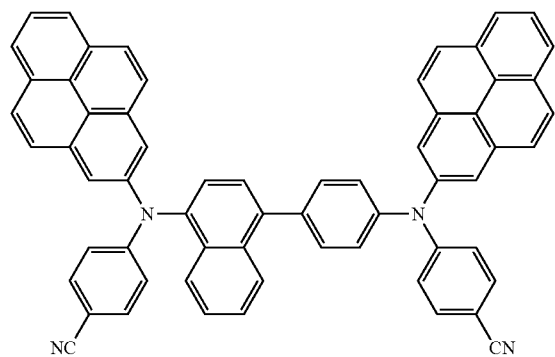
44
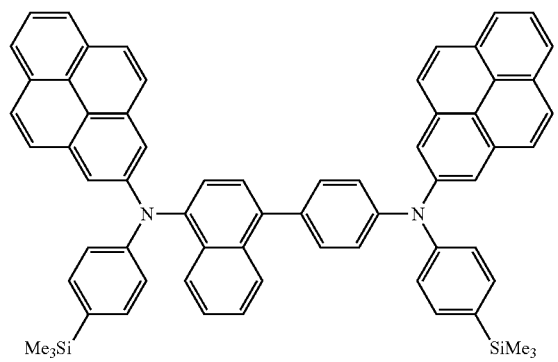
45
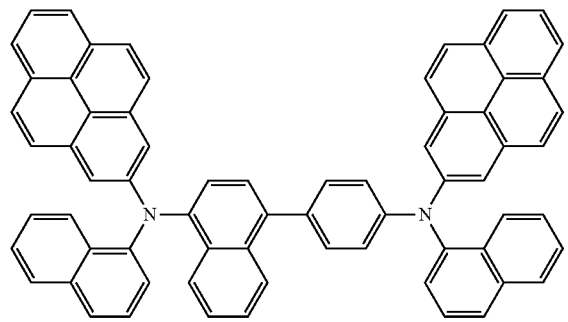
46
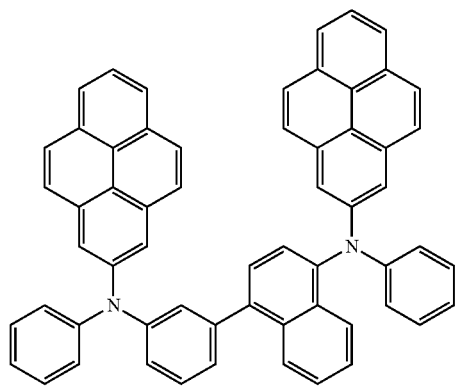
47

48
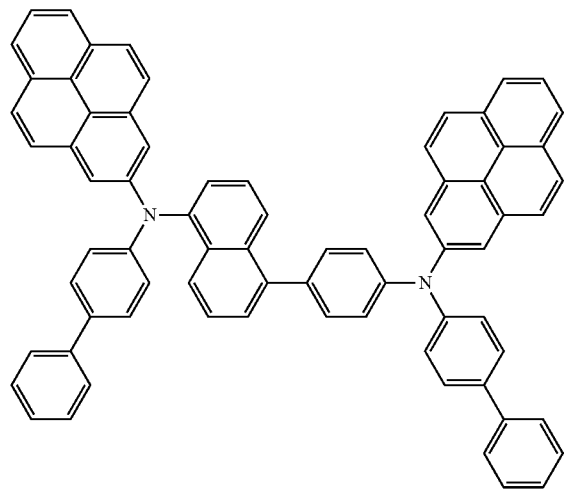
49
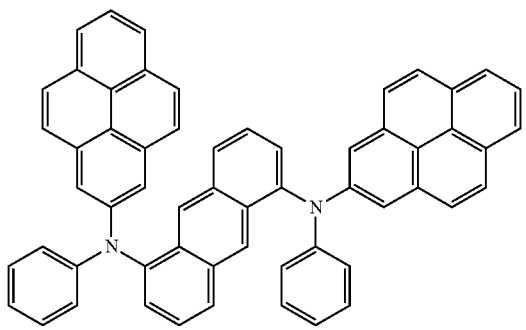
50
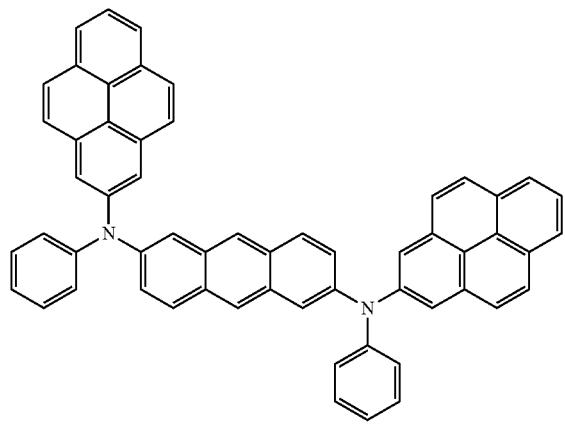
51
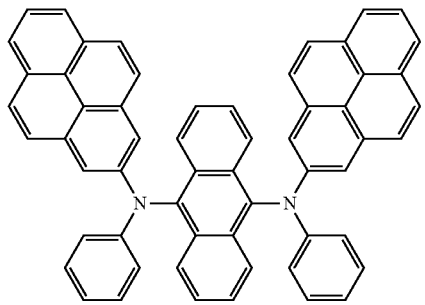
52
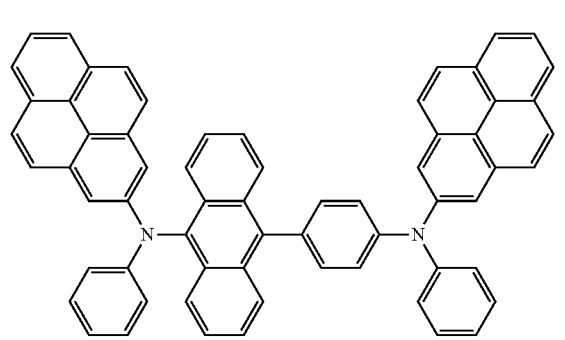
53
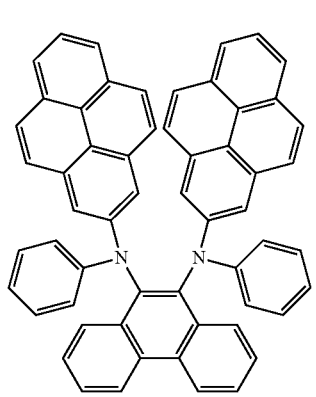
54
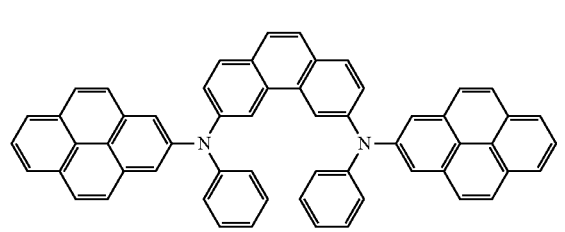
55
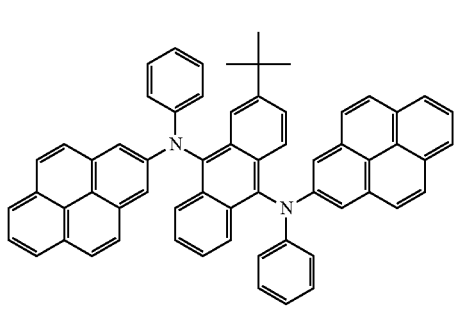

56
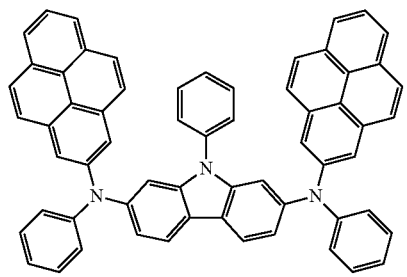
57
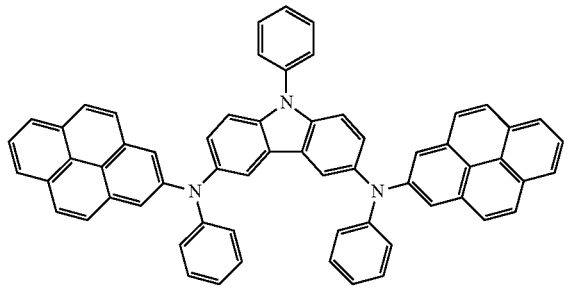
58
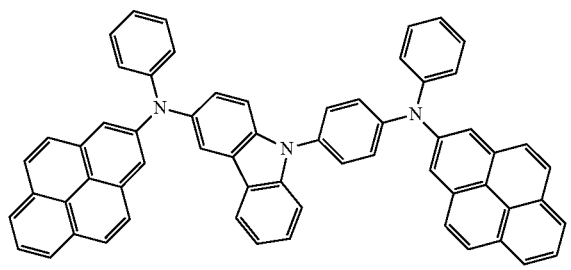
59
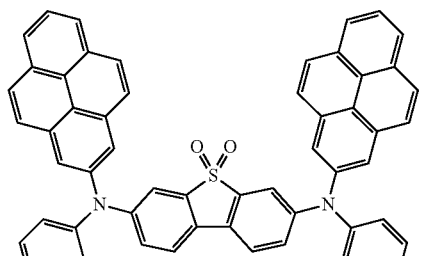
60
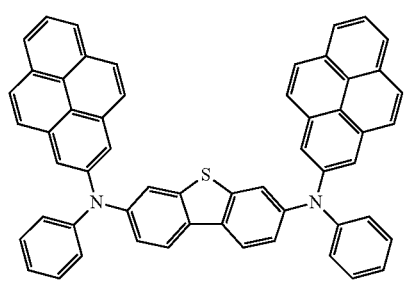
61
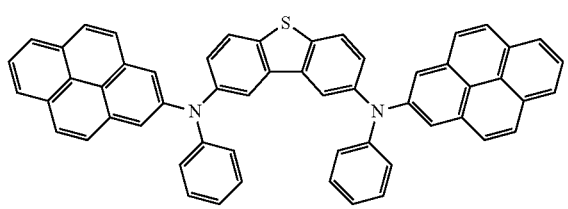
62
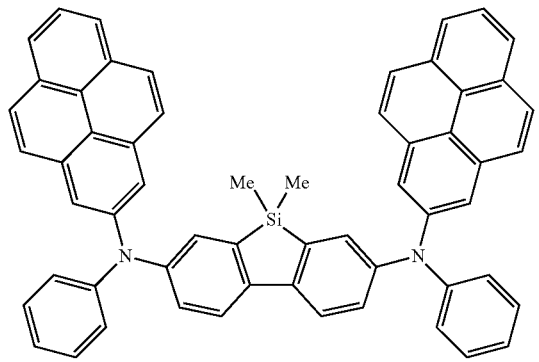
63
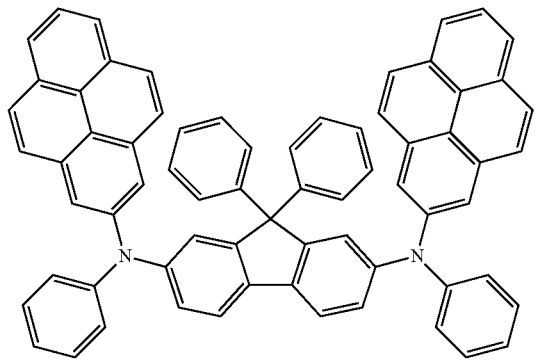
64
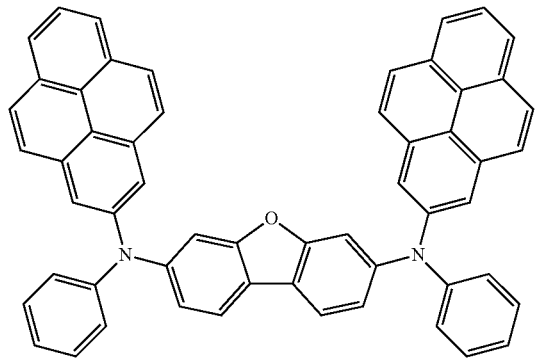
65
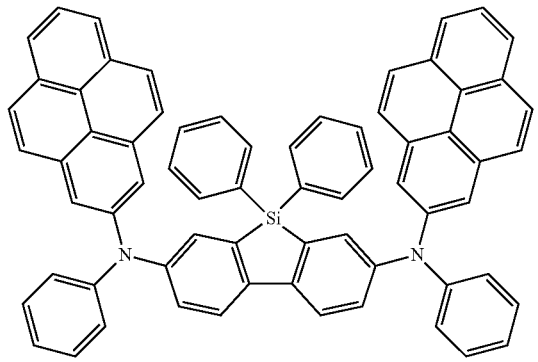

66
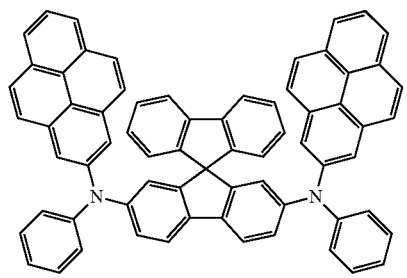
67
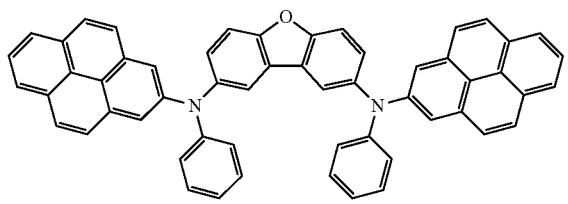
68
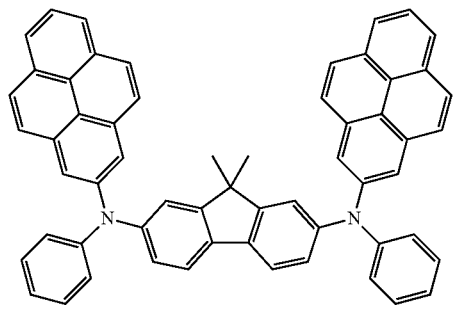
69
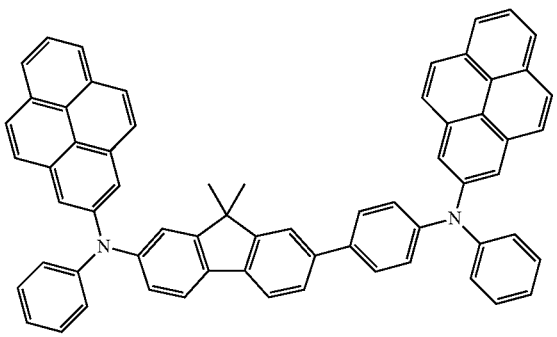
70
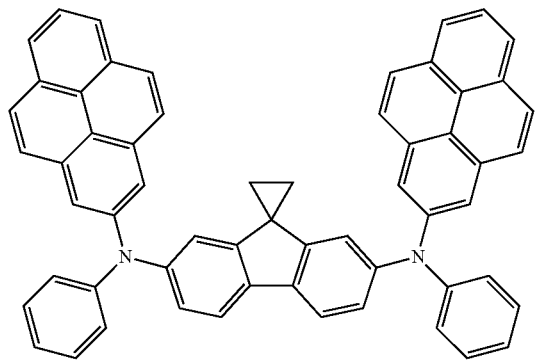
Embodiments may be realized by providing a compound wherein the compound is a compound of Formulas 7, 8, 15, 43, 48, 56, 63, or 67:
7
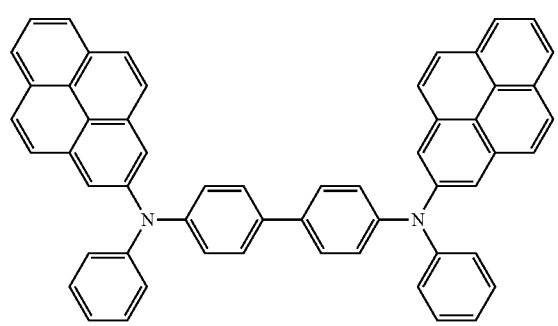
8
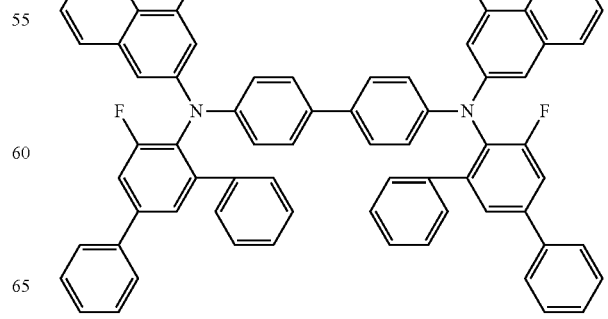

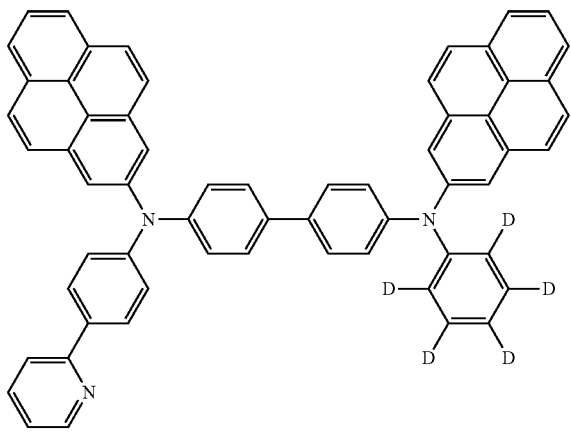

15

43

48

56

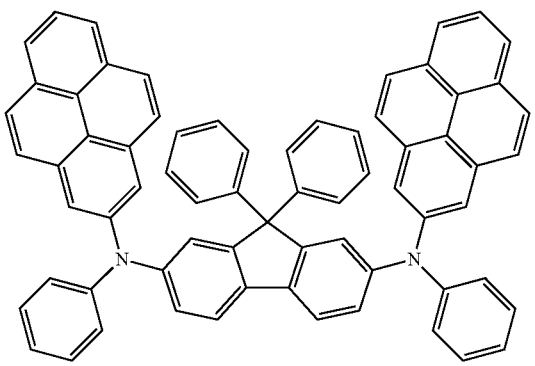

63

67

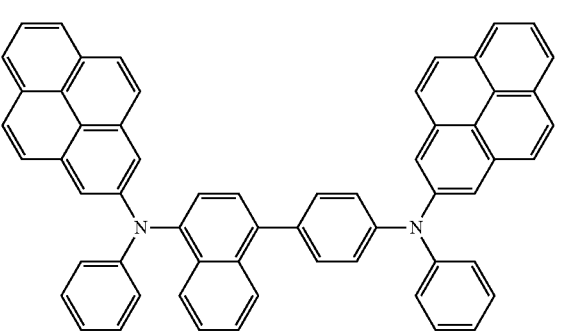

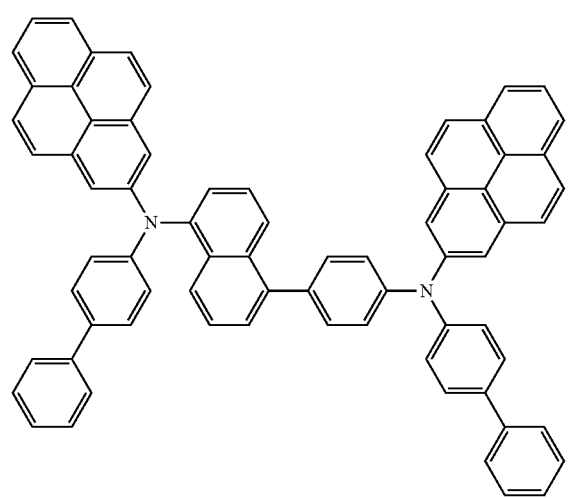

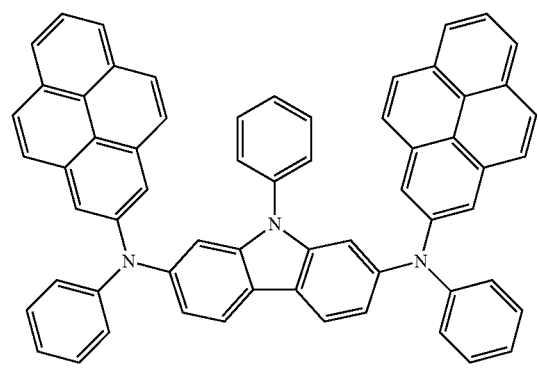

Embodiments are directed to an organic light-emitting diode, comprising:
a substrate;
a first electrode on the substrate;
a second electrode disposed opposite to the first electrode; and
an organic layer interposed between the first electrode and the second electrode,
wherein the organic layer includes at least one layer, and the at least one layer includes a compound as claimed in claim 1

Embodiments may be realized by providing an organic light-emitting diode wherein the organic layer includes at least one of a hole injection layer, a hole transport layer, a hole injection-transport layer having both hole injection and hole transport capabilities at the same time, an emission layer, an electron injection layer, an electron transport layer, and an electron injection-transport layer having both electron injection and electron transport capabilities at the same time.

Embodiments may be realized by providing an organic light-emitting diode wherein:
the organic layer includes at least one of the emission layer, the hole injection layer, the hole transport layer, and the hole injection-transport layer, and
at least one of the emission layer, the hole injection layer, the hole transport layer, and the hole injection-transport layer includes the compound.

Embodiments may be realized by providing an organic light-emitting diode wherein the organic layer includes the emission layer, and the emission layer includes the compound.

Embodiments may be realized by providing an organic light-emitting diode wherein the emission layer includes a host and a dopant, and the dopant includes the compound.

Embodiments may be realized by providing an organic light-emitting diode wherein the emission layer includes an organometallic compound including Ir, Pt, Os, Re, Ti, Zr, Hf, Eu, Tb, Tm, or a combination thereof.

BRIEF DESCRIPTION OF THE DRAWING

The above and other features and advantages of the present invention will become more apparent by describing in detail exemplary embodiments thereof with reference to the attached drawing in which:

FIG. 1 illustrates a schematic view illustrating a structure of an organic light-emitting diode (OLED) according to an embodiment of the present invention.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In FIG. 1, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "and/or" includes any and all combinations of one or more of the associated listed items. Expressions such as "at least one of," when preceding a list of elements, modify the entire list of elements and do not modify the individual elements of the list. It will be understood that identified ring substituents may be substituted in any number or combination at available ring locations.

A condensed cyclic compound is represented by Formula 1 below:

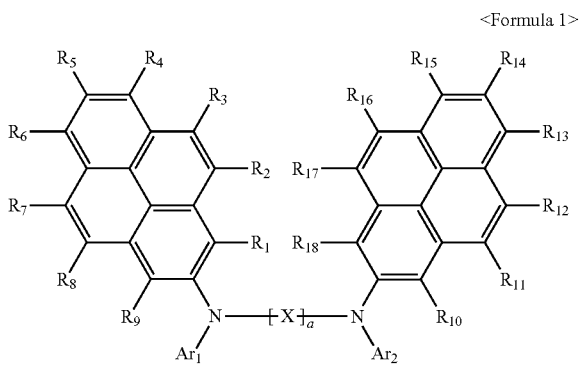

<Formula 1> in Formula 1,

X is selected from a substituted or unsubstituted $C_6$-$C_{60}$ arylene group and a substituted or unsubstituted $C_3$-$C_{60}$ heteroarylene group;

a is an integer of 1 to 3, and when a is 2 or 3, the Xs are identical to or different from each other;

$Ar_1$ and $Ar_2$ are each independently selected from a substituted or unsubstituted $C_6$-$C_{60}$ aryl group and a substituted or unsubstituted $C_3$-$C_{60}$ heteroaryl group;

$R_1$ to $R_{18}$ are each independently a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ aryloxy, a substituted or unsubstituted $C_6$-$C_{60}$ arylthio group, —Si($Q_1$)($Q_2$)($Q_3$), or —N($Q_4$)($Q_5$) (wherein $Q_1$ to $Q_5$ are each independently a substituted or unsubstituted $C_1$-$C_{60}$ alkyl group, a substituted or unsubstituted $C_6$-$C_{60}$ aryl group, or a substituted or unsubstituted $C_2$-$C_{60}$ heteroaryl group).

In greater detail, in Formula 1, X may be selected from: a substituted or unsubstituted phenylene group, a substituted or unsubstituted biphenylene group, a substituted or unsubstituted terphenylene group, a substituted or unsubstituted pentaphenylene group, a substituted or unsubstituted pentalenylene group, a substituted or unsubstituted indenylene group, a substituted or unsubstituted naphthylene group, a substituted or unsubstituted azulenylene group, a substituted or unsubstituted indacenylene group, a substituted or unsubstituted acenaphthylene group, a substituted or unsubstituted heptalenylene group, a substituted or unsubstituted phenalenylene group, a substituted or unsubstituted fluorenylene group, a substituted or unsubstituted phenanthrenylene group, a substituted or unsubstituted anthrylene group, a substituted or unsubstituted fluoranthenylene group, a substituted or unsubstituted dibenzofluorenylene group, a substituted or unsubstituted pyrenylene group, a substituted or unsubstituted naphthacenylene group, a substituted or unsubstituted chrysenylene group, a substituted or unsubstituted triphenylenylene group, a substituted or unsubstituted perylenylene group, a substituted or unsubstituted picenylene group, a substituted or unsubstituted hexacenylene group, a substituted or unsubstituted spirofluorenylene group, a substituted or unsubstituted pyrrolylene group, a substituted or unsubstituted furylene group, a substituted or unsubstituted pyrazolylene group, a substituted or unsubstituted imidazolylene group, a substituted or unsubstituted oxazolylene group, a substituted or unsubstituted isoxazolylene group, a substituted or unsubstituted triazolylene group, a substituted or unsubstituted tetrazolylene group, a substituted or unsubstituted oxadiazolylene group, a substituted or unsubstituted pyridylene group, a substituted or unsubstituted pyrimidinylene group, a substituted or unsubstituted pyrazinylene group, a substituted or unsubstituted pyridazinylene group, a substituted or unsubstituted triazinylene group, a substituted or unsubstituted pyranylene group, a substituted or unsubstituted thiophenylene group, a substituted or unsubstituted thiazolylene group, a substituted or unsubstituted isothiazolylene group, a substituted or unsubstituted indolylene group, a substituted or unsubstituted isoindolylene group, a substituted or unsubstituted indolizinylene group, a substituted or unsubstituted benzofurylene group, a substituted or unsubstituted isobenzofurylene group, a substituted or unsubstituted indazolylene group, a substituted or unsubstituted benzimidazolylene group, a substituted or unsubstituted benzoxazolylene group, a substituted or unsubstituted benzisoxazolylene group, a substituted or unsubstituted imidazopyridylene group, a substituted or unsubstituted purinylene group, a substituted or unsubstituted quinolylene group, a substituted or unsubstituted isoquinolylene group, a substituted or unsubstituted phthalazinylene group, a substituted or unsubstituted quinazolinylene group, a substituted or unsubstituted quinoxalinylene group, a substituted or unsubstituted naphthyridinylene group, a substituted or unsubstituted cinnolinylene group, a substituted or unsubstituted benzothiophenylene group, a substituted or unsubstituted benzothiazolylene group, a substituted or unsubstituted carbazolylene group, a substituted or unsubstituted benzocarbazolylene group, a substituted or unsubstituted pyridoindolylene group, a substituted or unsubstituted dibenzofurylene group, a substituted or unsubstituted phenanthridinylene group, a substituted or unsubstituted benzoquinolylene group, a substituted or unsubstituted phenazinylene group, a substituted or unsubstituted dibenzosilolylene group, and a substituted or unsubstituted dibenzothiophenylene group. Here, when X is an anthrylene group, a is 0 or 2, and when X is a phenanthrylene group, X is a 3,6-phenanthrylene group or a 9,10-phenanthrylene group.

In some embodiments, X may be selected from:
a hydrogen atom a substituted or unsubstituted phenylene group, a substituted or unsubstituted biphenylene group, a substituted or unsubstituted terphenylene group, a substituted or unsubstituted naphthylene group, a substituted or unsubstituted fluorenylene group, a substituted or unsubstituted phenanthrenylene group, a substituted or unsubstituted anthrylene group, a substituted or unsubstituted pyrenylene group, a substituted or unsubstituted dibenzofluorenylene group, a substituted or unsubstituted carbazolylene group, a substituted or unsubstituted benzocarbazolylene group, a substituted or unsubstituted dibenzosilolylene group, and a substituted or unsubstituted dibenzothiophenylene group.

In some embodiments, when X is an anthrylene group, a is 0 or 2, and when X is a phenanthrylene group, X may be a 3,6-phenanthrylene group or a 9,10-phenanthrylene group For example, X may be a compound represented by one of Formulas 2A to 2N below, but X is not limited thereto. When X is a group of Formula 2D, a is 0 or 2:

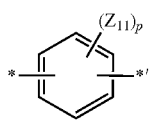

Formula 2A

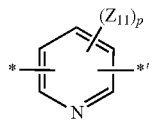

Formula 2B

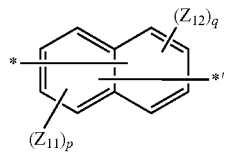

Formula 2C

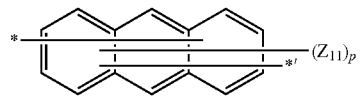

Formula 2D

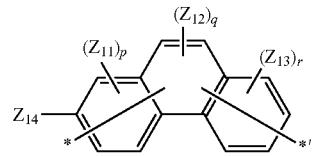

Formula 2E

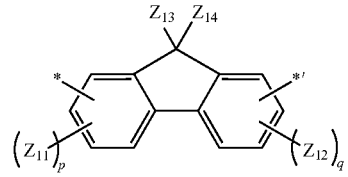

Formula 2F

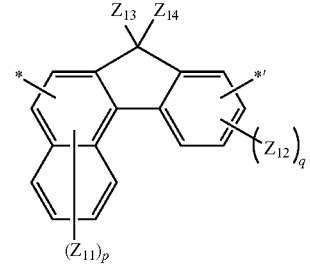

Formula 2G

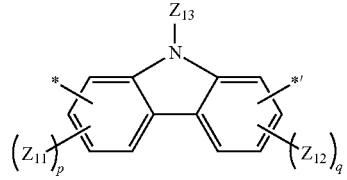

Formula 2H

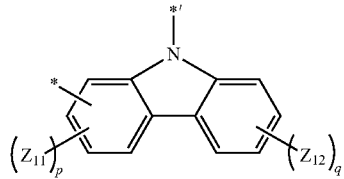

Formula 2I

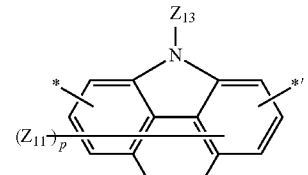

Formula 2J

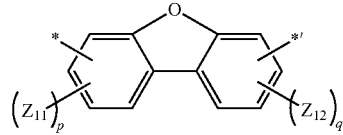

Formula 2K

-continued

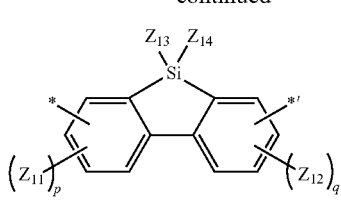
Formula 2L

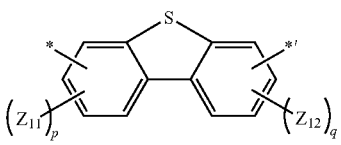
Formula 2M

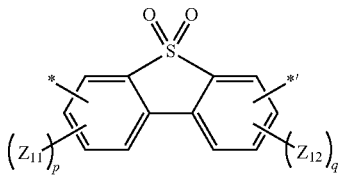
Formula 2N

In Formulas 2A to 2N, $Z_{11}$ to $Z_{14}$ may be each independently selected from:

a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a $C_1$-$C_{20}$ alkyl group, a $C_1$-$C_{20}$ alkoxy group, a $C_6$-$C_{20}$ aryl group, and a $C_2$-$C_{20}$ heteroaryl group;

a $C_1$-$C_{20}$ alkyl group and a $C_1$-$C_{20}$ alkoxy group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof; and a $C_6$-$C_{20}$ aryl group and a $C_2$-$C_{20}$ heteroaryl group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a $C_1$-$C_{20}$ alkyl group, a $C_1$-$C_{20}$ alkoxy group, a $C_6$-$C_{20}$ aryl group, and a $C_2$-$C_{20}$ heteroaryl group, wherein a plurality of $Z_{11}$ to $Z_{14}$ is identical to or different from each other, and $Z_{13}$ and $Z_{14}$ optionally foam a part of the ring, and p is one of integers 2 to 8, q is one of integers 2 to 4, r is 3 or 4, and * and *' are binding sites.

In greater detail, $Z_{11}$ to $Z_{14}$ may be each independently selected from:

a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a methyl group, an ethyl group, a propyl group, a butyl group, a methoxy group, an ethoxy group, a propoxy group, a butoxy group, a pentoxy group, a phenyl group, a naphthyl group, an anthryl group, a phenanthrenyl group, a pyrenyl group and a fluorenyl group, a pyridinyl group, a pyrimidinyl group, a triazinyl group, a quinolyl group, and a carbazole group;

a methyl group, an ethyl group, a propyl group, a butyl group, a methoxy group, an ethoxy group, a propoxy group, a butoxy group, and a pentoxy group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof; and a phenyl group, a naphthyl group, an anthryl group, a phenanthrenyl group, a pyrenyl group, a fluorenyl group, a pyridinyl group, a pyrimidinyl group, a triazinyl group, a quinolyl group, and a carbazole group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a $C_1$-$C_{20}$ alkyl group, and a $C_1$-$C_{20}$ alkoxy group.

For example, X may be a compound represented by one of Formulas 3A to 3AB below, but is not limited thereto. When X is a compound represented by one of Formulas 3H to 3K, a is 0 or 2.

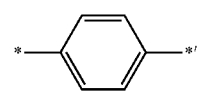
Formula 3A

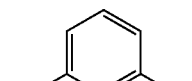
Formula 3B

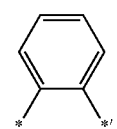
Formula 3C

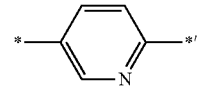
Formula 3D

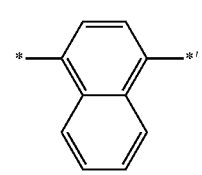
Formula 3E

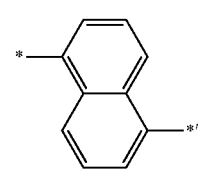
Formula 3F

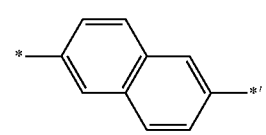
Formula 3G

-continued
Formula 3H
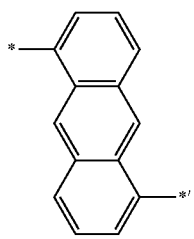
Formula 3I
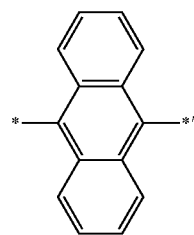
Formula 3J
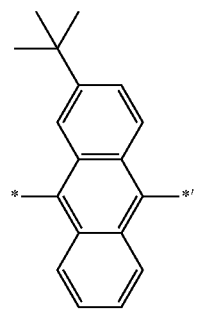
Formula 3K
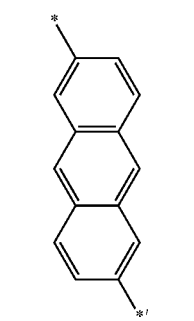
Formula 3L
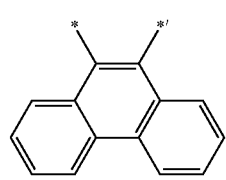
Formula 3M
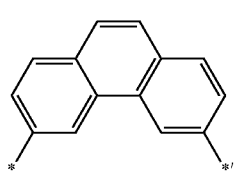
-continued
Formula 3N
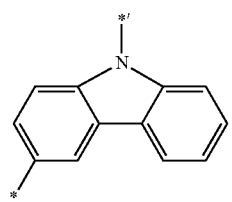
Formula 3O
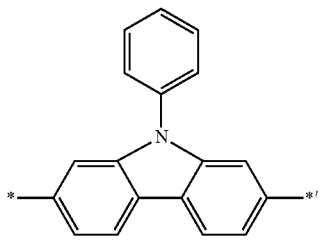
Formula 3P
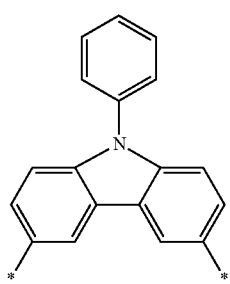
Formula 3Q
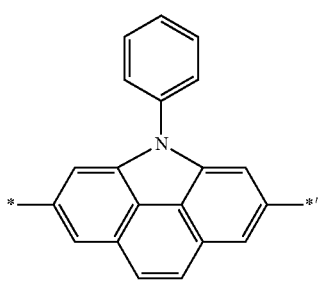
Formula 3R
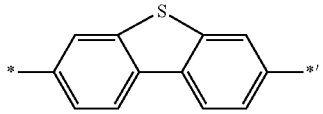
Formula 3S
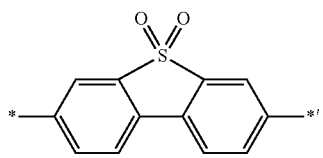
Formula 3T
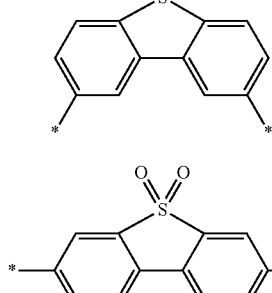
Formula 3U
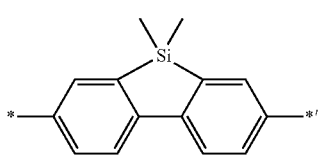

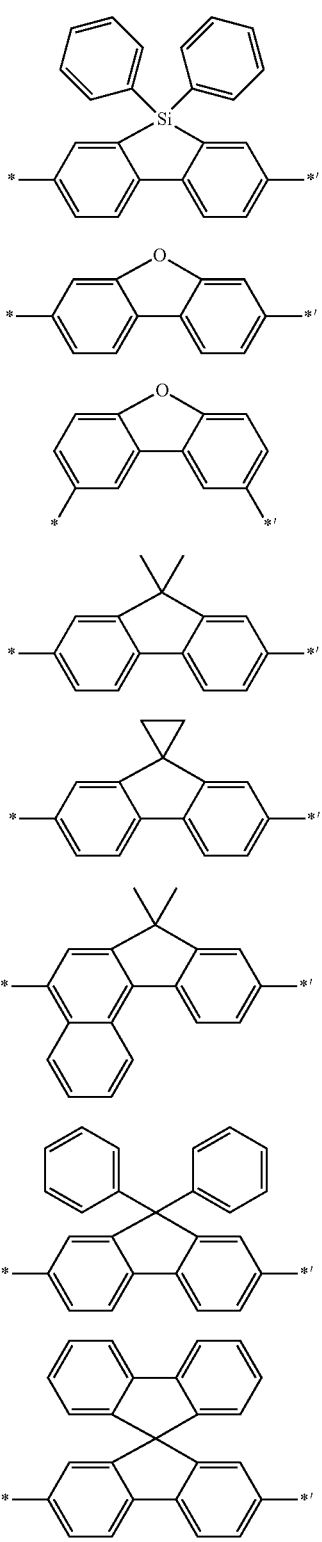

Formula 3V
Formula 3W
Formula 3X
Formula 3Y
Formula 3Z
Formula 3AA
Formula 3AB
Formula 3AC In Formulas 3A to 3AC, * is a binding site;

In Formula 1, $Ar_1$ and $Ar_2$ may be each independently selected from a hydrogen atom, a substituted or unsubstituted phenyl group, a substituted or unsubstituted biphenyl group, a substituted or unsubstituted terphenyl group, a substituted or unsubstituted pentaphenyl group, a substituted or unsubstituted pentalenyl group, a substituted or unsubstituted indenyl group, a substituted or unsubstituted naphthyl group, a substituted or unsubstituted zulenyl, a substituted or unsubstituted indacenyl group, a substituted or unsubstituted cenaphthyl group, a substituted or unsubstituted heptalenyl group, a substituted or unsubstituted phenalenyl group, a substituted or unsubstituted fluorenyl group, a substituted or unsubstituted phenanthrenyl group, a substituted or unsubstituted nthryl group, a substituted or unsubstituted fluoranthenyl group, a substituted or unsubstituted dibenzofluorenyl group, a substituted or unsubstituted pyrenyl group, a substituted or unsubstituted naphthacenyl group, a substituted or unsubstituted chrysenyl group, a substituted or unsubstituted triphenylenyl group, a substituted or unsubstituted perylenyl group, a substituted or unsubstituted picenyl group, a substituted or unsubstituted hexacenyl group, a substituted or unsubstituted spiro-fluorenyl group, a substituted or unsubstituted pyrrolyl group, a substituted or unsubstituted furyl group, a substituted or unsubstituted pyrazolyl group, a substituted or unsubstituted imidazolyl group, a substituted or unsubstituted oxazolyl group, a substituted or unsubstituted isoxazolyl group, a substituted or unsubstituted triazolyl group, a substituted or unsubstituted tetrazolyl group, a substituted or unsubstituted oxadiazolyl group, a substituted or unsubstituted pyridyl group, a substituted or unsubstituted pyrimidinyl group, a substituted or unsubstituted pyrazinyl group, a substituted or unsubstituted pyridazinyl group, a substituted or unsubstituted triazinyl, a substituted or unsubstituted pyranyl group, a substituted or unsubstituted thiophenyl group, a substituted or unsubstituted thiazolyl group, a substituted or unsubstituted isothiazolyl group, a substituted or unsubstituted indolyl group, a substituted or unsubstituted isoindolyl group, a substituted or unsubstituted indolizinyl group, a substituted or unsubstituted benzofuryl group, a substituted or unsubstituted isobenzofuryl group, a substituted or unsubstituted indazolyl group, a substituted or unsubstituted benzimidazolyl group, a substituted or unsubstituted benzoxazolyl group, a substituted or unsubstituted benzisoxazolyl group, a substituted or unsubstituted imidazopyridyl group, a substituted or unsubstituted purinyl group, a substituted or unsubstituted quinolyl group, a substituted or unsubstituted isoquinolyl group, a substituted or unsubstituted phthalazinyl group, a substituted or unsubstituted quinazolinyl group, a substituted or unsubstituted quinoxalinyl group, a substituted or unsubstituted naphthyridinyl group, a substituted or unsubstituted cinnolinyl group, a substituted or unsubstituted benzothiophenyl group, a substituted or unsubstituted benzothiazolyl group, a substituted or unsubstituted carbazolyl group, a substituted or unsubstituted benzocarbazolyl group, a substituted or unsubstituted pyridoindolyl group, a substituted or unsubstituted dibenzofuryl group, a substituted or unsubstituted phenanthridinyl group, a substituted or unsubstituted benzoquinolyl group, a substituted or unsubstituted phenazinyl group, a substituted or unsubstituted dibenzosilolyl group, and a substituted or unsubstituted dibenzothiophenyl group.

In greater detail, $Ar_1$ and $Ar_2$ may be each independently selected from a hydrogen atom, a substituted or unsubstituted phenyl group, a substituted or unsubstituted biphenyl group, a substituted or unsubstituted naphthyl group, a substituted or unsubstituted fluorenyl group, a substituted or unsubstituted phenanthrenyl group, a substituted or unsubstituted pyridyl group, a substituted or unsubstituted dibenzofuryl group, a substituted or unsubstituted dibenzosilolyl group, and a substituted or unsubstituted dibenzothiophenyl group, but are not limited thereto.

For example, $Ar_1$ and $Ar_2$ may be each independently represented by one of Formulas 4A to 4G below, but are not limited thereto:

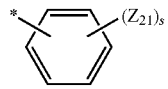

Formula 4A

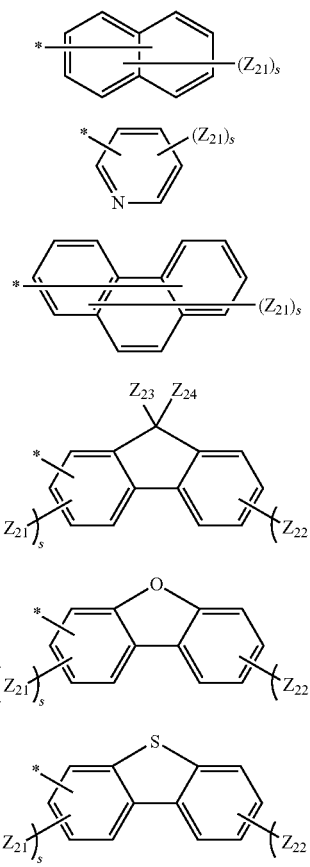

Formula 4B

Formula 4C

Formula 4D

Formula 4E

Formula 4F

Formula 4G

In Formulas 4A-4G, $Z_{21}$ and $Z_{22}$ may be each independently selected from:

a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a $C_1$-$C_{20}$ alkyl group, a $C_1$-$C_{20}$ alkoxy group, a $C_6$-$C_{20}$ aryl group, and a $C_2$-$C_{20}$ heteroaryl group;

a $C_1$-$C_{20}$ alkyl group and a $C_1$-$C_{20}$ alkoxy group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof; and a $C_6$-$C_{20}$ aryl group and a $C_2$-$C_{20}$ heteroaryl group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a $C_1$-$C_{20}$ alkyl group, a $C_1$-$C_{20}$ alkoxy group, a $C_6$-$C_{20}$ aryl group, and a $C_2$-$C_{20}$ heteroaryl group.

In some embodiments, s is an integer of 3 to 9, t is 4, and * is a binding site. In some embodiments, 2 or more of $Z_{21}$ s may form a ring.

For example, $Ar_1$ and $Ar_2$ may be each independently represented by one of Formulas 5A to 5V, but are not limited thereto:

Formula 5A

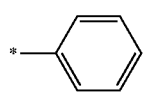

Formula 5B

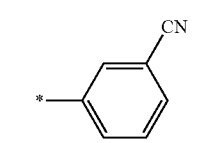

Formula 5C

Formula 5D

Formula 5E

Formula 5F

Formula 5G

Formula 5H

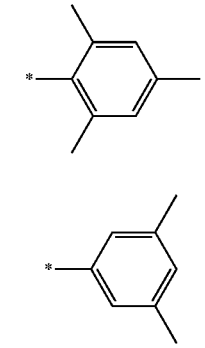

Formula 5I

Formula 5J

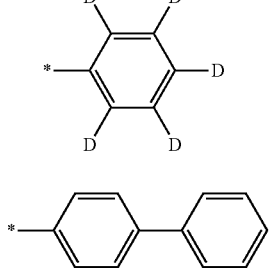

Formula 5K

Formula 5L

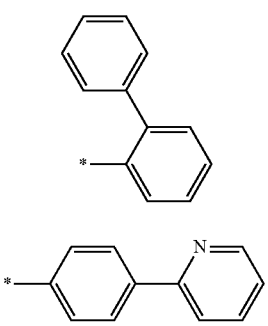

-continued

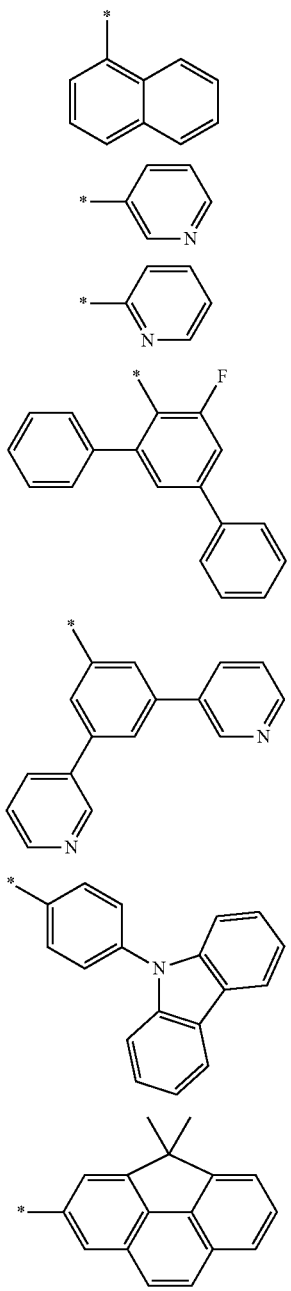

Formula 5M

Formula 5N

Formula 5O

Formula 5P

Formula 5Q

Formula 5R

Formula 5S

-continued

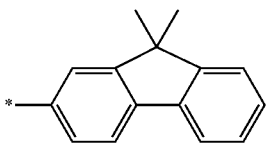

Formula 5T

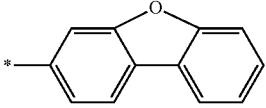

Formula 5U

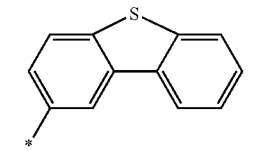

Formula 5V

In Formulas 5A to 5V, * is a binding site.

$R_1$ to $R_{18}$ may be each independently selected from:

a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a $C_1$-$C_{10}$ alkyl group, a $C_1$-$C_{10}$ alkoxy group, a phenyl group, a naphthyl group, an anthryl group, a fluorenyl group, a dibenzofuranyl group, and a dibenzothiophenyl group; and a $C_1$-$C_{10}$ alkyl group, a $C_1$-$C_{10}$ alkoxy group, a phenyl group, a naphthyl group, an anthryl group, a fluorenyl group, a dibenzofuranyl group, and a dibenzothiophenyl group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof.

In greater detail, $R_1$ and $R_{18}$ are each independently selected from a hydrogen atom, a deuterium atom, a halogen group, a methyl group, an ethyl group, a propyl group, a butyl group, a methoxy group, an ethoxy group, a propoxy group, a butoxy group, and a pentoxy group.

The condensed cyclic compound of Formula 1 may be a compound represented by one of Formulas 1 to 70, but is not limited thereto.

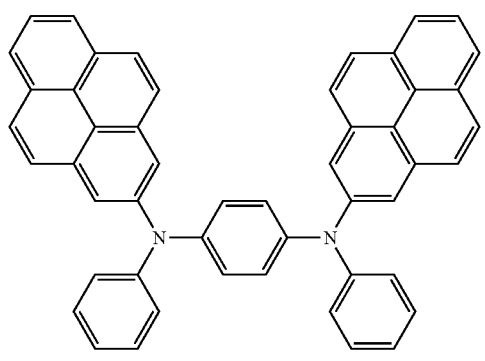

1

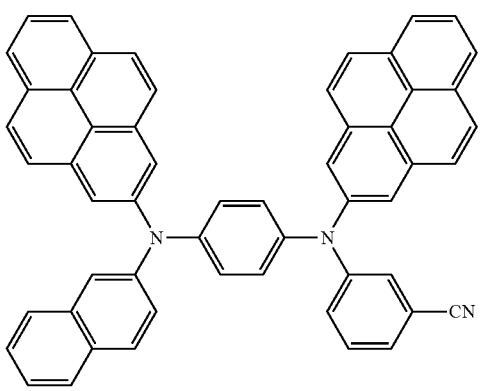

2

-continued
3
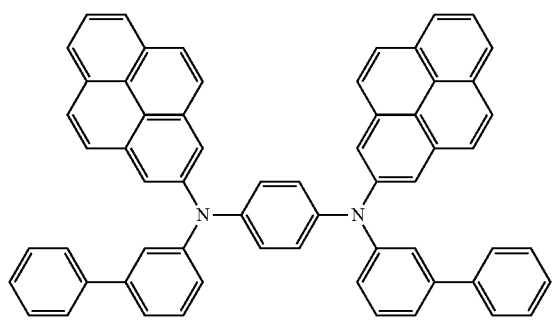
4
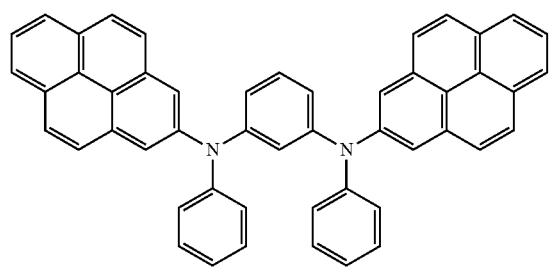
5
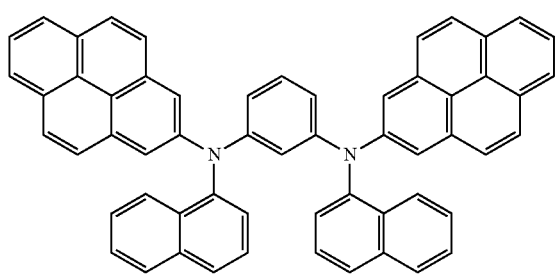
6
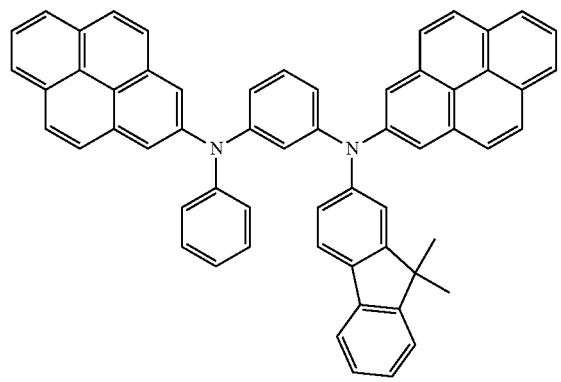
7
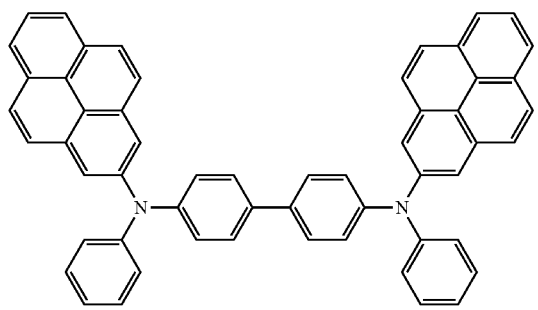
8
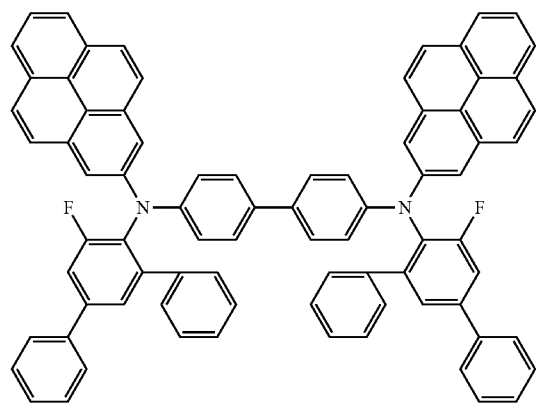
9
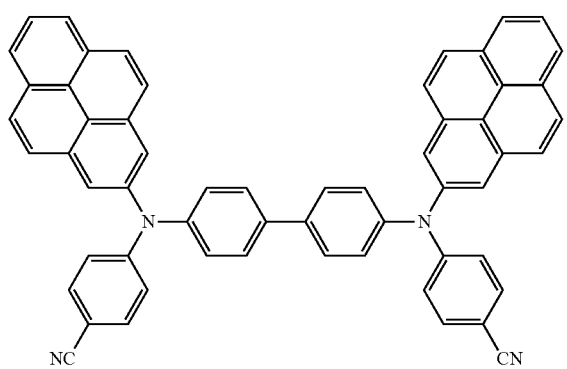
10
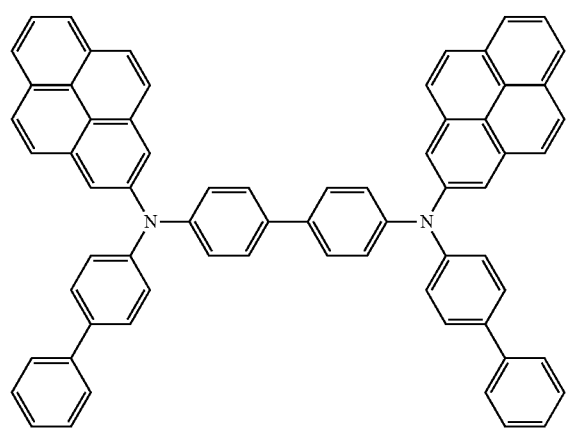

-continued
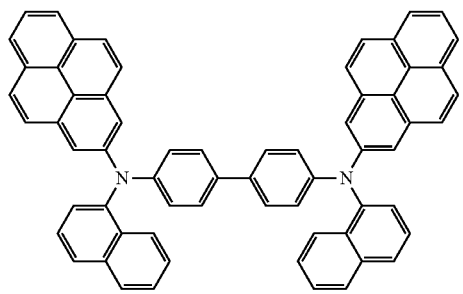
11
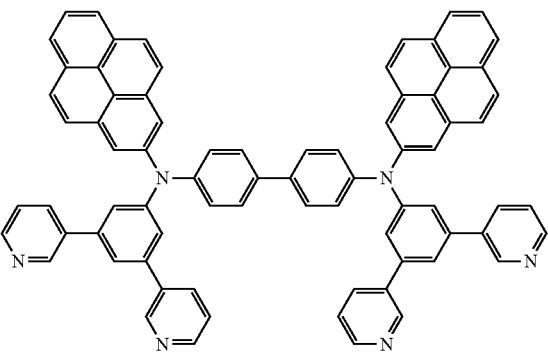
12
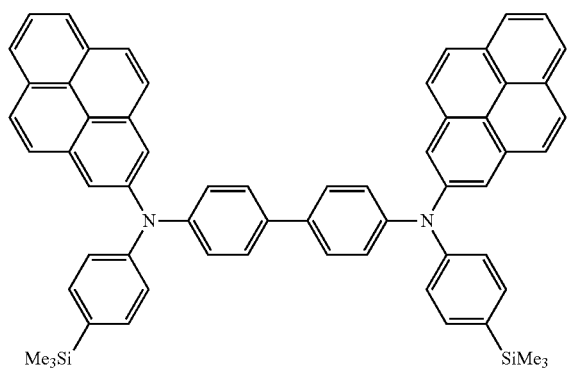
13
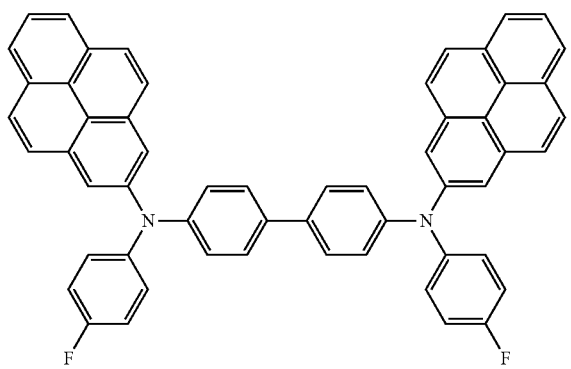
14
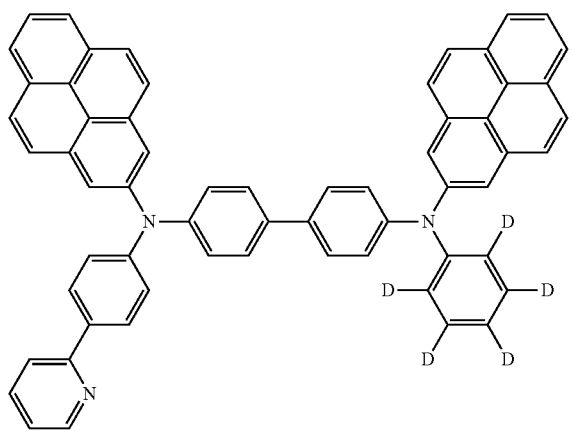
15
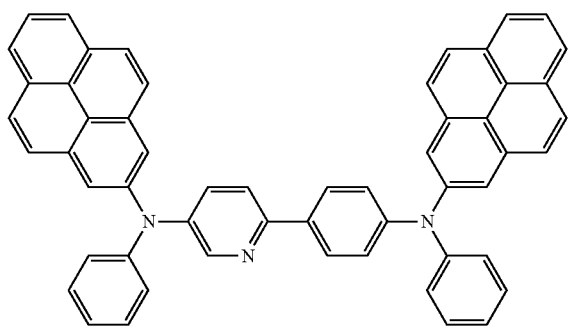
16

-continued
17
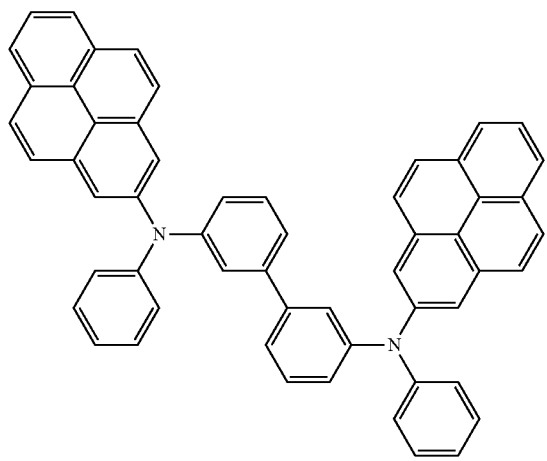
18
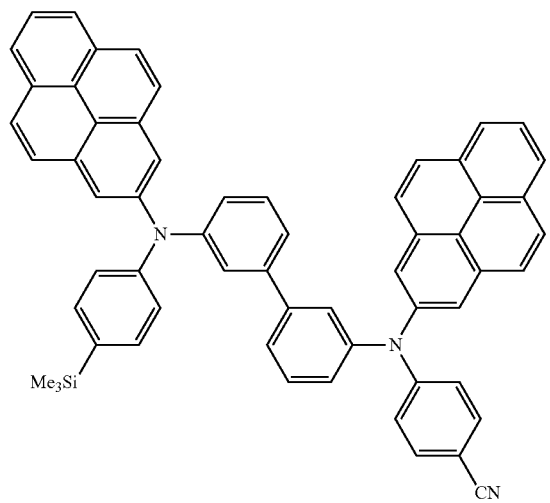
19
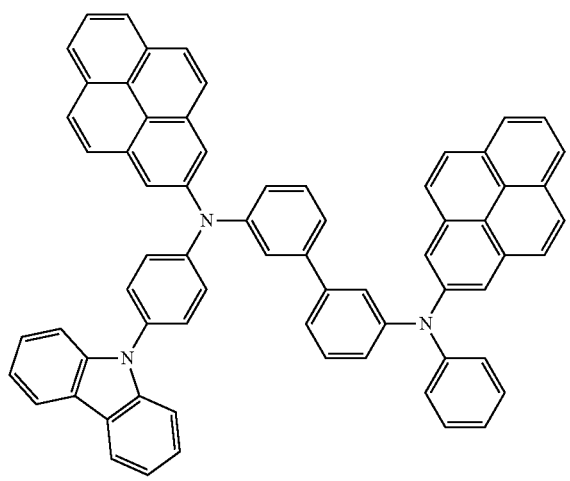
20
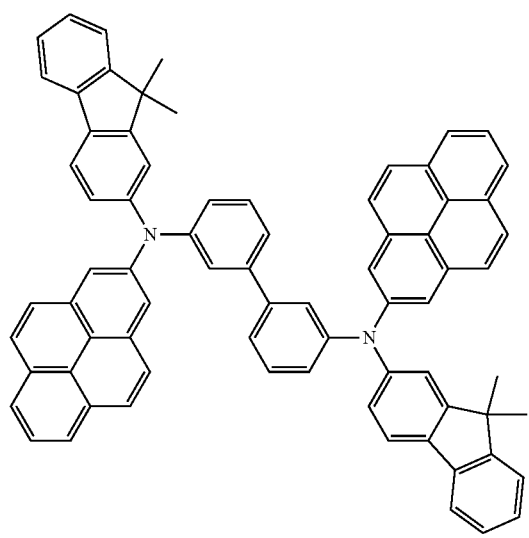
21
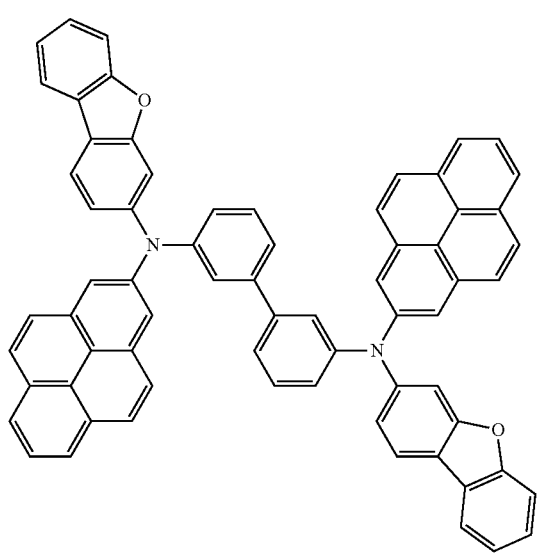
22
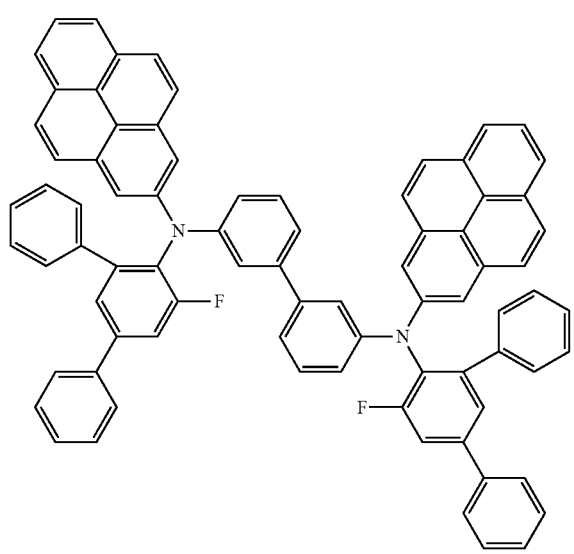

-continued
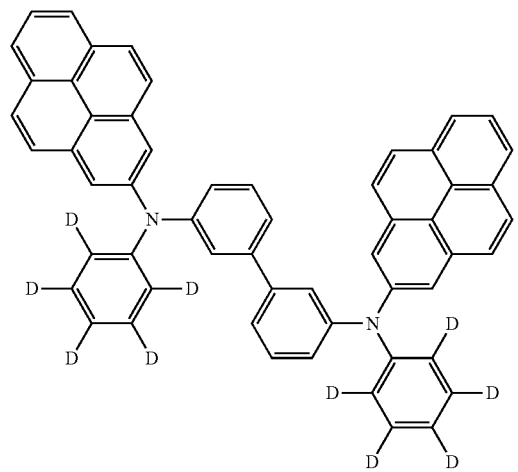
23
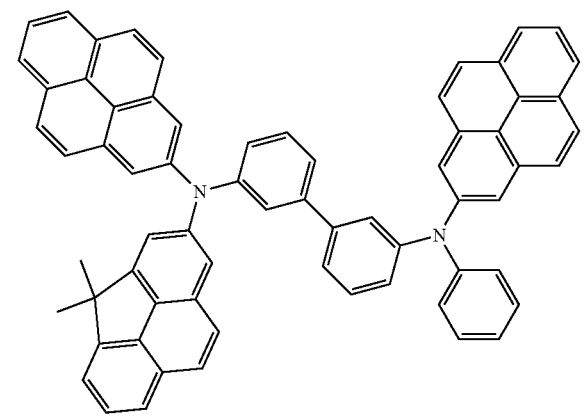
24
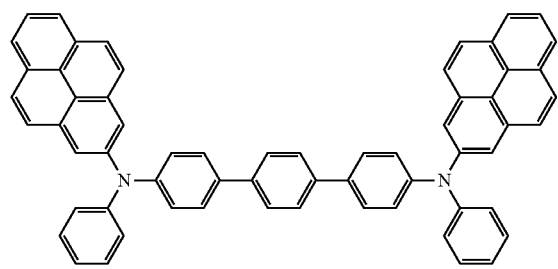
25
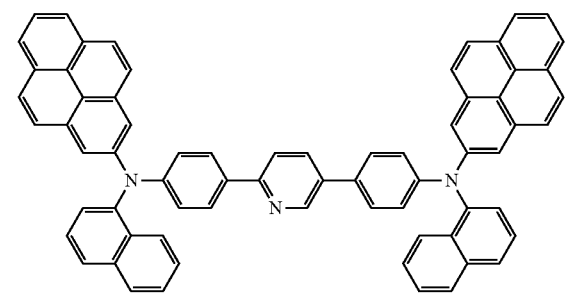
26
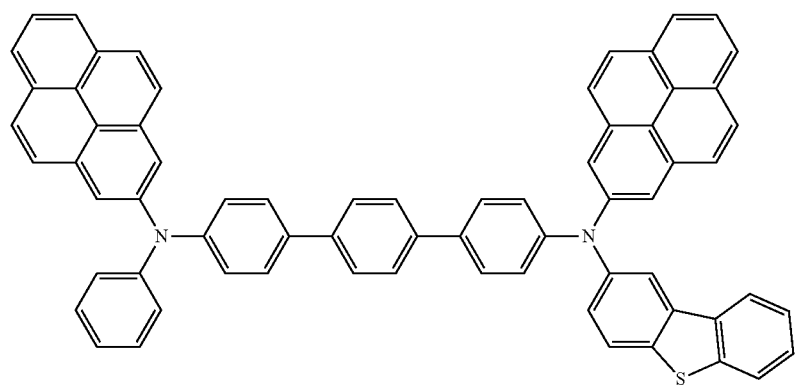
27
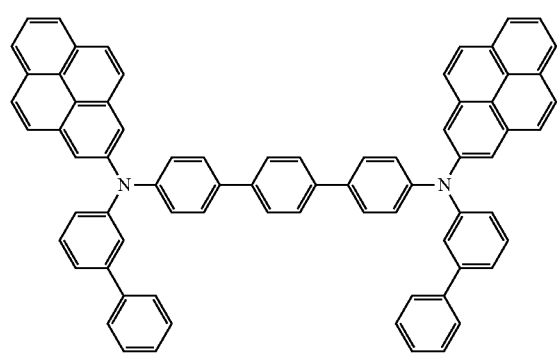
28
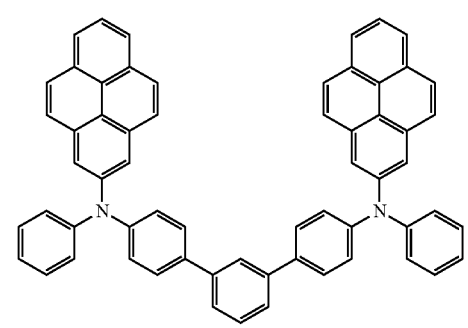
29

-continued
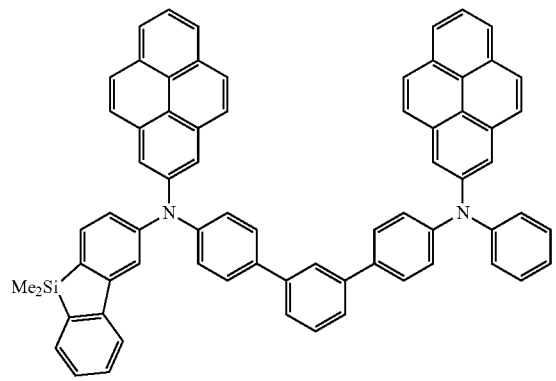
30
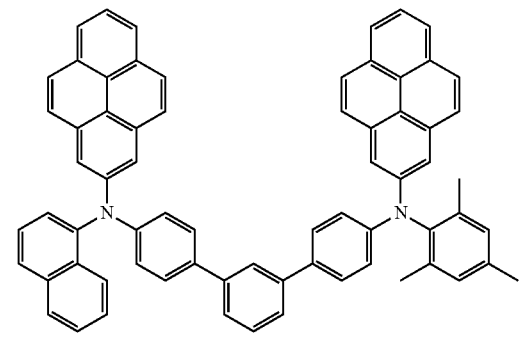
31
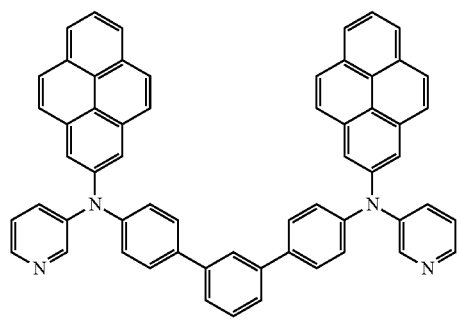
32
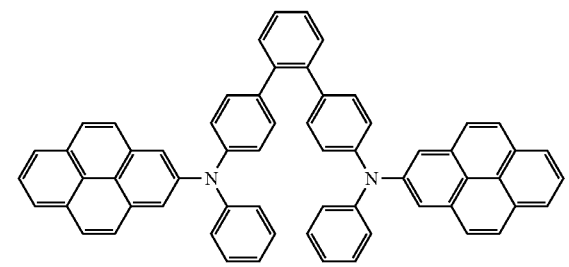
33
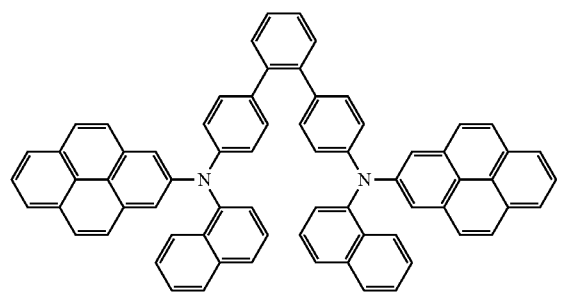
34
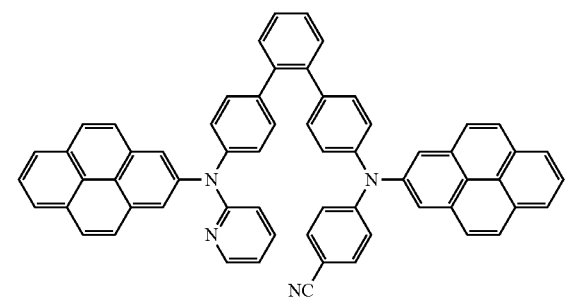
35
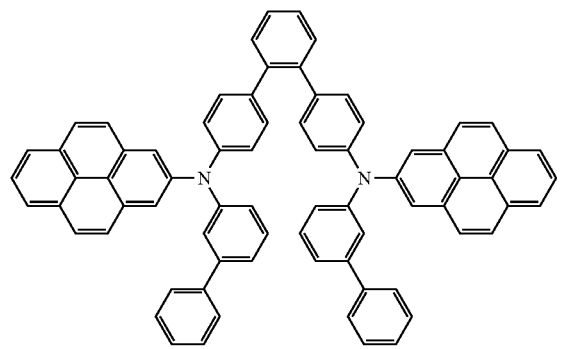
36
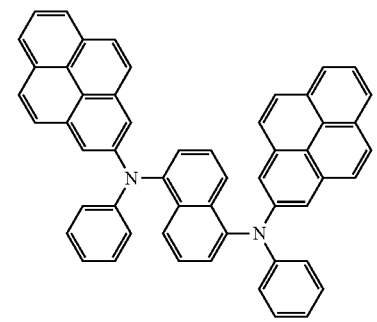
37

-continued
38
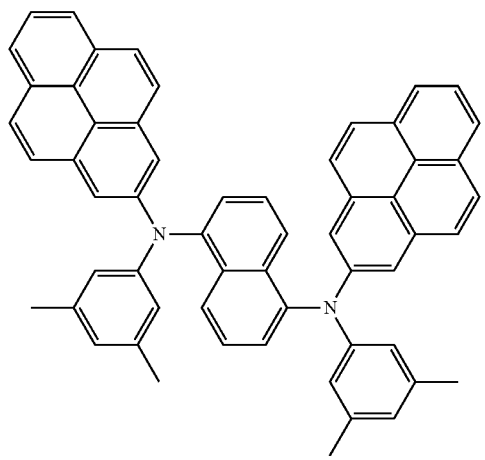
39
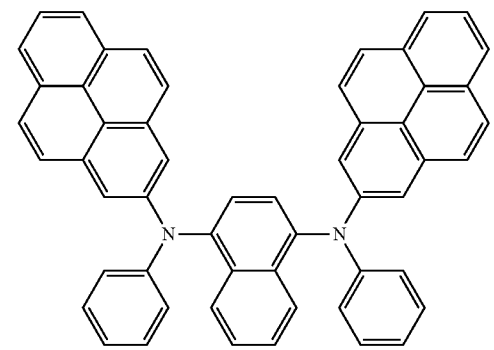
40
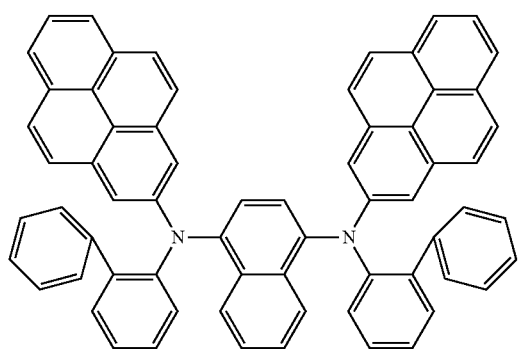
41
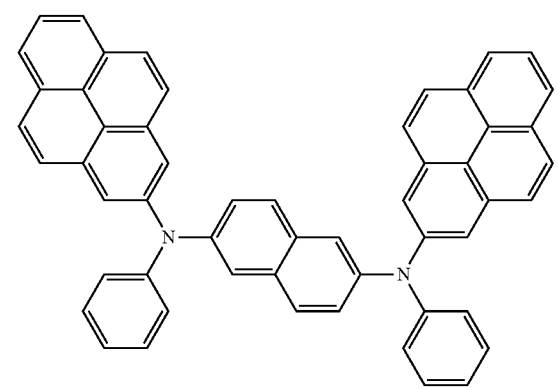
42
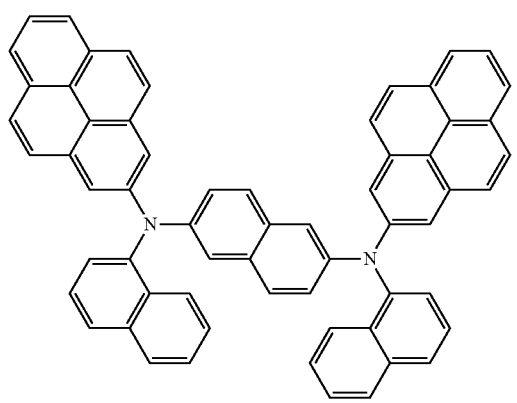
43
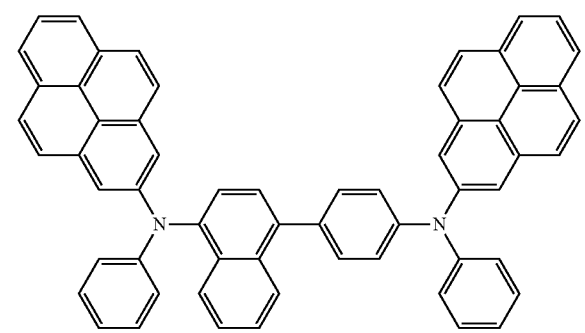
44
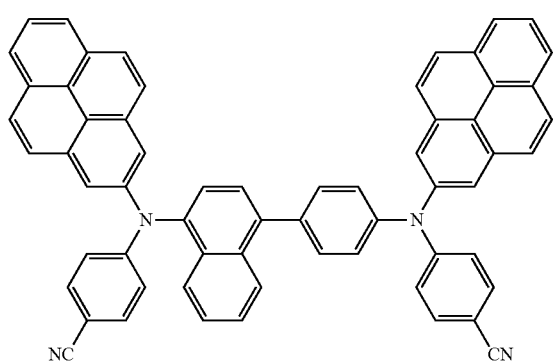
45
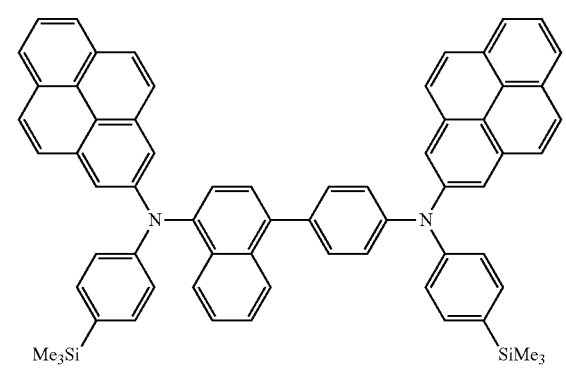

-continued
46
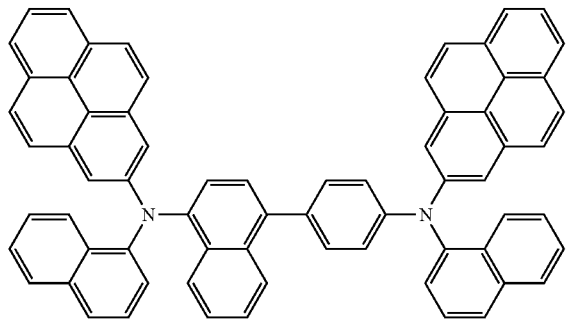
47
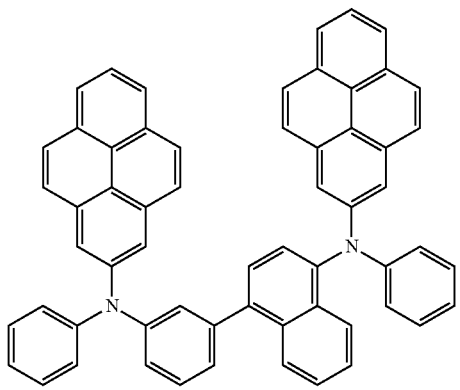
48
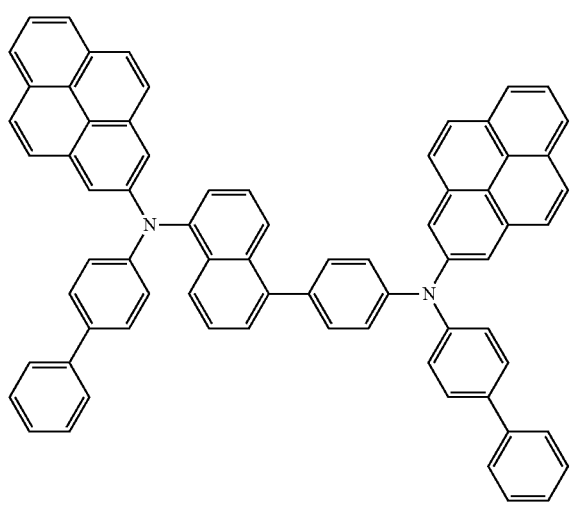
49
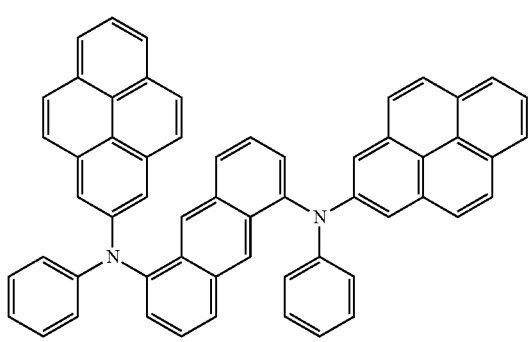
50
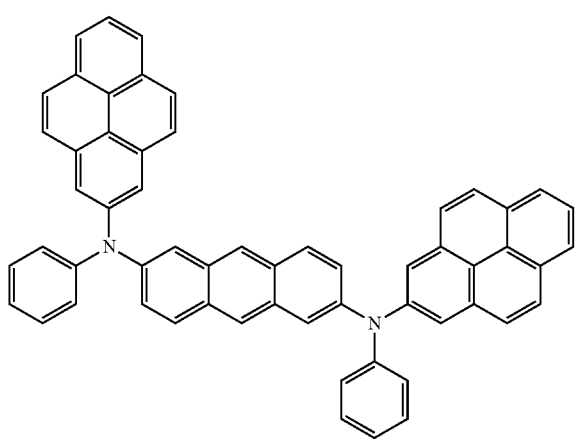
51
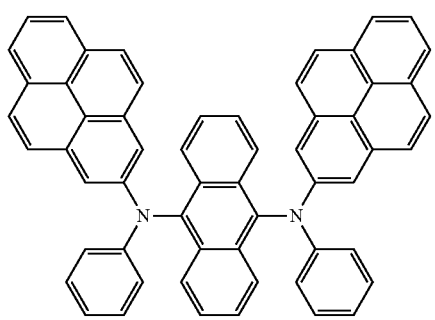

-continued
52
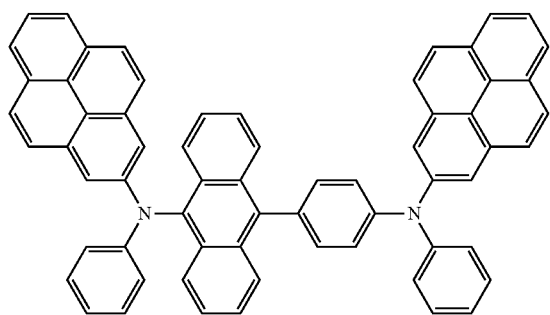
53
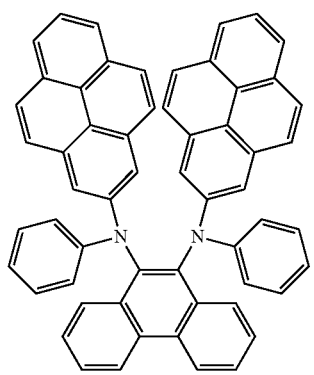
54
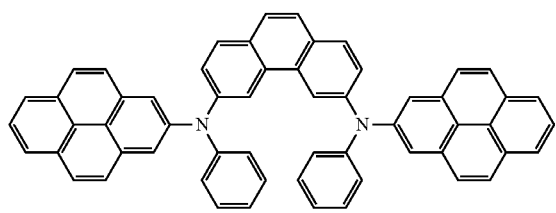
55
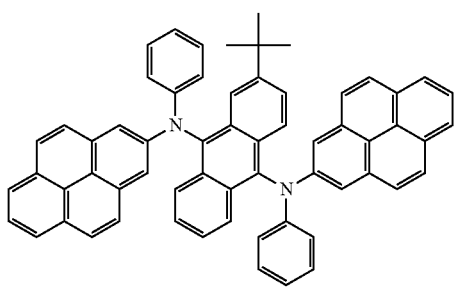
56
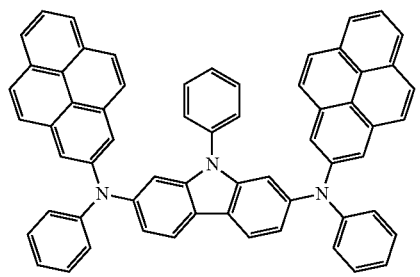
57
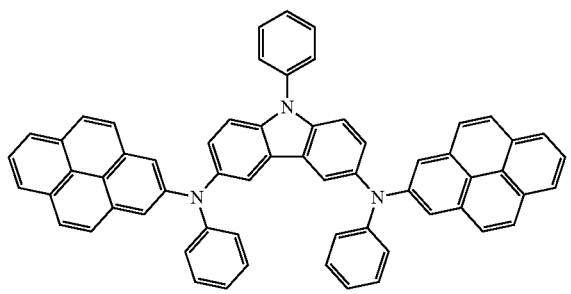
58
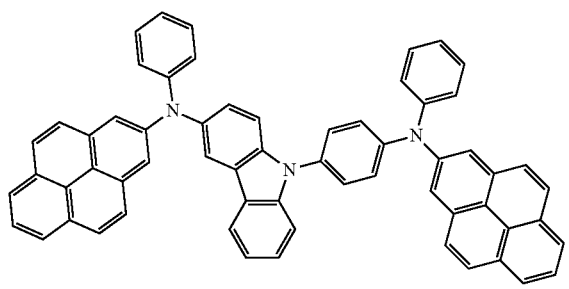
59
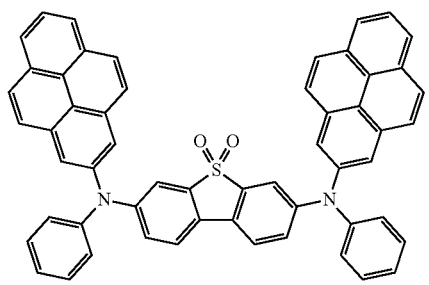
60
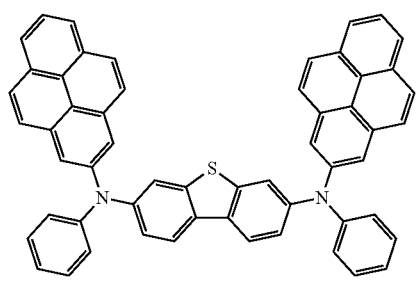
61
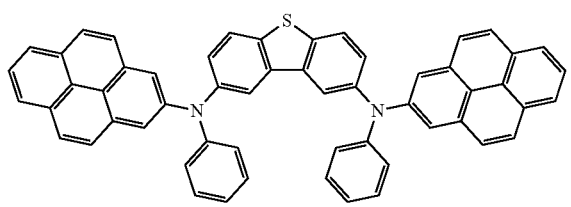

-continued
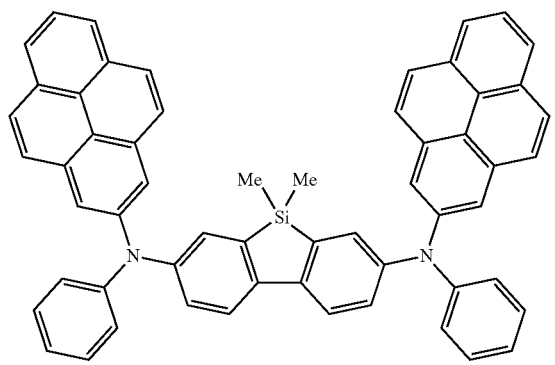
62
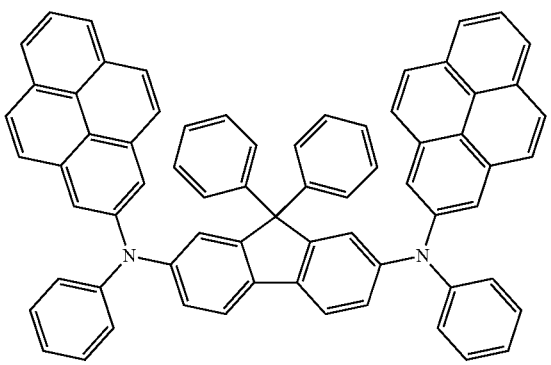
63
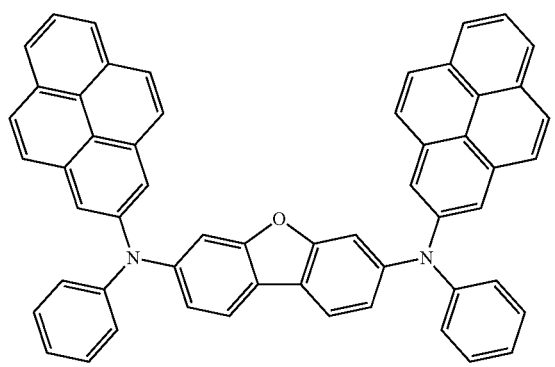
64
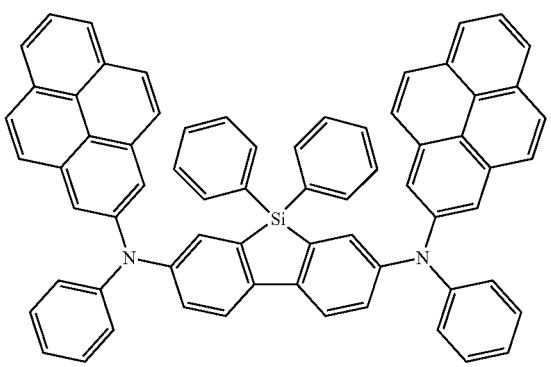
65
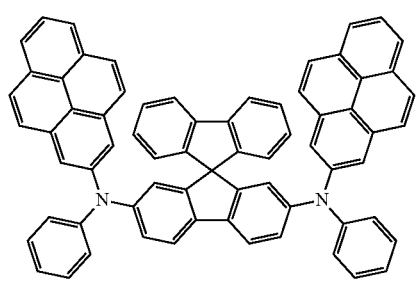
66
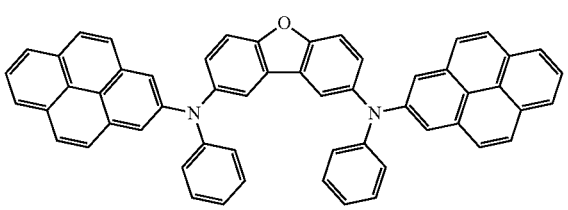
67
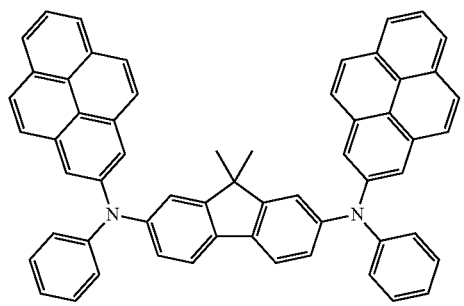
68
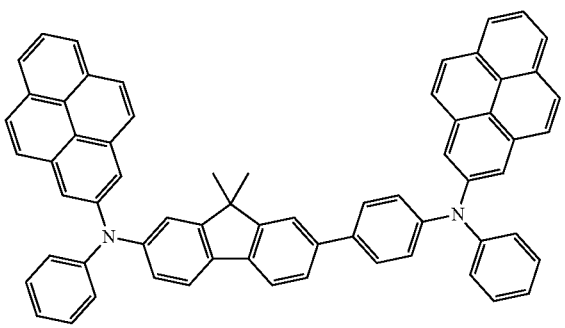
69

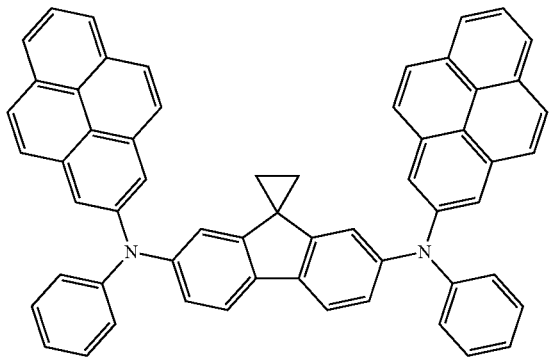

The condensed cyclic compound of Formula 1 may act as a material for an organic light-emitting diode (OLED), a material for a hole injection layer, and/or a material for a hole transport layer. Alternatively, the compound of Formula 1 may have a high glass transition temperature (Tg) or a high melting point (Tm) due to introduction of a condensed ring into a molecule. Thus, in regard to electroluminescence, the condensed cyclic compound of Formula 1 increases its thermal resistance and high-temperature environment resistant against Joule's heat that is generated in an organic layer, between organic layers, or between an organic layer and a metal electrode. An OLED manufactured by using the condensed cyclic compound of Formula 1 has high durability during storage or operation. Also, due to introduction of a substituent, such as a fluorine group, into a molecule, conditions of a molecular film are improved, and thus characteristics of the OLED may be improved.

Examples of the unsubstituted $C_1$-$C_{60}$ alkyl group (or a $C_1$-$C_{60}$ alkyl group) used herein are a linear or a branched $C_1$-$C_{60}$ alkyl group, such as a methyl group, an ethyl group, a propyl group, an iso-butyl group, a sec-butyl group, a pentyl group, an iso-amyl group, and a hexyl group. In the substituted $C_1$-$C_{60}$ alkyl group, at least one hydrogen atom of the unsubstituted $C_1$-$C_{60}$ alkyl group is substituted with one of a deuterium atom, a halogen group, a cyano group, a hydroxyl group, a nitro group, an amino group, an amidino group, a silyl group, a hydrazine group, a hydrazone group, a carboxyl group or a salt thereof, a sulfonic acid group or a salt thereto, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkyl group, a $C_6$-$C_{60}$ aryl group, a $C_2$-$C_{60}$ heteroaryl group, a $C_6$-$C_{60}$ aralkyl group, and a $C_6$-$C_{60}$ aryloxy;

a $C_1$-$C_{60}$ alkyl group, a $C_2$-$C_{60}$ alkenyl group, and a $C_2$-$C_{60}$ alkynyl group, $C_1$-$C_{60}$ alkoxy group, each substituted with at least one of a deuterium atom, a halogen group, a cyano group, a hydroxyl group, a nitro group, an amino group, an amidino group, a silyl group, a hydrazine group, a hydrazone group, a carboxyl group or a salt thereof, a sulfonic acid group or a salt thereof, and a phosphoric acid group or a salt thereof; and a $C_3$-$C_{60}$ cycloalkyl group, a $C_6$-$C_{60}$ aryl group, a $C_2$-$C_{60}$ heteroaryl group, a $C_6$-$C_{60}$ aralkyl group, and a $C_6$-$C_{60}$ aryloxy, each substituted with at least one of a deuterium atom, a halogen group, a cyano group, a hydroxyl group, a nitro group, an amino group, an amidino group, a silyl group, a hydrazine group, a hydrazone group, a carboxyl group or a salt thereof, a sulfonic acid group or a salt thereto, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{60}$ aryl group, and a $C_2$-$C_{60}$ heteroaryl group.

The unsubstituted $C_1$-$C_{60}$ alkoxy group (or a $C_1$-$C_{60}$ alkoxy group) used herein may have a formula of —OA (wherein, A is an unsubstituted $C_1$-$C_{60}$ alkyl group described above). Examples of the unsubstituted $C_1$-$C_{60}$ alkoxy group are a methoxy group, an ethoxy group, an isopropyloxy group, and the like. In the substituted $C_1$-$C_{60}$ alkoxy group, at least one hydrogen atom of the $C_1$-$C_{60}$ alkoxy group is substituted with the same substituent as used in the substituted $C_1$-$C_{60}$ alkyl group.

The unsubstituted $C_2$-$C_{60}$ alkenyl group (or a $C_2$-$C_{60}$ alkenyl group) used herein indicates an unsubstituted $C_2$-$C_{60}$ alkyl group having at least one carbon-carbon double bond in the center or at a terminal thereof. Examples of the unsubstituted $C_2$-$C_{60}$ alkenyl group are an ethenyl group, a prophenyl group, a butenyl group, and the like. In the substituted $C_2$-$C_{60}$ alkenyl group, at least one hydrogen atom of the $C_2$-$C_{60}$ alkenyl group is substituted with the same substituent as used in the substituted $C_2$-$C_{60}$ alkyl group.

The unsubstituted $C_2$-$C_{60}$ alkynyl group (or a $C_2$-$C_{60}$ alkynyl group) used herein indicates an unsubstituted $C_2$-$C_{60}$ alkyl group having at least one carbon-carbon triple bond in the center or at a terminal thereof. Examples of the unsubstituted $C_2$-$C_{60}$ alkynyl group are an ethynyl group, a propynyl group, and the like. In the substituted $C_2$-$C_{60}$ alkynyl group, at least one hydrogen atom of the $C_2$-$C_{60}$ alkynyl group may be substituted with the same substituent as used in the substituted $C_2$-$C_{60}$ alkyl group.

The unsubstituted $C_6$-$C_{60}$ aryl group may be a monovalent group including at least one carbocyclic aromatic system that has 6 to 60 carbon atoms. The unsubstituted $C_6$-$C_{60}$ arylene group may be a bivalent group including at least one carbocyclic aromatic system that has 6 to 60 carbon atoms. When the aryl group and the arylene group include two or more rings, the two or more rings may be fused to each other. In the substituted $C_6$-$C_{60}$ aryl group, at least one hydrogen atom of the $C_6$-$C_{60}$ aryl group is substituted with the same substituent as used in the substituted $C_1$-$C_{60}$ alkyl group. In the substituted $C_6$-$C_{60}$ arylene group, at least one hydrogen atom of the $C_6$-$C_{60}$ arylene group is substituted with the same substituent as used in the substituted $C_1$-$C_{60}$ alkyl group.

Examples of the substituted or unsubstituted $C_6$-$C_{60}$ aryl group are a phenyl group, a $C_1$-$C_{10}$ alkylphenyl group (i.e., an ethylphenyl group), a $C_1$-$C_{10}$ alkylbiphenyl group (i.e., an ethylbiphenyl group), a halophenyl group (i.e., an o-, m-, and p-fluorophenyl group or a dichlorophenyl group), a dicyanophenyl group, a trifluoromethoxyphenyl group, an o-, m-, and p-toryl group, an o-, m-, and p-cumenyl group, a mesityl group, a phenoxyphenyl group, an (α,α-dimethylbenzene group)phenyl group, an (N,N'-dimethyl)aminophenyl group, a (N,N'-diphenyl)aminophenyl group, a pentalenyl group, an indenyl group, a naphthyl group, a halonaphthyl group (i.e., a fluoronaphthyl group), a $C_1$-$C_{10}$ alkylnaphthyl group (i.e., a methylnaphthyl group), a $C_1$-$C_{10}$ alkoxynaphthyl group (i.e., a methoxynaphthyl group), an anthracenyl group, an azulenyl group, a heptalenyl group, an acenaphtylenyl group, a phenalenyl group, a fluorenyl group, an anthraquinolyl group, a methyanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentaphenyl group, a pentycenyl group, a tetraphenylenyl group, a hexaphenyl group, a hexacenyl group, a rubicenyl group, a coroneyl group, a trinaphthylenyl group, a heptaphenyl group, a heptacenyl group, a pyranthrenyl group, and an ovalenyl group. Examples of the substituted $C_6$-$C_{60}$ aryl group may be inferred based on those examples of the unsubstituted $C_6$-$C_{60}$ aryl group and the substituted $C_1$-$C_{60}$ alkyl group described above. Examples of the substituted or unsubstituted $C_6$-$C_{60}$ arylene group may be inferred based on those examples of the substituted or unsubstituted $C_6$-$C_{60}$ aryl group.

The unsubstituted $C_2$-$C_{60}$ heteroaryl group used herein may be a monovelent group including at least one aromatic ring that has at least one heteroatom selected from N, O, P, and S and carbon atoms as the remaining ring. The unsubstituted $C_2$-$C_{60}$ heteroarylene group used herein may be a divalent group including at least one aromatic ring that has at least one heteroatom selected from N, O, P, and S and carbon atoms as the remaining ring. Here, when the heteroaryl group and the heteroarylene group include two or more aromatic rings, the two or more aromatic rings may be fused to each other. In the substituted $C_2$-$C_{60}$ heteroaryl group, at least one hydrogen atom of the $C_2$-$C_{60}$ heteroaryl group is substituted with the same substituent as used in the substituted $C_1$-$C_{60}$ alkyl group. In the substituted $C_2$-$C_{60}$ heteroarylene group, at least one hydrogen atom of the $C_2$-$C_{60}$ heteroarylene group is substituted with the same substituent as used in the substituted $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyrydinyl group, a pyrydazinyl group, a pyrymidinyl group, a triazinyl group, a carbazolyl group, an indolyl group, a quinolinyl group, an isoquinolinyl group, a benzoimidazolyl group, an imidazopyridinyl group, and an imidazopyrymidinyl group. Examples of the substituted $C_2$-$C_{60}$ heteroaryl group may be inferred based on those examples of the unsubstituted $C_2$-$C_{60}$ heteroaryl group and the substituted $C_1$-$C_{60}$ alkyl group described above. Examples of the substituted or unsubstituted $C_2$-$C_{60}$ heteroarylene group may be inferred based on those examples of the substituted or unsubstituted $C_2$-$C_{60}$ heteroaryl group described above.

The substituted or unsubstituted $C_6$-$C_{60}$ aryloxy indicates a substituent of formula —$OA_2$ (wherein $A_2$ is a substituted or unsubstituted $C_6$-$C_{60}$ aryl group), and the substituted or unsubstituted $C_6$-$C_{60}$ arylthio group indicates a substituent of formula —$SA_3$ (wherein $A_3$ is a substituted or unsubstituted $C_6$-$C_{60}$ aryl group).

The condensed cyclic compound of Formula 1 may be synthesized by using a known organic synthesis method. The method may be obvious to one of ordinary skill in the art with reference to embodiments that will be described later.

The condensed cyclic compound of Formula 1 may be used between a pair of electrodes of an OLED. For example, the condensed cyclic compound of Formula 1 is used in an emission layer, a layer between an anode and an emission layer (i.e., a hole injection layer, a hole transport layer, or a functional layer having both hole injection and hole transport capabilities at the same time), and/or a layer between a cathode and an emission layer (i.e., an electron injection layer, an electron transport layer, or a functional layer having both electron injection and electron transport capabilities at the same time).

According to another embodiment of the present invention, there is provided an organic light-emitting diode (OLED) including a first electrode, a second electrode disposed opposite to the first electrode, and an organic layer disposed between the first electrode and the second electrode, wherein the organic layer includes at least one of condensed cyclic compounds represented by Formula 1 as described above.

The term "organic layer" as used herein refers to a layer including an organic compound and having at least one layer. For example, the organic layer may include at least one of a hole injection layer (HIL), a hole transport layer (HTL), a functional layer having both hole injection and hole transport capabilities at the same time (hereinafter, referred to as a hole injection-transport layer), an electron blocking layer (EBL), an emission layer (EML), a hole blocking layer (HBL), an electron injection layer (EIL), an electron transport layer (ETL), and a functional layer having both electron injection and transport capabilities at the same time (hereinafter, referred to as an electron injection-transport layer).

The organic layer may include not only an organic compound, but also an inorganic compound or an inorganic material. For example, the organic layer may include, in one layer, an organic compound and an inorganic compound or an inorganic material, such as an organometallic complex. Alternatively, the organic layer may include a layer including an organic compound and another layer only including an inorganic compound or an inorganic material.

The organic layer may include at least one condensed cyclic compound in a layer or in different layers. For example, the organic layer may include one kind of the condensed cyclic compound as a host in the EML, and another kind of the condensed cyclic compound as a material of the ETL. Alternatively, the organic layer may include one kind of the condensed cyclic compound as an emitting dopant and another kind of the condensed cyclic compound as a host in the EML while the organic layer may include one kind of the condensed cyclic compound as a material of the ETL in the HTL.

Accordingly, the organic layer includes at least one of the EML, the HIL, the HTL, and the hole injection-transport layer, wherein at least one of the EML, the HIL, the HTL, and the hole injection-transport layer includes the condensed cyclic compound.

For example, the organic layer includes the EML, and the EML includes a host and a dopant. The condensed cyclic compound may be a dopant of the EML.

Alternatively, the EML includes a host and a dopant, and may further include a fluorescent dopant or a phosphorescent dopant. An example of the phosphorescent dopant is an organometallic complex including at least one selected from Ir, Pt, Os, Re, Ti, Zr, Hf, Eu, Tb, and Tm, but the phosphorescent dopant is not limited thereto. Here, the EML may or may not include the condensed cyclic compound.

The organic layer includes at least one of the HIL, the HTL, and the hole injection-transport layer, and at least one of the HIL, the HTL, and the hole injection-transport layer may further include a charge-generating material. The charge-generating material may be, for example, a p-dopant.

FIG. 1 illustrates a schematic view illustrating a structure of an OLED 10 according to an embodiment of the present invention. Hereinafter, a structure and a method of manufacturing an OLED according to an embodiment of the present invention will be described in detail with reference to FIG. 1.

The OLED 10 has a structure including a substrate 11, and a first electrode 13, an organic layer 15, and a second electrode 17 that are sequentially stacked on the substrate 11.

The substrate 11 may be any substrate that is used in an existing OLED. In some embodiments, the substrate 11 may be a glass substrate or a transparent plastic substrate with strong mechanical strength, thermal stability, transparency, surface smoothness, ease of handling, and water resistance.

The first electrode 13 may be formed by depositing or sputtering a material of the first electrode 13, on the substrate 11. When the first electrode 13 is an anode, the material of the first electrode 13 may be selected from materials with a high work function to enable ease of hole injection. The first electrode 13 may be a reflective electrode or a transmission electrode. Examples of the material of the first electrode are indium tin oxide (ITO), indium zinc oxide (IZO), tin oxide ($SnO_2$), and zinc oxide (ZnO) that are transparent and have excellent conductivity. Alternatively, the first electrode 14 may be a reflective electrode formed of magnesium (Mg), silver (Ag), aluminum (Al), aluminum: lithium (Al:Li), calcium (Ca), silver:indium tin oxide (Ag: ITO), magnesium:indium (Mg:In), magnesium:silver (Mg: Ag), or the like. The first electrode 13 may have a single-layered structure or a multi-layered structure including at least two layers. For example, the first electrode 13 may have a three-layered structure of ITO/Ag/ITO, but the structure is not limited thereto.

The organic layer 15 may be formed on top of the first electrode 13.

The organic layer 15 may include the HIL, the HTL, the EML, the ETL, and the EIL.

The HIL may be formed on the first electrode 13 by using various methods, such as vacuum deposition, spin coating, and casting, casting, and Langmuir-Blodgett (LB) deposition.

When the HIL is formed by vacuum deposition, the vacuum deposition conditions may vary depending on a compound that is used to form the HIL, and the desired structure and thermal properties of the HIL to be formed. However, the deposition conditions may be performed at a temperature in a range of about 100° C. to about 500° C., a pressure in a range of about $10^{-8}$ Torr to about $10^{-3}$ Torr, and a deposition rate in a range of about 0.01 Å/sec to about 100 Å/sec. However, the deposition conditions are not limited thereto.

When the HIL is formed by spin coating, the coating conditions may vary depending on a compound that is used to form the HIL, and the desired structure and thermal properties of the HIL to be formed. For example, the coating rate may be in a range of about 2,000 rpm to about 5,000 rpm, and a temperature at which heat treatment is performed to remove a solvent after coating may be in a range of about 80° C. to about 200° C. However, the coating conditions are not limited thereto.

As a material of the HIL, the condensed cyclic compound of Formula 1 or a known material of the HIL may be used, and examples thereof are N,N'-diphenyl-N,N'-bis-[4-(phenyl-m-tolyl-amino)-phenyl]-biphenyl-4,4'-diamine, (DNTPD), a phtalocyanine compound such as copper phtalocyanine, 4,4',4"-tris(3-methylphenylphenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2T-NATA), polyaniline/dodecylbenzenesulfonic acid (PANI/DBSA), poly(3,4-ethylenedioxythiophene)/poly(4-styrenesulfonate) (PEDOT/PSS), and polyaniline/camphor sulfonic acid (PANI/CSA) or polyaniline/poly(4-styrenesulfonate) (PANI/PSS). However, the material of the HIL is not limited thereto:

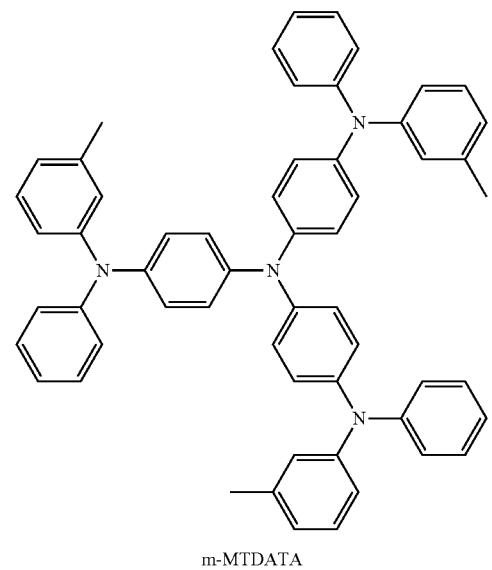

m-MTDATA

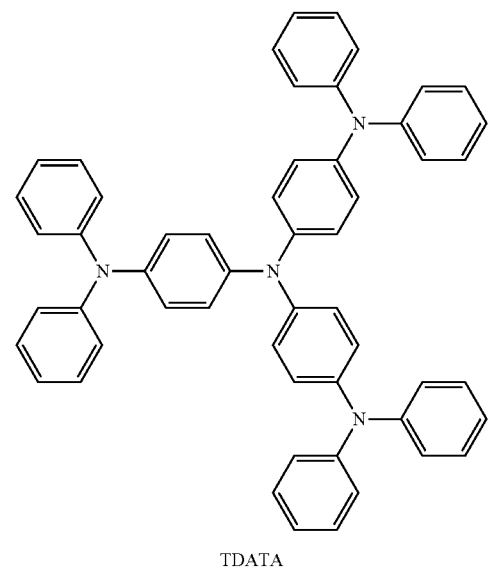

TDATA

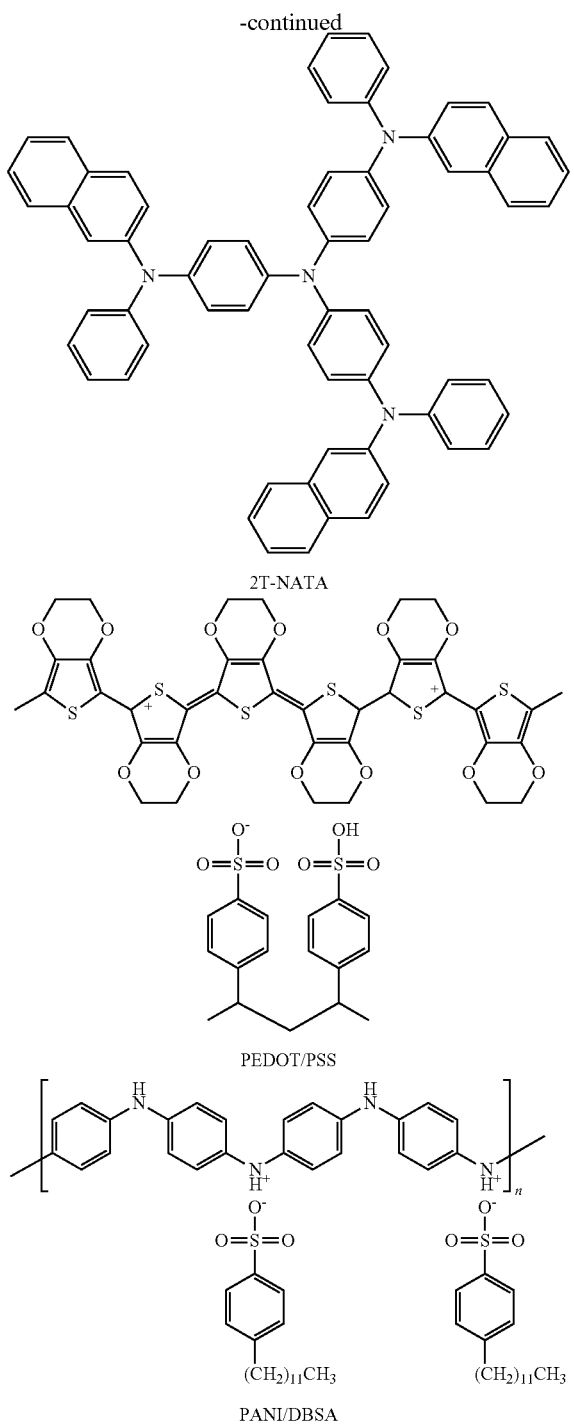

2T-NATA

PEDOT/PSS

PANI/DBSA

A thickness of the HIL may be in a range of about 100 Å to about 10,000 Å, for example, about 100 Å to about 1,000 Å. When the thickness of the HIL is within the above ranges, the HIL may have satisfactory hole injection characteristics without a substantial increase in a driving voltage.

Then, the HTL may be formed on the HIL by using various methods, such as vacuum deposition, spin coating, and casting, casting, and LB deposition. When the HTL is formed by vacuum deposition or spin coating, the deposition and coating conditions may be similar to those for the formation of the HIL, although the deposition and coating conditions may vary depending on a compound that is used to form the HTL.

As a material of the HTL, the condensed cyclic compound of Formula 1 or a known material of the HTL may be used, and examples thereof are a carbazole derivative such as N-phenylcarbazole or polyvinylcarbazole, N,N'-bis(3-methylphenyl)-N,N'-diphenyl-[1,1-biphenyl]-4,4'-diamine (TPD), N,N'-bis(naphthalen-2-yl)-N,N'-bis(phenyl)-benzidine (NPB), N,N'-bis(naphthalene-1-yl)-N,N'-bis(phenyl)-benzidine), N,N'-bis(naphthalen-1-yl)-N,N'-bis(phenyl)-2,2'-dimethylbenzidine (α-NPD), and 4,4',4"-tris(N-carbazolyl)triphenylamine (TCTA). However, the known material of the HTL is not limited thereto:

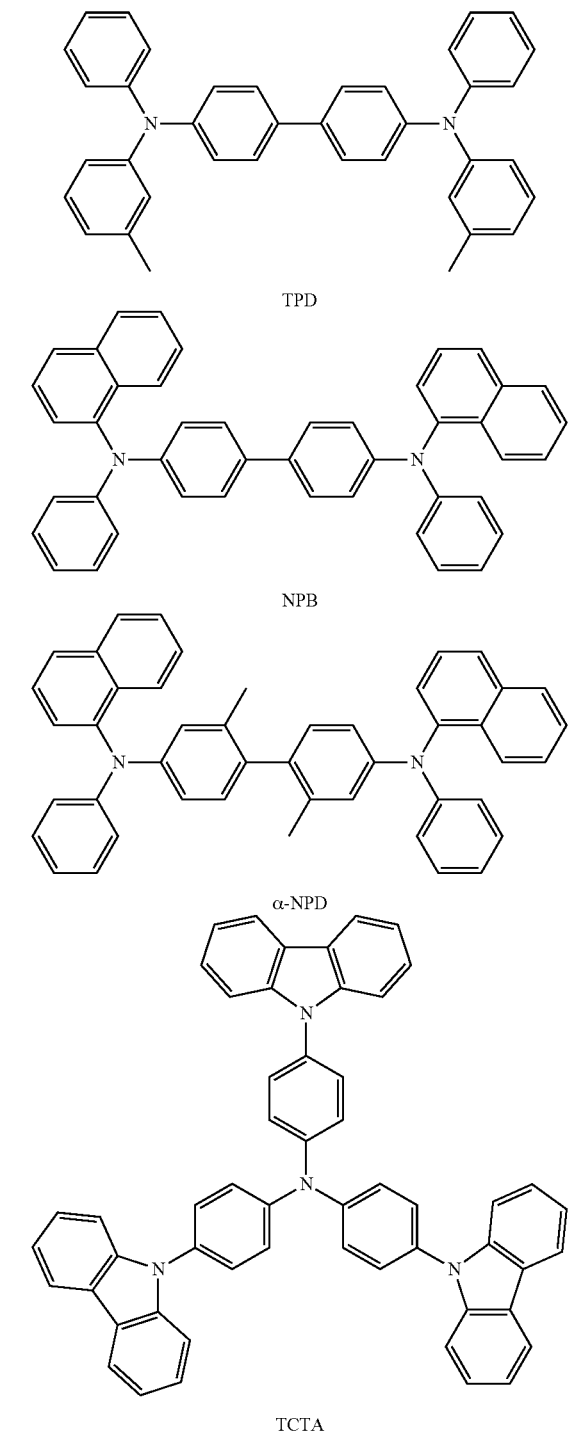

TPD

NPB

α-NPD

TCTA

A thickness of the HTL may be in a range of about 50 Å to about 1,000 Å, for example, about 100 Å to about 800 Å. When the thickness of the HTL 14 is within the above ranges, the HTL may have satisfactory hole transport characteristics without a substantial increase in a driving voltage.

Alternatively, the hole injection-transport layer may be formed instead of the HIL and the HTL. The injection-transport layer may include at least one of the above-described materials of the HIL and HTL. A thickness of the hole injection-transport layer may be in a range of about 500 Å to about 10,000 Å, for example, about 100 Å to about 1,000 Å. When the thickness of the hole injection-transport layer is within the above ranges, the hole injection-transport layer may have satisfactory hole injection and hole transport characteristics without a substantial increase in a driving voltage.

In some embodiments, at least one of the HIL, the HTL, and the hole injection-transport layer may include at least one of compounds represented by one of Formulas 100 and 101:

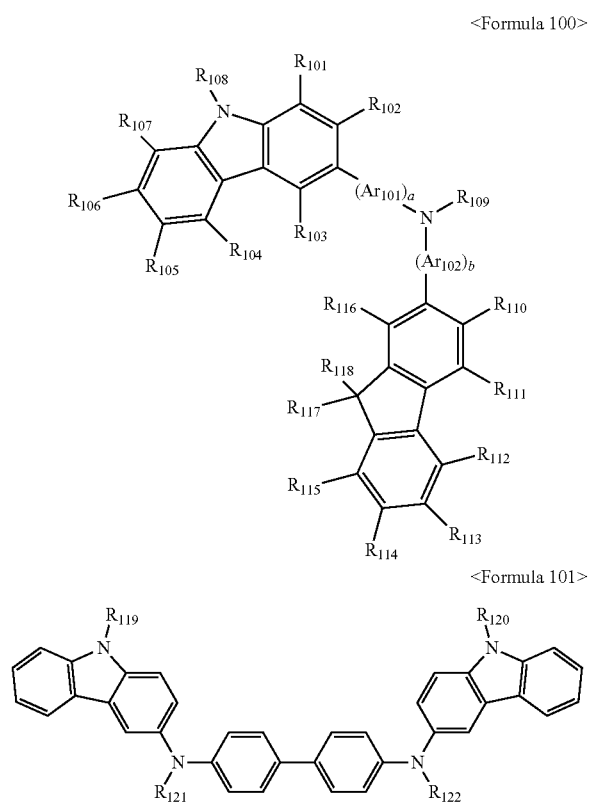

<Formula 100>

<Formula 101>

In Formula 100, $Ar_{101}$ and $Ar_{102}$ may be each independently a substituted or unsubstituted $C_6$-$C_{40}$ arylene group. For example, $Ar_{101}$ and $Ar_{102}$ may be each independently selected from a phenylene group, a pentalenylene group, an indenylene group, a naphthylene group, an azulenylene group, a heptalenylene group, a substituted or unsubstituted acenaphthylene group, a fluorenylene group, a phenalenylene group, a phenanthrenylene group, an anthrylene group, a fluoranthenyl group, a triphenylenylene group, a pyrenylene group, a chrysenylene group, a naphthacenylene group, a picenylene group, a perylenylene group, and a pentacenylene group; and a phenylene group, a pentalenylene group, an indenylene group, a naphthylene group, an azulenylene group, a heptalenylene group, a substituted or unsubstituted acenaphthylene group, a fluorenylene group, a phenalenylene group, a phenanthrenylene group, an anthrylene group, a fluoranthenyl group, a triphenylenylene group, a pyrenylene group, a chrysenylene group, a naphthacenylene group, a picenylene group, a perylenylene group, and a pentacenylene group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a $C_1$-$C_{40}$ alkyl group, a $C_2$-$C_{40}$ alkenyl group, a $C_2$-$C_{40}$ alkynyl group, a $C_1$-$C_{40}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{40}$ aryl group, a $C_6$-$C_{40}$ aryloxy, a $C_6$-$C_{40}$ arylthio group, and a $C_2$-$C_{40}$ heteroaryl group.

In Formula 100, a and b may be each independently an integer of 0 to 5, or may be 0, 1, or 2. For example, a may be 1 and b may be 0, but a and b are not limited thereto.

In Formulas 100 and 101, $R_{101}$ to $R_{122}$ may be each independently a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a substituted or unsubstituted $C_1$-$C_{40}$ alkyl group, a substituted or unsubstituted $C_2$-$C_{40}$ alkenyl group, a substituted or unsubstituted $C_2$-$C_{40}$ alkynyl group, a substituted or unsubstituted $C_1$-$C_{40}$ alkoxy group, a substituted or unsubstituted $C_3$-$C_{40}$ cycloalkyl group, a substituted or unsubstituted $C_6$-$C_{40}$ aryl group, a substituted or unsubstituted $C_6$-$C_{40}$ aryloxy, or a substituted or unsubstituted $C_6$-$C_{40}$ arylthio group.

For example, $R_{101}$ to $R_{108}$ and $R_{110}$ to $R_{122}$ may be each independently selected from a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a $C_1$-$C_{10}$ alkyl group (i.e., a methyl group, an ethyl group, a propyl group, a butyl group, a pentyl group, a hexyl group, and the like), a $C_1$-$C_{10}$ alkoxy group (i.e., a methoxy group, an ethoxy group, a propoxy group, a butoxy group, a pentoxy group, and the like), a phenyl group, a naphthyl group, an anthryl group, a fluorenyl group, a pyrenyl group; and a $C_1$-$C_{10}$ alkyl group, a $C_1$-$C_{10}$ alkoxy group, a phenyl group, a naphthyl group, an anthryl group, a fluorenyl group, and a pyrenyl group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof. However, $R_{101}$ to $R_{108}$ and $R_{110}$ to $R_{122}$ are not limited thereto.

In Formula 100, $R_{109}$ may be selected from a phenyl group, a naphthyl group, an anthryl group, a biphenyl group, and a pyridyl group; and a phenyl group, a naphthyl group, an anthryl group, a biphenyl group, and a pyridyl group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a substituted or unsubstituted $C_1$-$C_{20}$ alkyl group, and a substituted or unsubstituted $C_1$-$C_{20}$ alkoxy group.

In some embodiments, the compound of Formula 100 may be represented by Formula 100A, but is not limited thereto:

<Formula 100A>

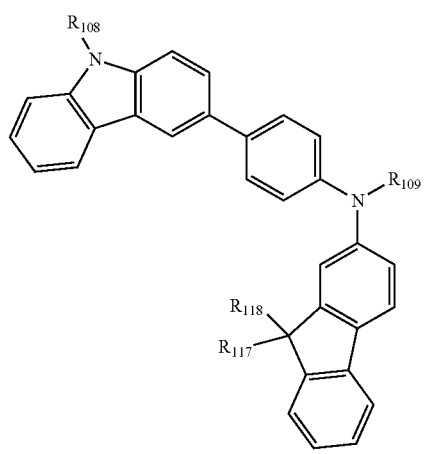

$R_{108}$, $R_{109}$, $R_{117}$, and $R_{118}$ in Formula 100A are already described above.

For example, at least one layer selected from the HIL, the HTL, and the hole injection-transport layer may include at least one of Compounds 102 to 121, but the compounds are not limited thereto:

102

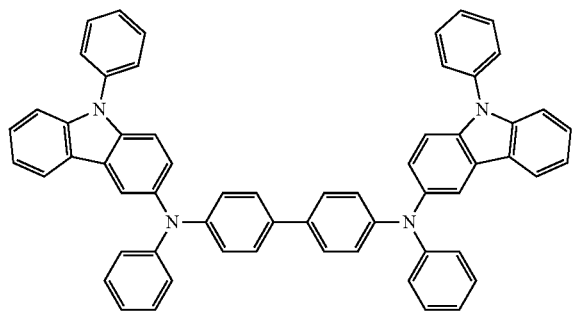

103

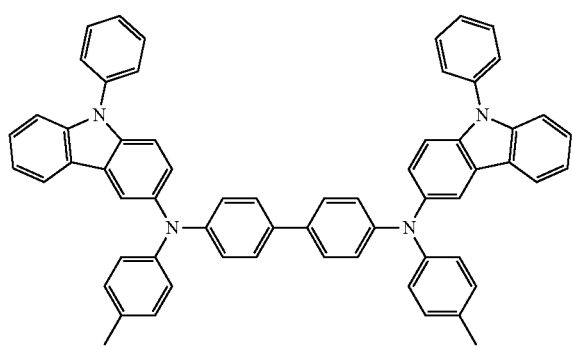

104

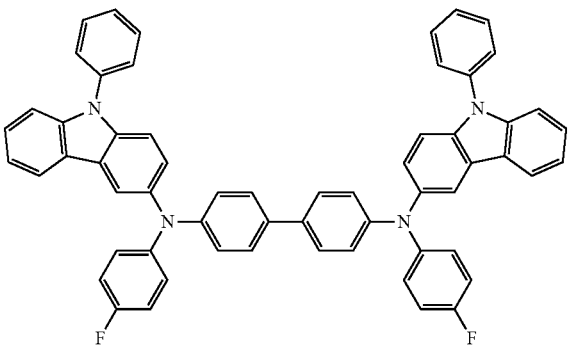

105

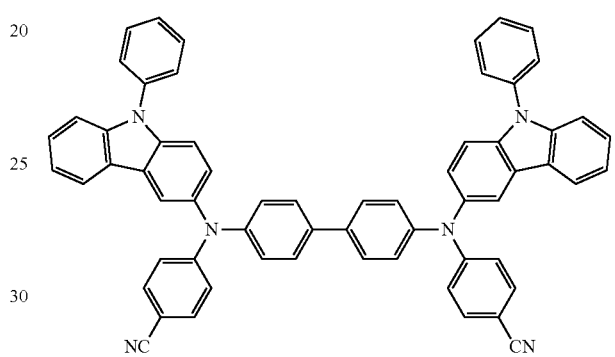

106

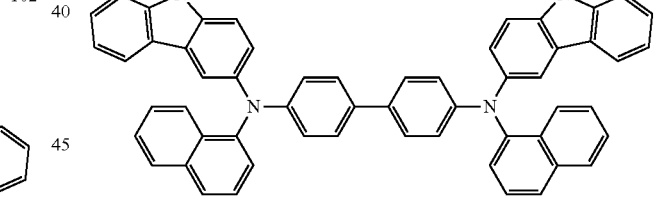

107

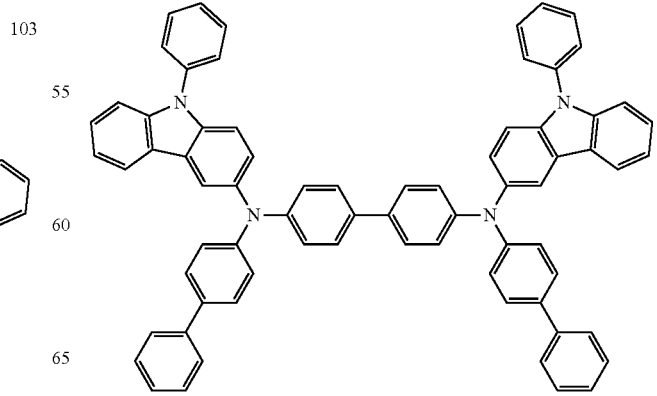

108
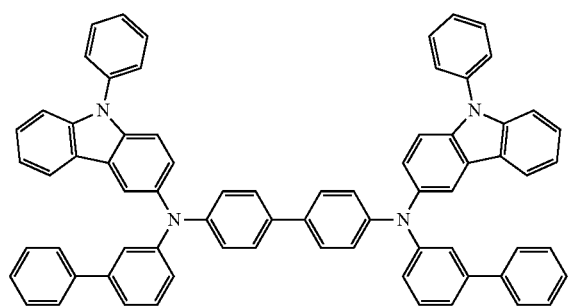
109
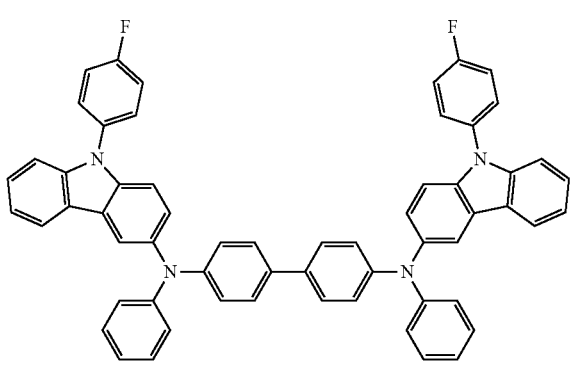
110
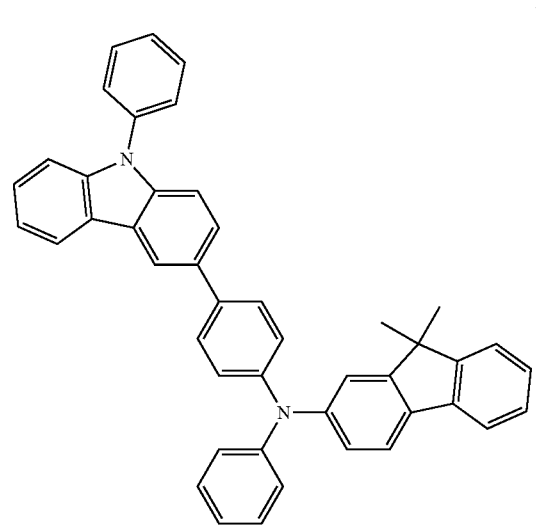
111
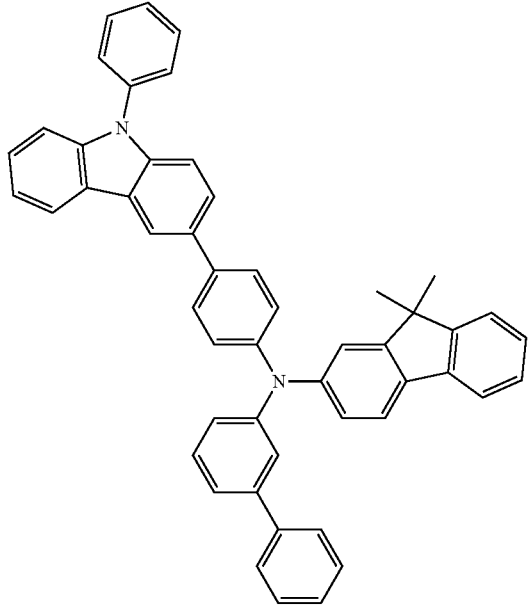
112
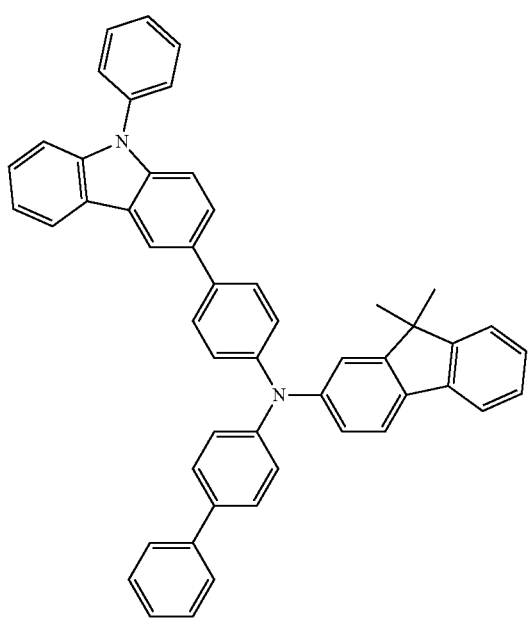

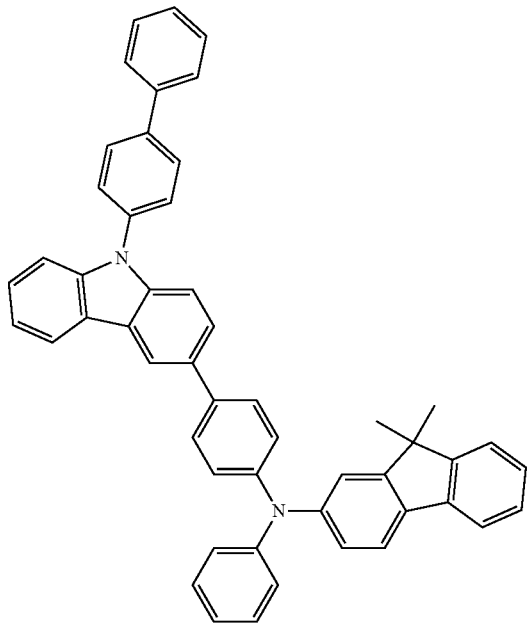
113
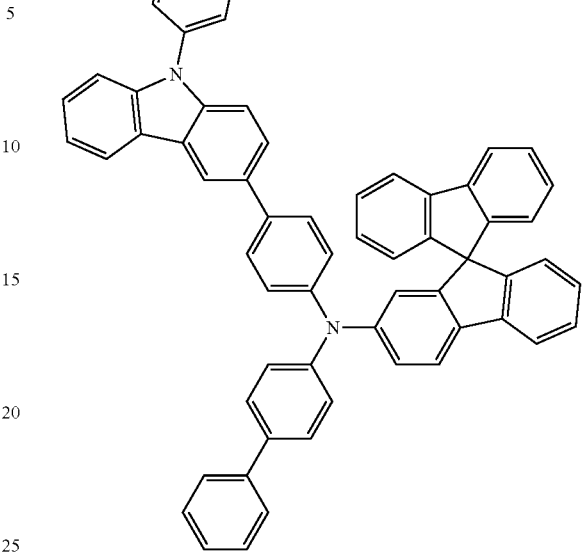
115
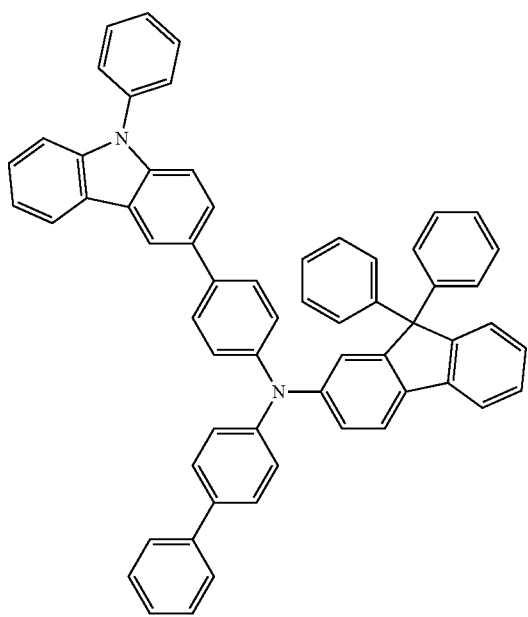
114
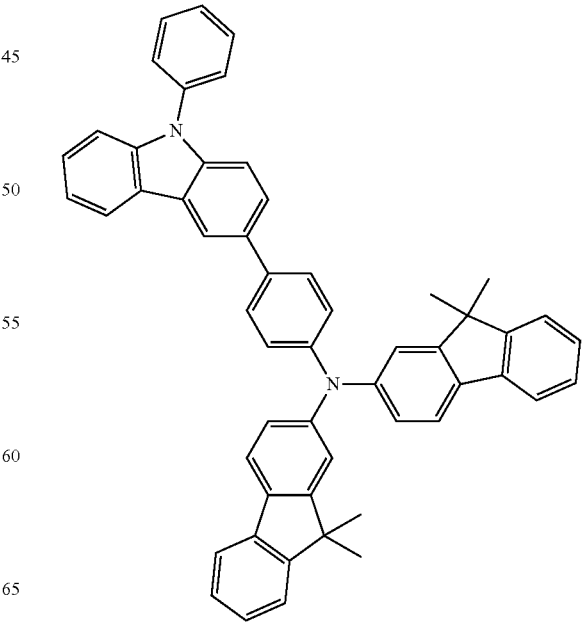
116

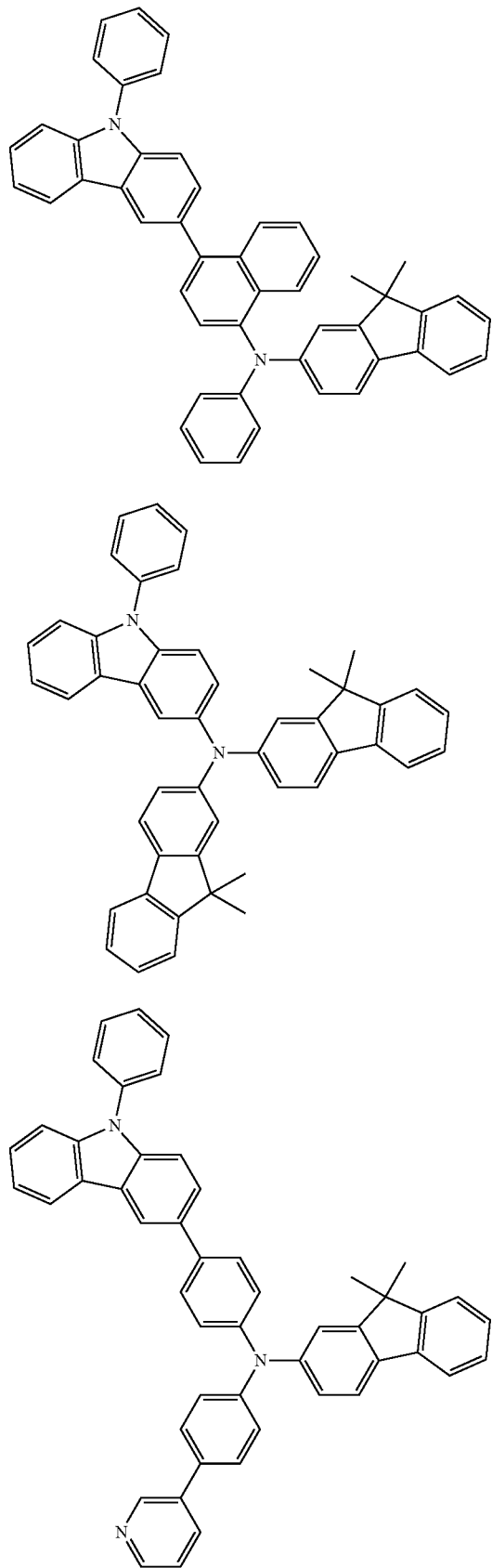
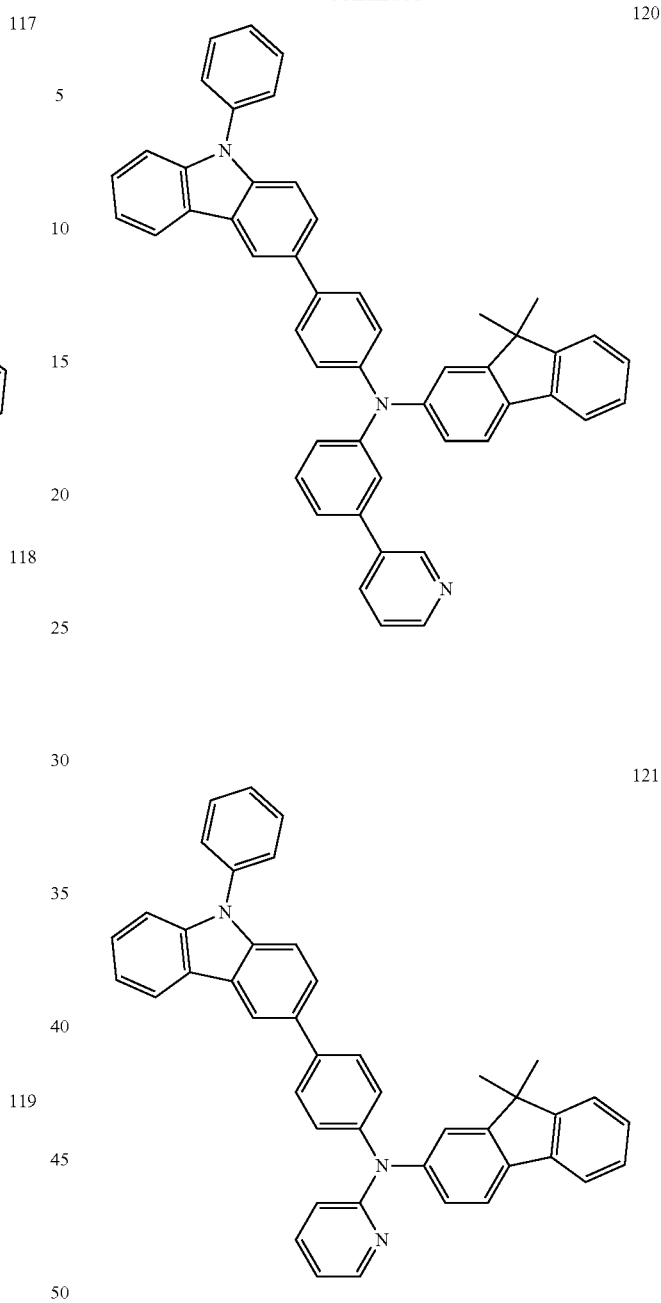

At least one the HIL, the HTL, and the hole injection-transport layer may further include a charge-generating material to improve conductivity of a film, in addition to a known material of the HIL, a known material of the HTL, and/or a known material of the hole injection-transport layer.

The charge-generating material may be, for example, a p-dopant. Non-limiting examples of the p-dopant are quinone derivatives, such as tetracyanoquinodimethane (TCNQ) and 2,3,5,6-tetrafluoro-tetracyano-1,4-benzoquinodimethane (F4-TCNQ); a metal oxide, such as a tungsten oxide and a molybdenym oxide; and a cyano group-containing compound, such as Compound 200 below, but the p-dopant is not limited thereto:

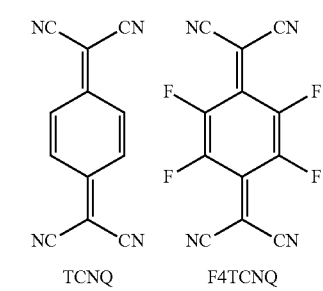

TCNQ     F4TCNQ

<200>

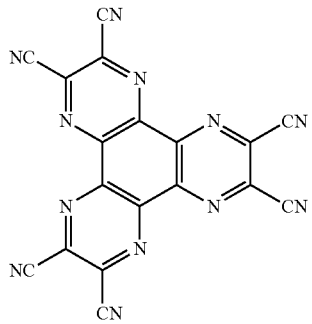

When the HIL, the HTL, or the hole injection-transport layer further includes the charge-generating material, the charge-generating material may be homogeneously dispersed or non-homogeneously distributed in the layers above.

A buffer layer may be disposed between at least one of the HIL, the HTL, and the hole injection-transport layer, and the EML. The buffer layer may compensate for an optical resonance distance of light according to a wavelength of the light emitted from the EML, and thus may increase efficiency. The buffer layer may include any material of the HIL or the HTL is widely known. In some other embodiments, the buffer layer may include the same material as one of the materials included in the HIL, the HTL, and the hole injection-transport layer that underlie the buffer layer.

Then, the EML may be formed on the HIL, the hole injection-transport layer, or the buffer layer by vacuum deposition, spin coating, casting, LB deposition, or the like. When the EML is formed by vacuum deposition or spin coating, the deposition and coating conditions may be similar to those for the formation of the HIL, although the conditions for deposition and coating may vary depending on the material that is used to form the EML.

As a material of the EML, at least one of the condensed cyclic compounds of Formula 1 and known light-emitting materials (including both a host and a dopant) may be used. When the EML includes the condensed cyclic compound of Formula 1, the EML may further include a known phosphorescent host, a known fluorescent host, a known phosphorescent dopant, or a known fluorescent dopant, in addition to the condensed cyclic compound of Formula 1. The condensed cyclic compound may act as a fluorescent host or a phosphorescent host.

The condensed cyclic compound of Formula 1 or the known host may be used as the host. Examples of the known host are tris (8-quinolinolate)aluminum (Alq$_3$), 4,4'-N,N'-dicabazole-biphenyl (CBP), poly(n-vinylcabazole (PVK), 9,10-di(naphthalene-2-yl)anthracene (ADN), 2-methyl-9,10-bis(naphthalen-2-yl)anthracene (MADN), 3-tert-butyl-9,10-di(naphth-2-yl)anthracene (TBADN), TCTA, 1,3,5-tris (N-phenylbenzimidazole-2-yl)benzene (TPBI), distyrylarylene (DSA), a compound of formula E3 below, dmCBP (see Formula below), and Compounds 301 to 309, but the known host is not limited thereto:

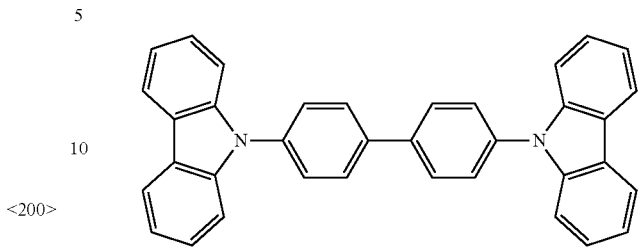

CBP

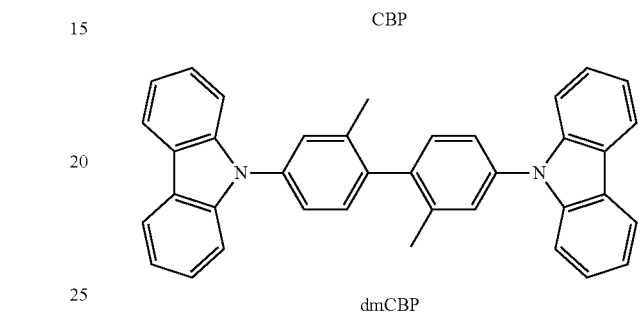

dmCBP

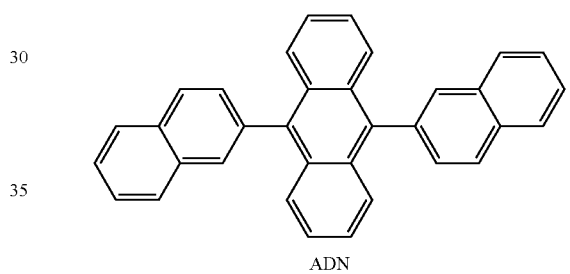

ADN

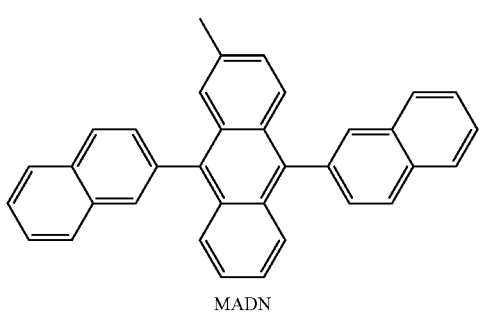

MADN

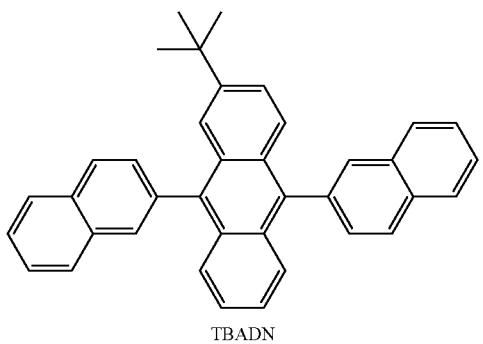

TBADN

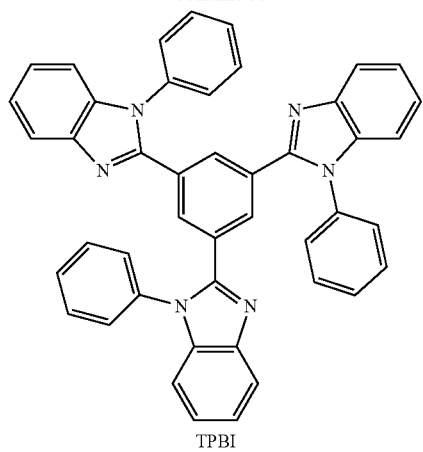
TPBI
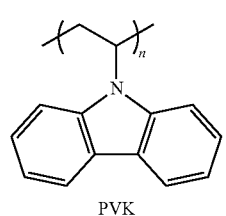
PVK
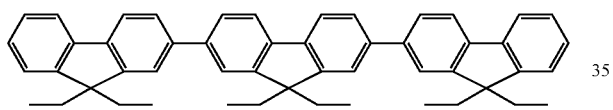
E3
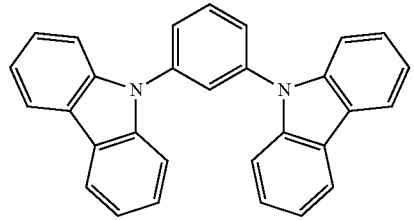
301
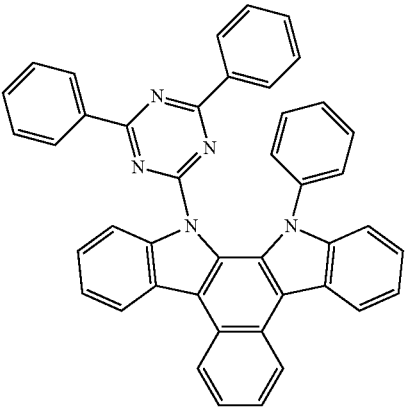
303
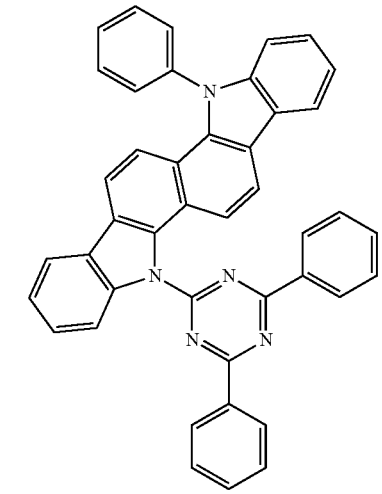
304
302
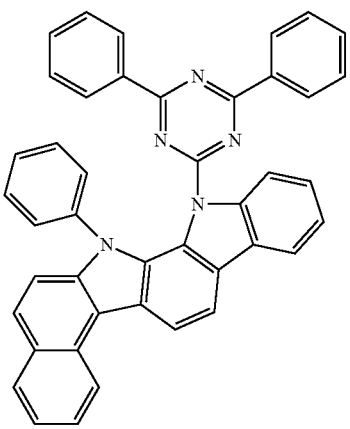
305

306

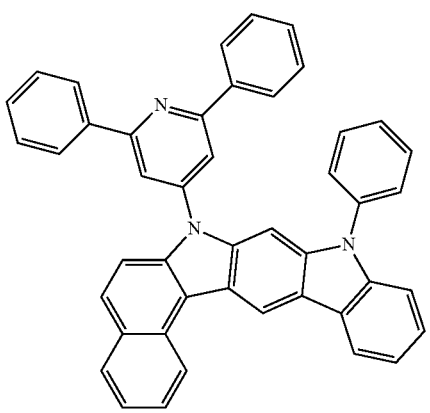

307

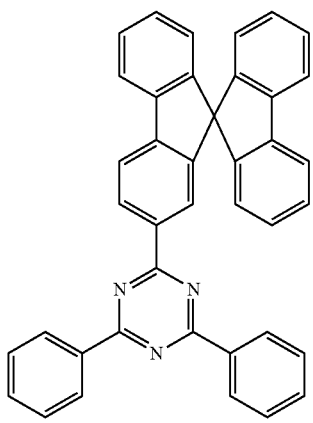

308

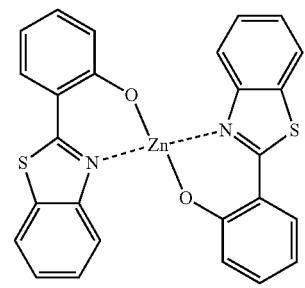

309

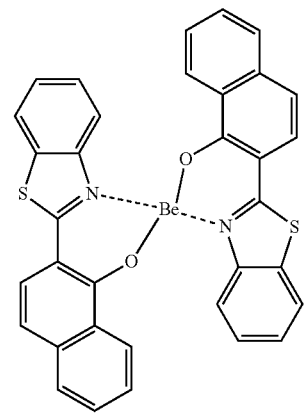

Alternatively, an anthracene-based compound represented by Formula 400 below may be used as the host:

<Formula 400>

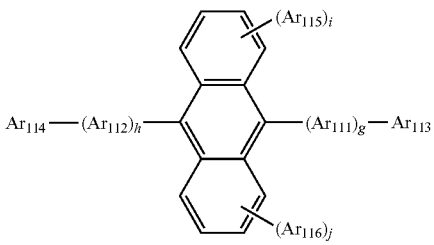

In Formula 400, $Ar_{111}$ and $Ar_{112}$ may be each independently a substituted or unsubstituted $C_6$-$C_{60}$ arylene group;

$Ar_{113}$ to $Ar_{116}$ may be each independently a substituted or unsubstituted $C_1$-$C_{10}$ alkyl group or a substituted or unsubstituted $C_6$-$C_{60}$ aryl group; and g, h, i, and j may be each independently an integer of 0 to 4.

For example, $Ar_{111}$ and $Ar_{112}$ in Formula 400 may be each independently a phenylene group, a naphtylene group, a phenanthrenylene group, or a pyrenylene group; or a phenylene group, a naphtylene group, a phenanthrenylene group, a fluorenyl group, or a pyrenylene group, each substituted with at least one of a phenyl group, a naphthyl group, and an anthryl group, but $Ar_{111}$ and $Ar_{112}$ are not limited thereto.

In Formula 400, g, h, i, and j may be each independently 0, 1, or 2.

In Formula 400, $Ar_{113}$ to $Ar_{116}$ may be each independently at least one of a $C_1$-$C_{10}$ alkyl group that is substituted with at least one of a phenyl group, a naphthyl group, and an anthryl group;

a phenyl group; a naphthyl group; an anthryl group; a pyrenyl group; a phenanthrenyl group; a fluorenyl group;

a phenyl group, a naphthyl group, an anthryl group, a pyrenyl group, a phenanthrenyl group, and a fluorenyl group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereto, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

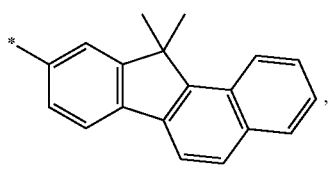 [SMILES: *c1ccc2c(c1)C(C)(C)c1c-2ccc2ccccc12]

but $Ar_{113}$ to $Ar_{116}$ are not limited thereto.

For example, the anthracene-based compound of Formula 400 may be one of Compounds below, but is not limited thereto:

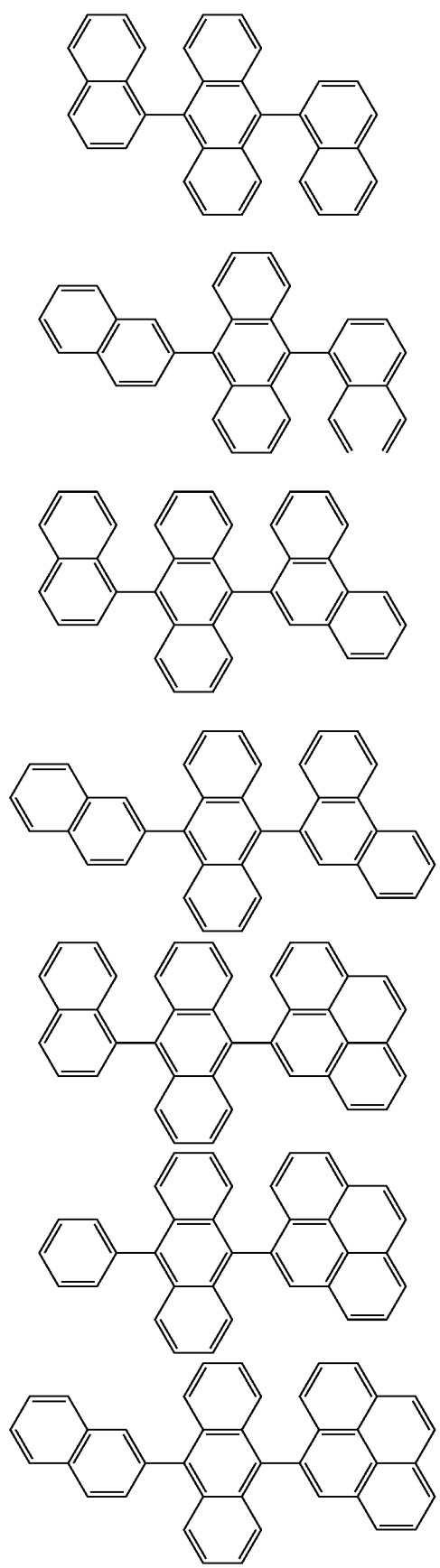
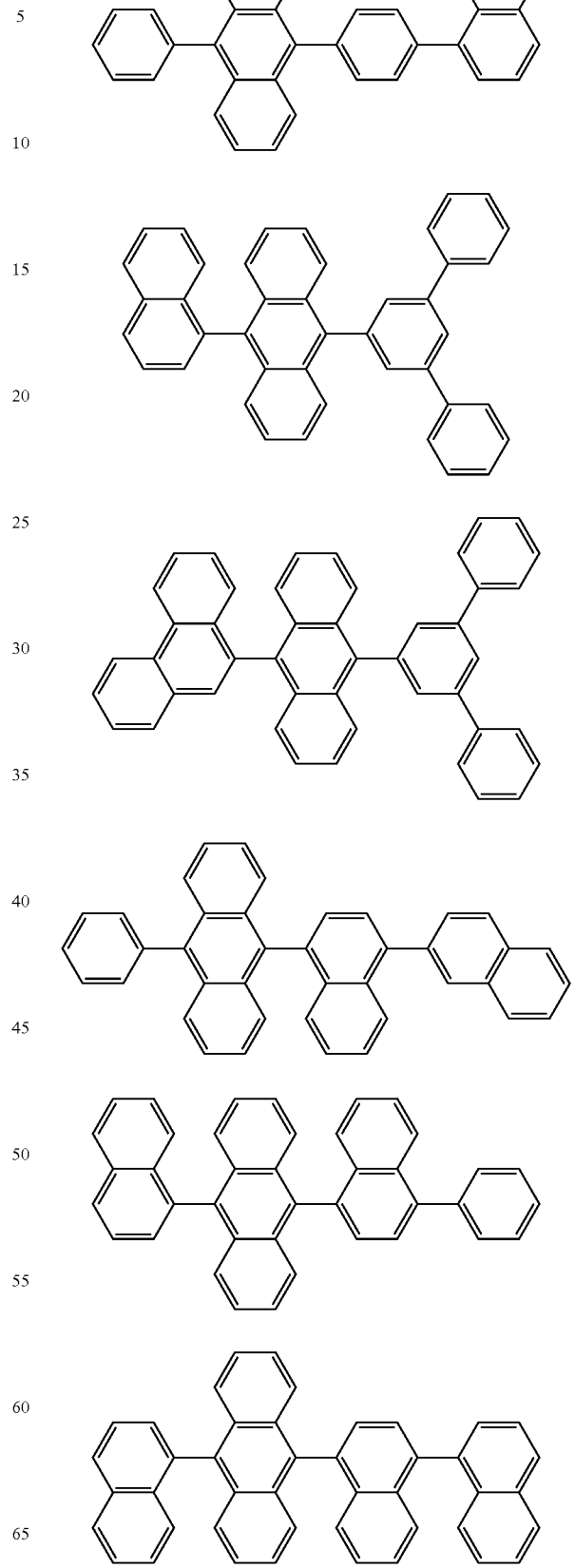

95
-continued
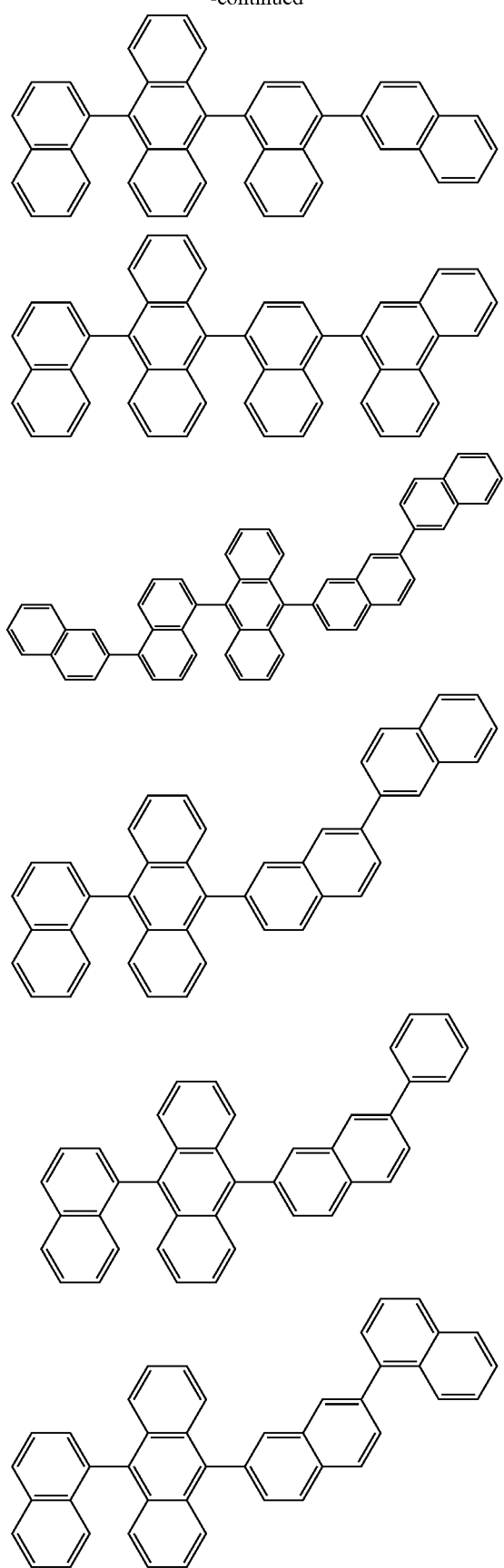
96
-continued
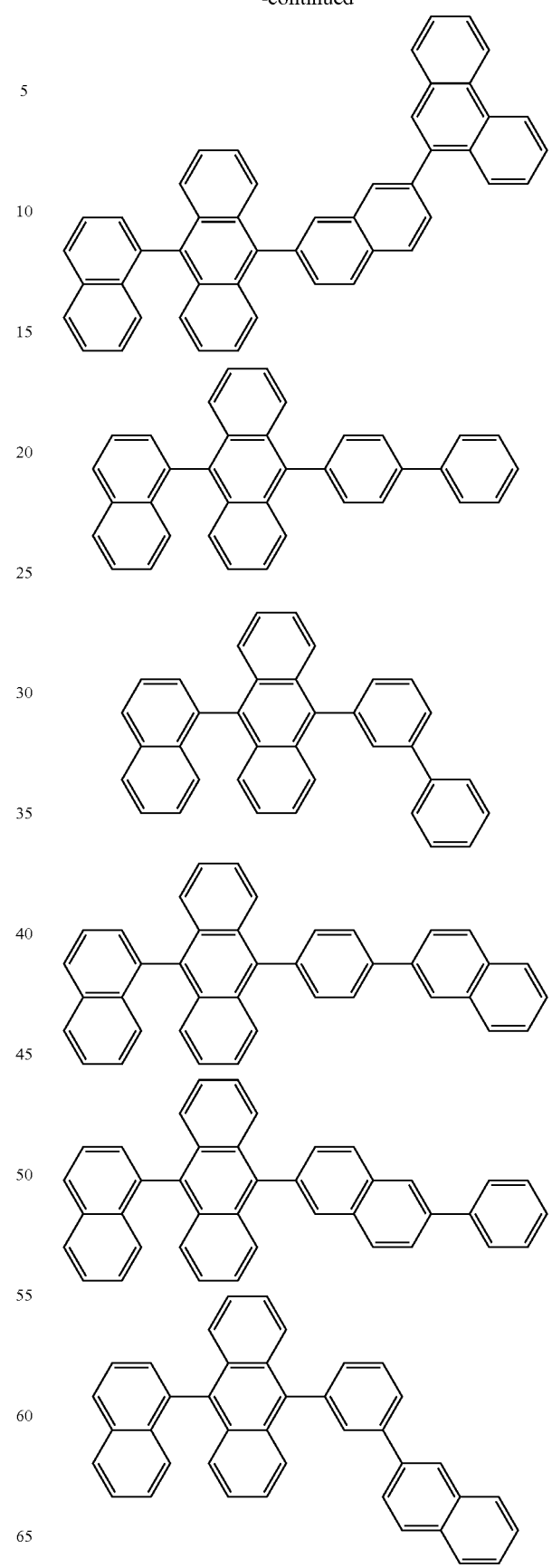

97
-continued
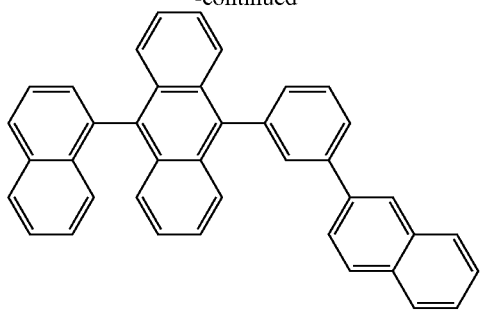
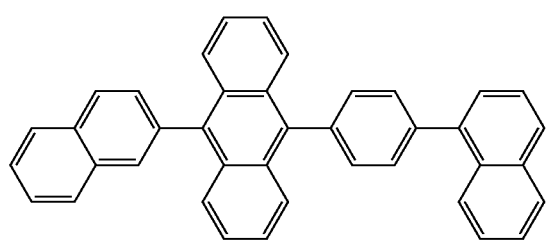
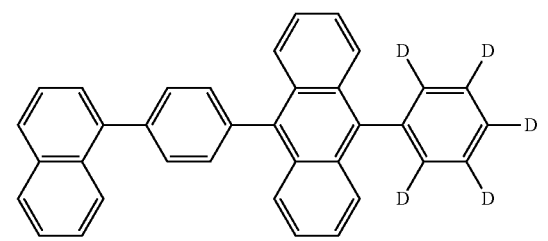
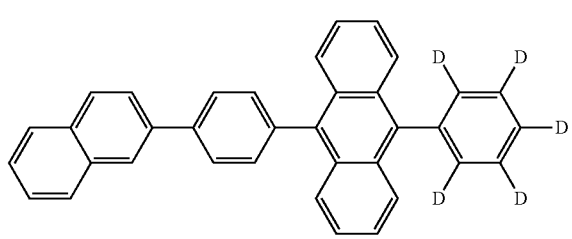
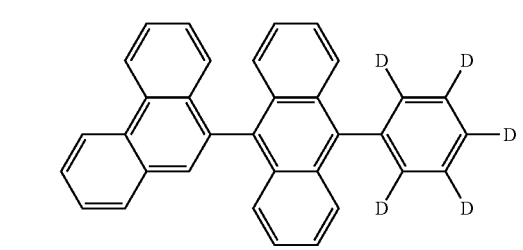
98
-continued
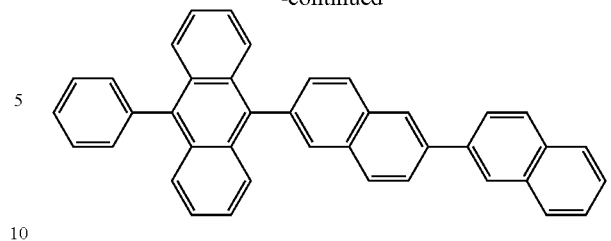
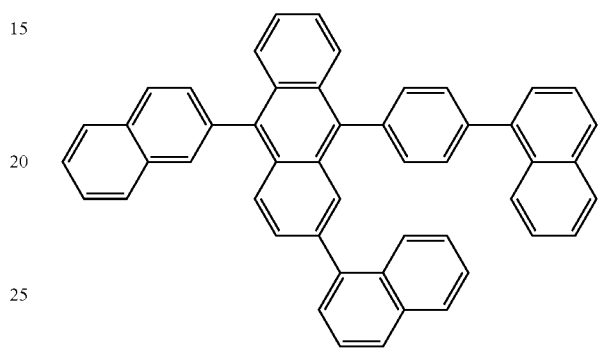
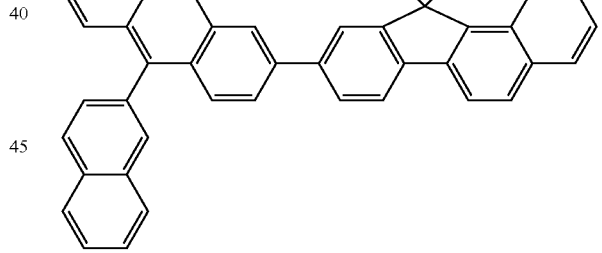
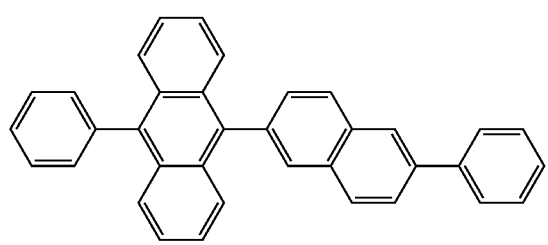

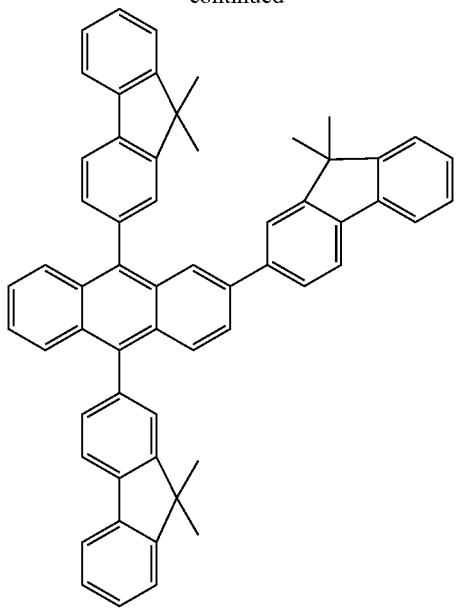

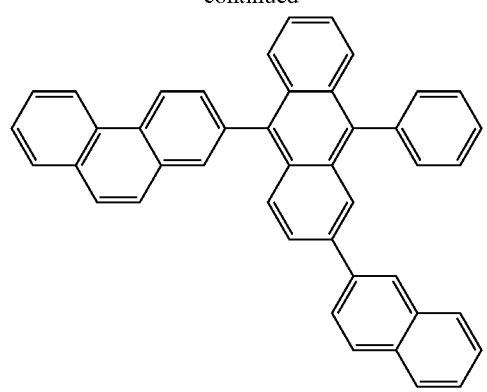

In some embodiments, an anthracene-based compound represented by Formula 401 may be used as the host:

<Formula 401>

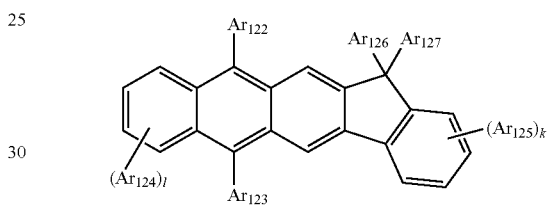

$Ar_{122}$ to $Ar_{125}$ in Formula 401 may be defined as described above with respect to $Ar_{113}$ in Formula 400.

$Ar_{126}$ and $Ar_{127}$ in Formula 401 may be each independently a $C_1$-$C_{10}$ alkyl group (i.e., a methyl group, an ethyl group, a propyl group, and the like).

k and l in Formula 401 may be each independently an integer of 0 to 4. For example, k and l may be 0, 1, or 2.

In some embodiments, the anthracene-based compound of Formula 401 may be one of compounds below, but is not limited thereto:

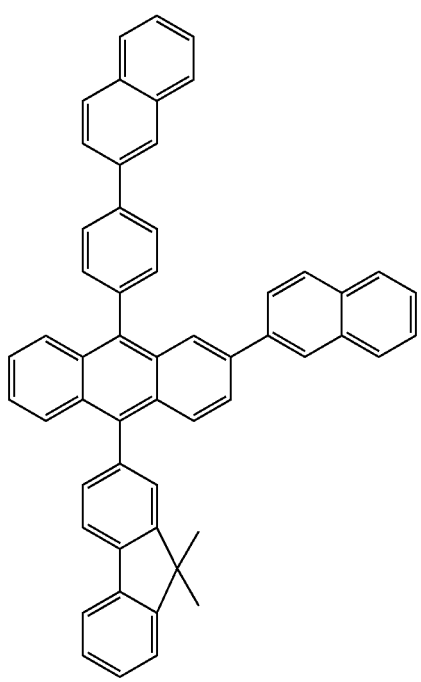

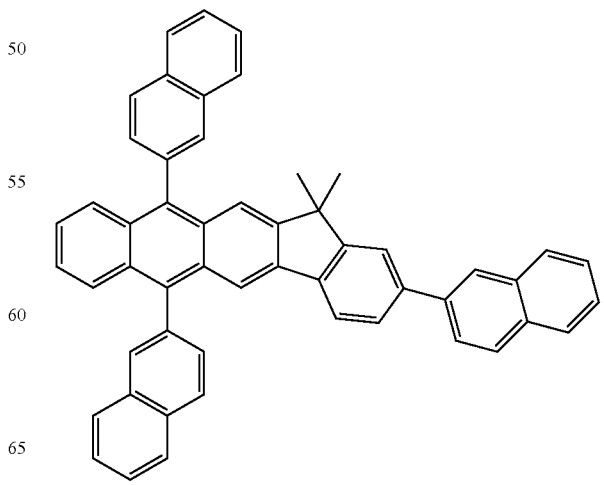

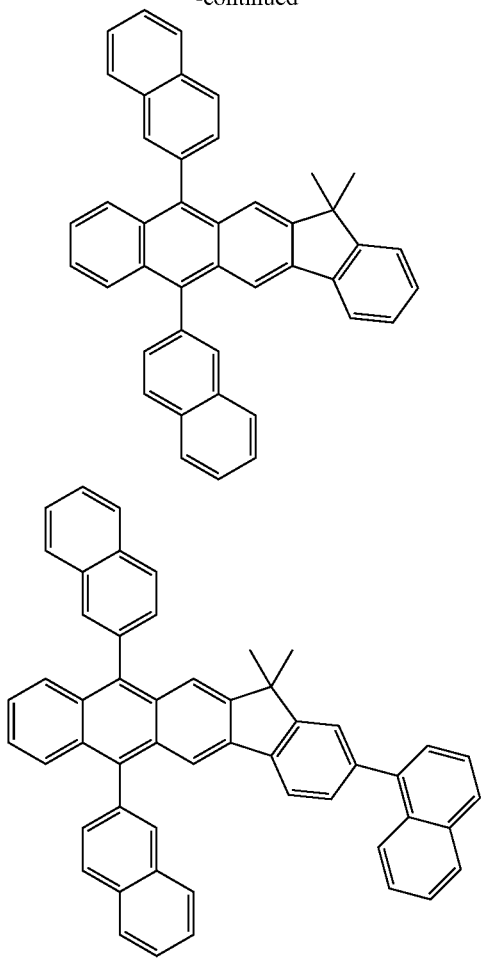
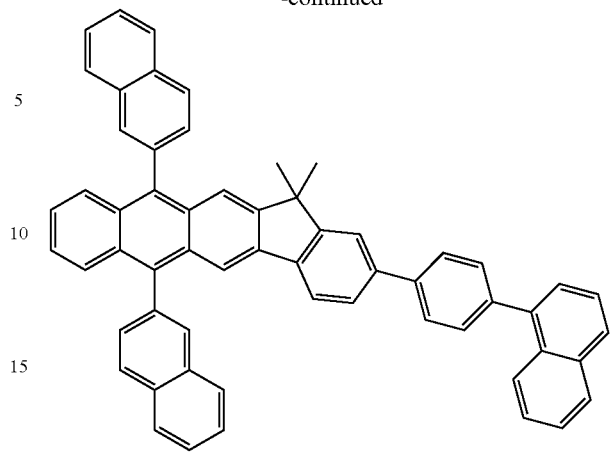

As the dopant described above, any known dopant may be used. The known dopant may be at least one of the fluorescent dopant and the phosphorescent dopant. The phosphorescent dopant may be an organometallic complex including at least one of Ir, Pt, Os, Re, Ti, Zr, Hf, Eu, Tb, and Tm, but the phosphorescent dopant is not limited thereto.

Meanwhile, examples of a known blue dopant are a compound including bis[3,5-difluoro-2-(2-pyridyl)phenyl](picolinato)iridium(III) ($F_2$Irpic), ($F_2$ppy)$_2$Ir(tmd), Ir(dfppz)$_3$, 4,4'-bis(2,2'-diphenylethen-1-yl)biphenyl (DPVBi), 4,4'-Bis[4-(diphenylamino)styryl]biphenyl (BDAVBi), or 2,5,8,11-tetra-tert-butyl perylene (TBPe).

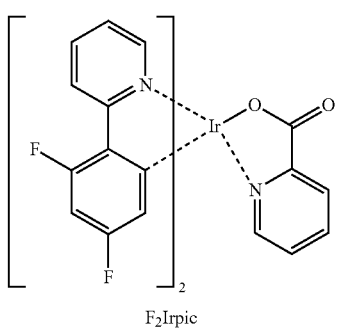
F$_2$Irpic

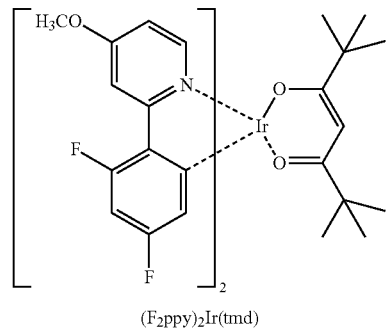
(F$_2$ppy)$_2$Ir(tmd)

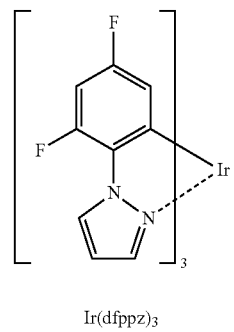
Ir(dfppz)$_3$

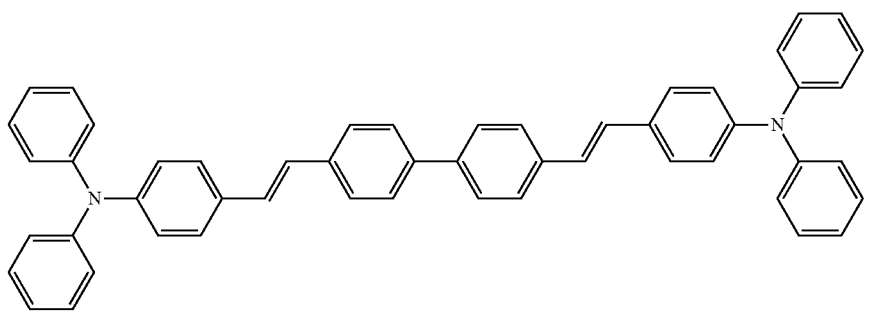
BDAVBi

-continued

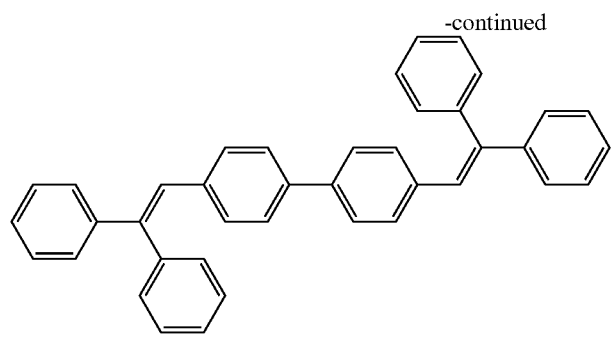

DPABi

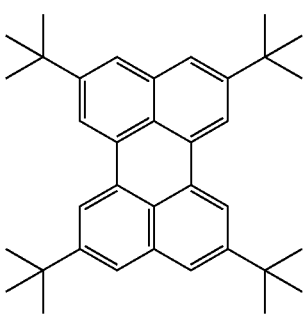

TPBe

Alternatively, Compounds below may be used as the known blue dopant, but the known blue dopant is not limited thereto:

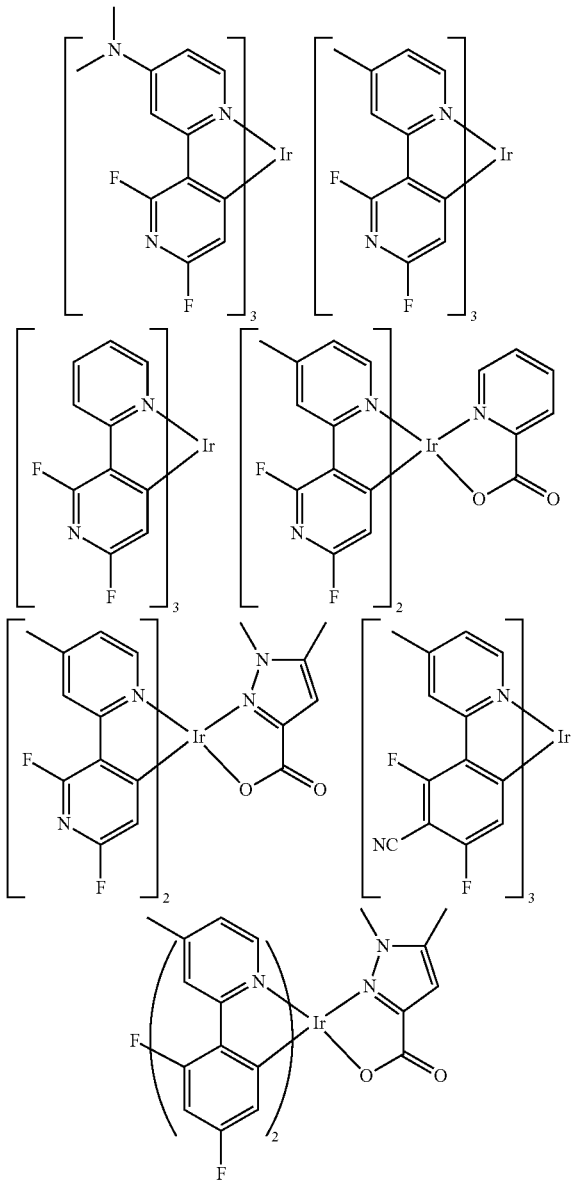

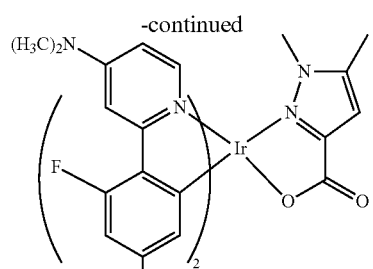

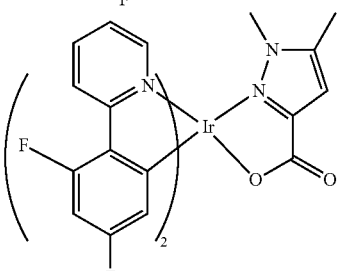

Meanwhile, examples of a known red dopant are compound including Pt(II) octaethylporphine (PtOEP), tris(2-phenylisoquinoline)iridium (Ir(piq)$_3$, or bis(2-(2'-benzothienyl)-pyridinato-N,C3')iridium(acetylacetonate) (Btp$_2$Ir(acac)), 4-(Dicyanomethylene)-2-methyl-6-[p-(dimethylamino)styryl]-4H-pyran (DCM), or 4-(Dicyanomethylene)-2-tert-butyl-6-(1,1,7,7,-tetramethyl-julolidyl-9-enyl)-4H-pyran (DCJTB), but the known red dopant is not limited thereto:

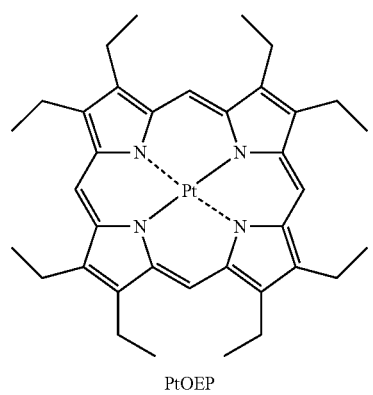

PtOEP

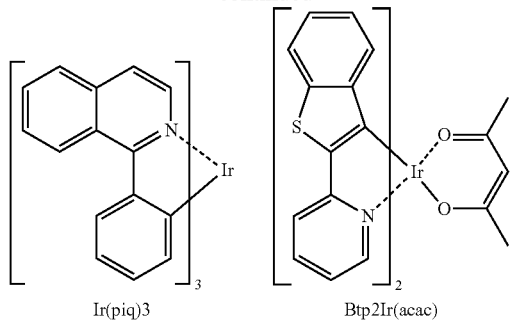

Ir(piq)3    Btp2Ir(acac)

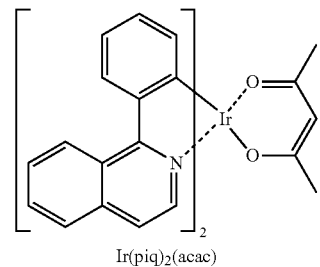

Ir(piq)₂(acac)

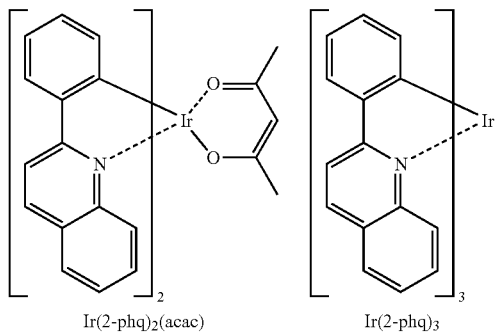

Ir(2-phq)₂(acac)    Ir(2-phq)₃

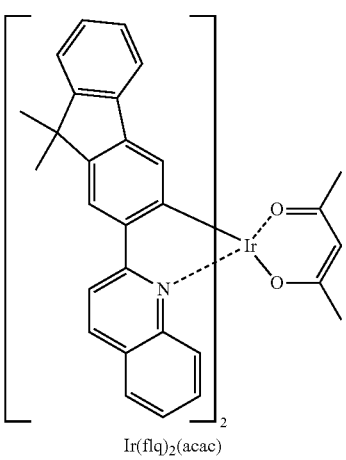

Ir(flq)₂(acac)

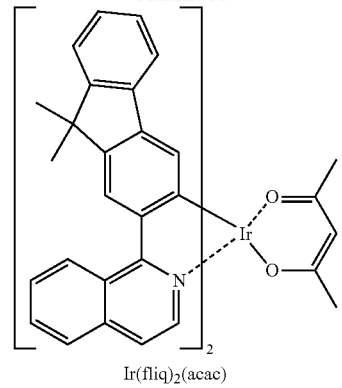

Ir(fliq)₂(acac)

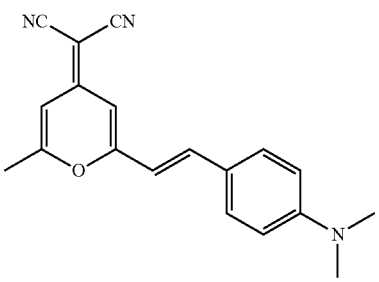

DCM

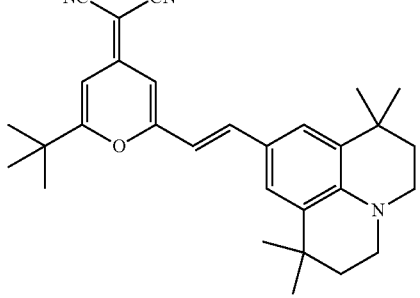

DCJTB

Alternatively, examples of a known green dopant are a compound including tris(2-phenylpyridine) iridium (Ir(ppy)₃), bis(2-phenylpyridine)(acetylacetonato)iridium(III) (Ir(ppy)₂(acac)), and tris(2-(4-tolyl)phenylpiridine)iridium (Ir(mppy)₃), 10-(2-benzothiazolyl)-1,1,7,7-tetramethyl-2,3,6,7-tetrahydro-1H,5H,11H-[1]benzopyrano[6,7,8-ij]-quinolizin-11-one (C545T), but the known green dopant is not limited thereto.

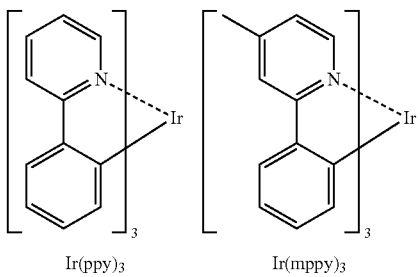

Ir(ppy)₃    Ir(mppy)₃

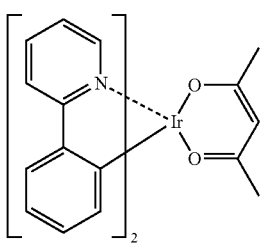
Ir(ppy)₂(acac)
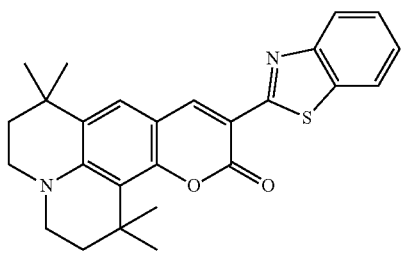
C545T
Examples of the dopant included in the EML may be Pt-complexes represented by one of Formulas below, but are not limited thereto:
D1
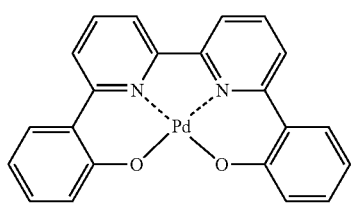
D2
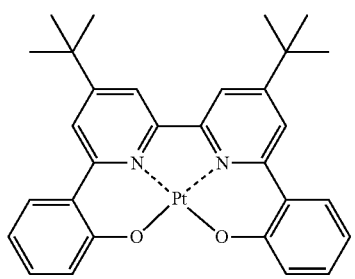
D3
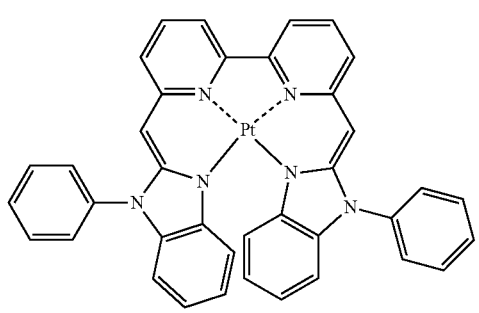
D4
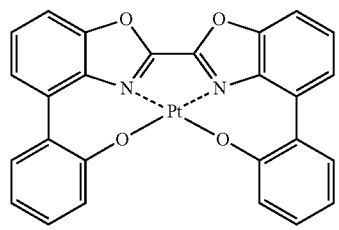
D5
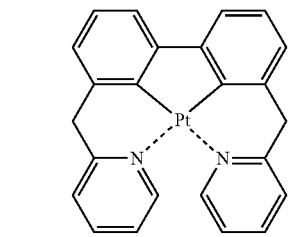
D6
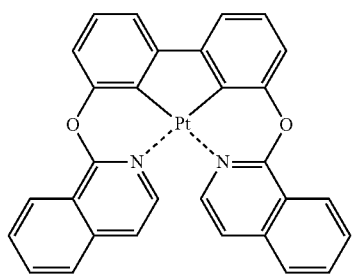
D7
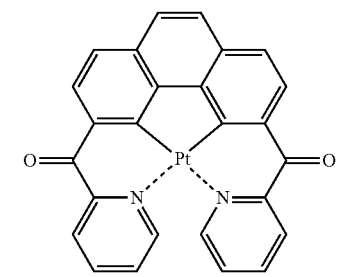
D8
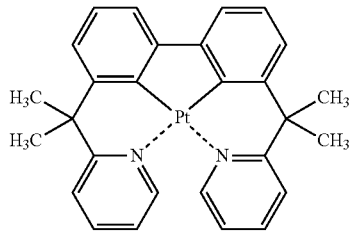
D9
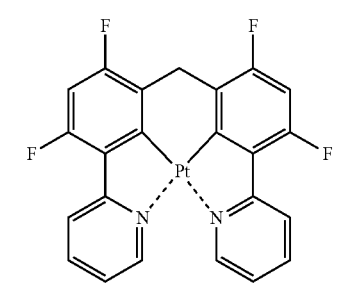

-continued
D10
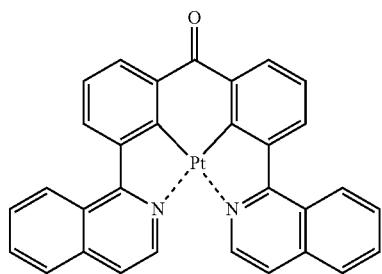
D11
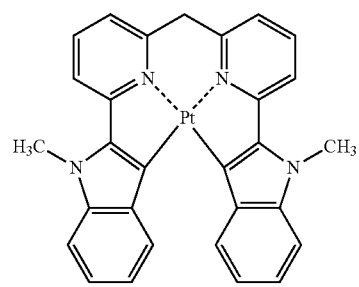
D12
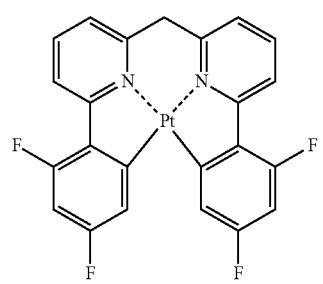
D13
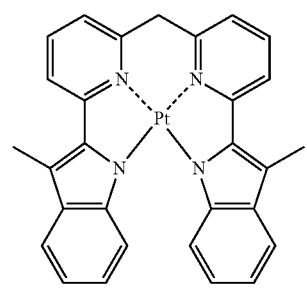
D14
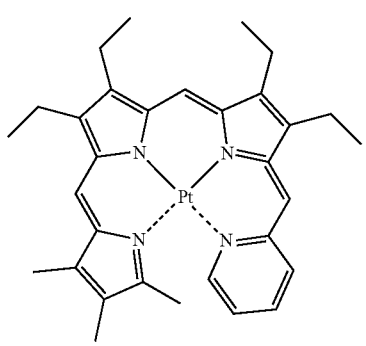
-continued
D15
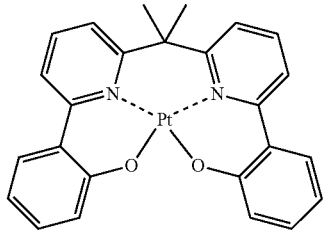
D16
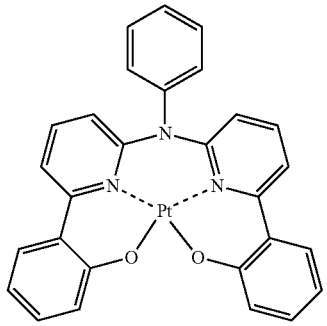
D17
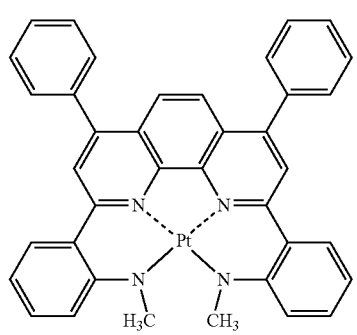
D18
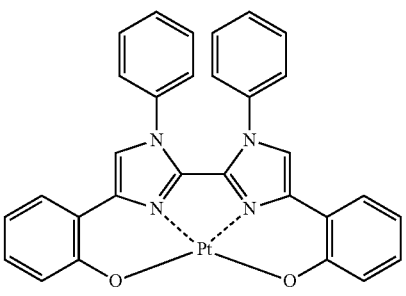
D19
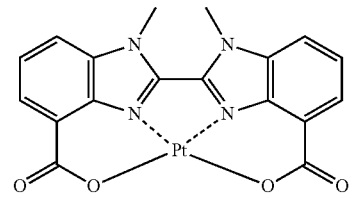
D20
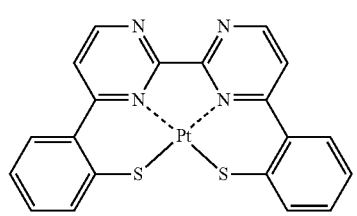

-continued
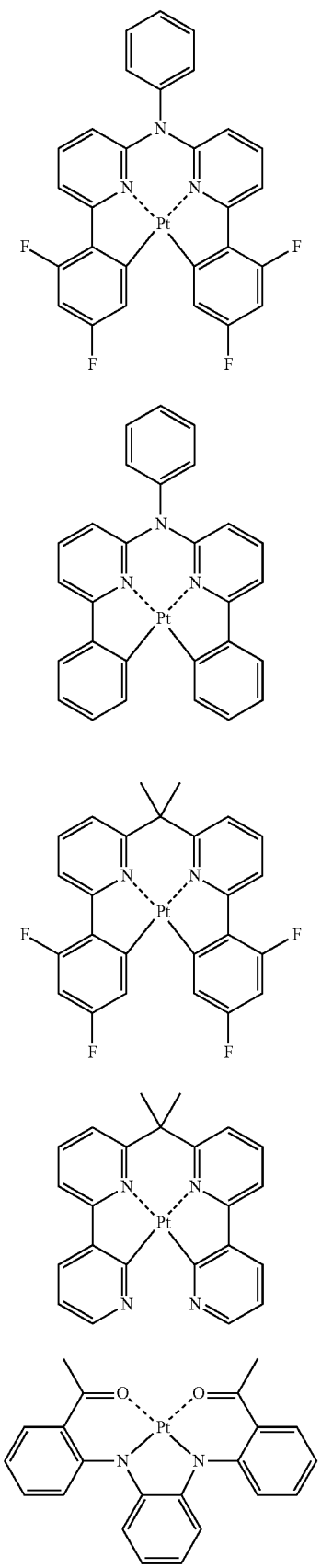
D21
D22
D23
D24
D25
-continued
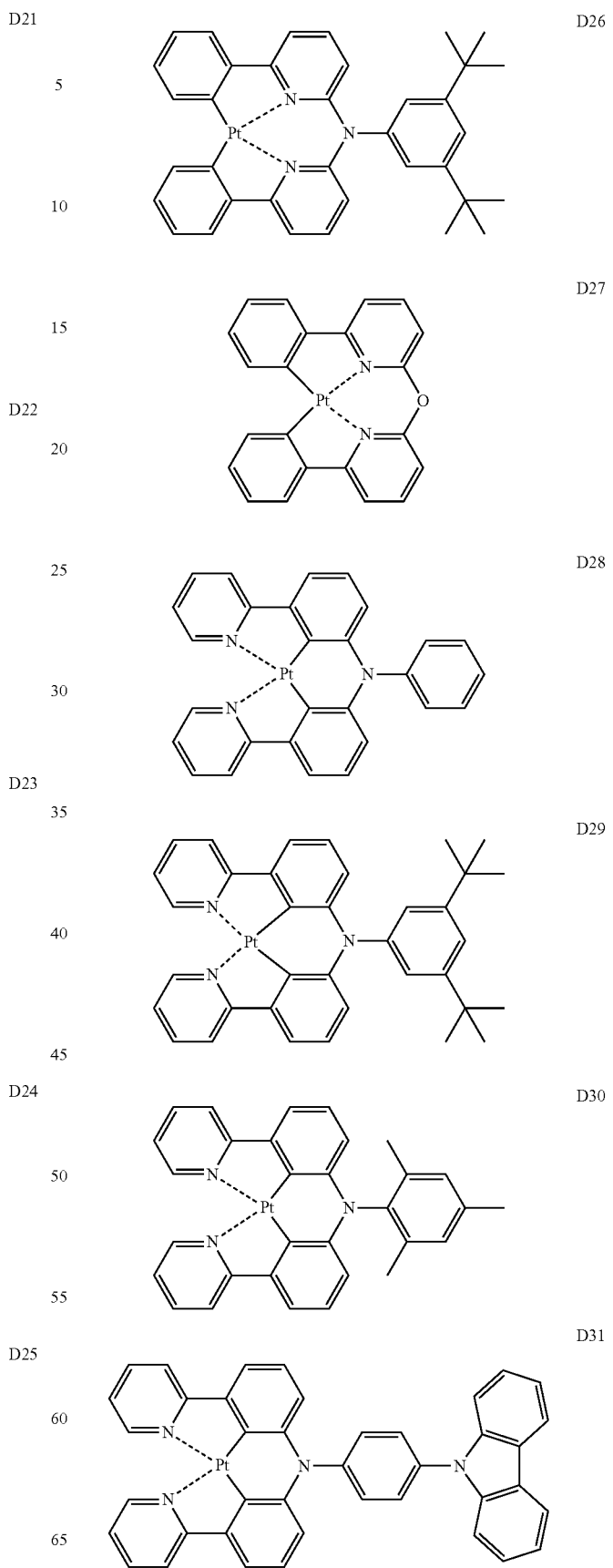
D26
D27
D28
D29
D30
D31

D32
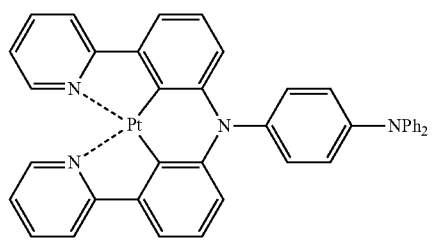
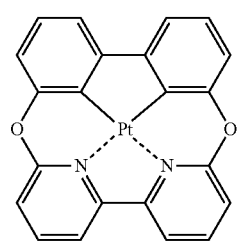
D33
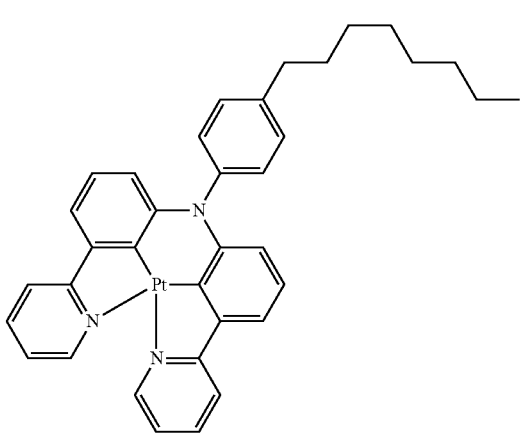
D34
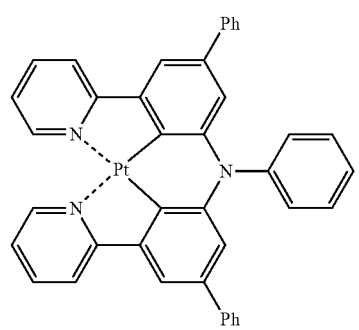
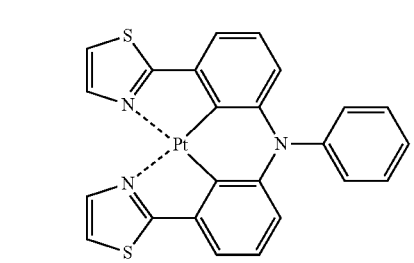
D37
D38
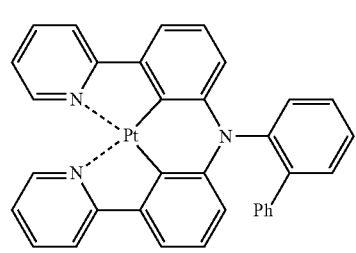
D39
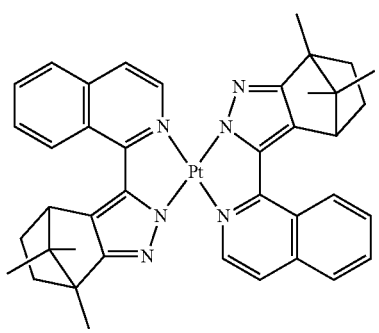
D35
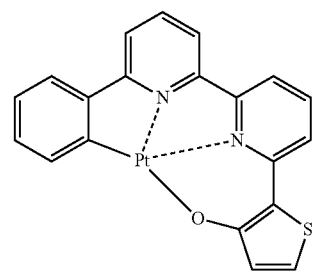
D40
D36
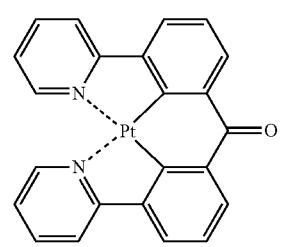
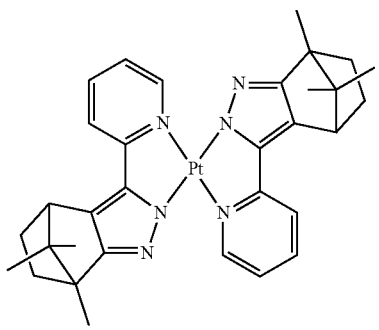
D41

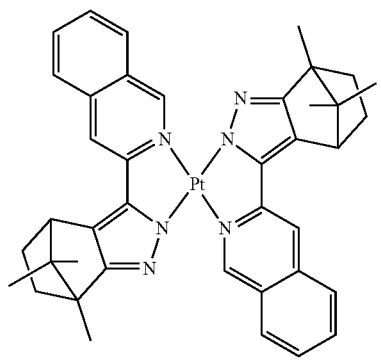
D42
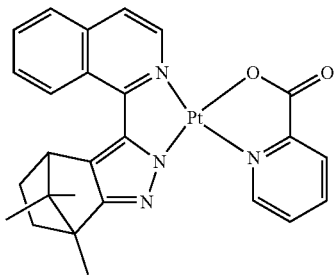
D47
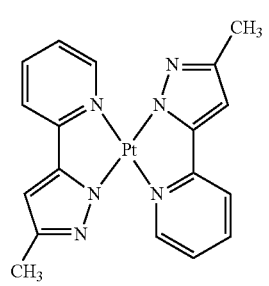
D43
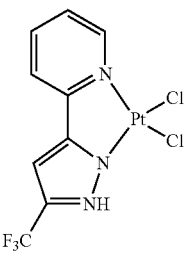
D48
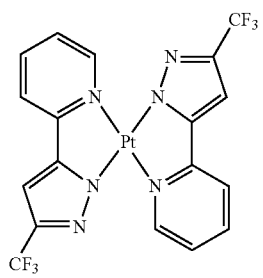
D44
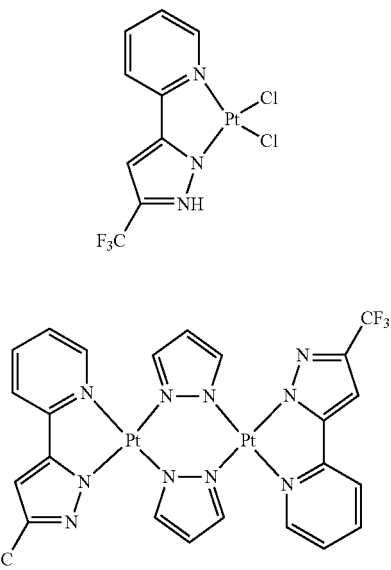
D49
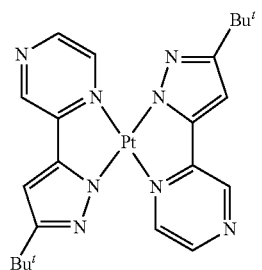
D45
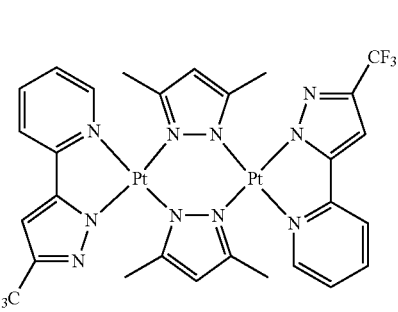
D50
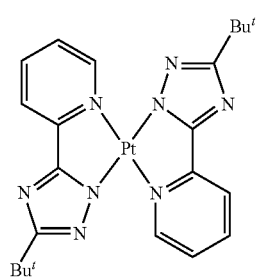
D46
Examples of the dopant included in the EML may be Os-complexes represented by one of Formulas below, but are not limited thereto:
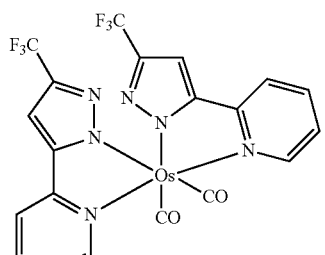
Os(fppz)₂(CO)₂

-continued

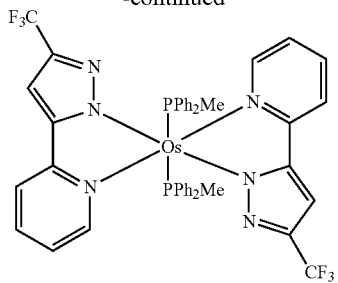

Os(fppz)₂(PPh₂Me)₂

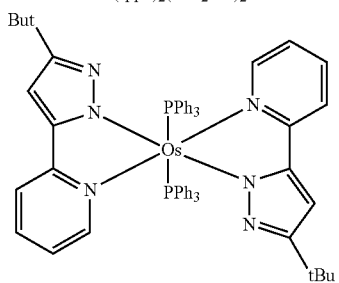

Os(bppz)₂(PPh₃)₂

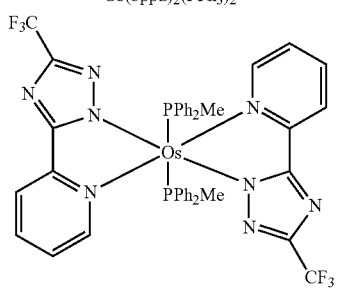

Os(fptz)₂(PPh₂Me)₂

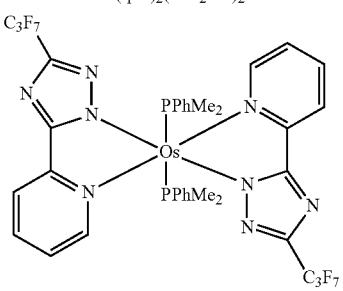

Os(hptz)₂(PPh₂Me)₂

When the EML includes the host and the dopant, an amount of the dopant may be in a range of about 0.01 to about 15 parts by weight based on 100 parts by weight of the host, but the amount is not limited thereto.

A thickness of the EML may be in a range of about 100 Å to about 1,000 Å, for example, about 200 Å to about 600 Å. When the thickness of the EML is within these ranges, the EML may have good light-emitting ability without a substantial increase in a driving voltage.

In addition, to prevent diffusion of triplet excitons or holes toward the ETL, the hole blocking layer (HBL) is formed by using various methods, such as vacuum deposition, spin coating, casting, and LB deposition, between the HTL and the EML. When the HBL is formed by vacuum deposition or spin coating, the conditions for deposition and coating may be similar to those for the formation of the HIL, although the conditions for deposition and coating may vary depending on a compound that is used to form the HBL. Examples of a material of the HBL are oxadiazole derivatives, triazole derivatives, or phenanthroline derivatives, and the like. In particular, BCP below may be used as the material of the HBL.

A thickness of the HBL may be in a range of about 20 Å to about 1,000 Å, and in some embodiments, may be in a range of about 30 Å to about 300 Å. When the thickness of the HBL is within the above ranges, the HBL may have improved hole blocking ability without a substantial increase in a driving voltage.

Next, the ETL may be formed by using various methods, such as vacuum deposition, spin coating, or casting, Langmuir LB deposition. When the ETL is formed by using vacuum deposition or spin coating, the deposition and coating conditions may be similar to those used to form the HIL, although the deposition and coating conditions may vary depending on a compound that is used to form the ETL. A material of the ETL may function to stabilize transport of electrons that are injected from the cathode, and examples thereof are the condensed cyclic compound of Formula 1 and any known material of the ETL.

Examples of the known material of the ETL are quinoline derivatives, and more particularly, Alq₃, 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), BAlq (see the following formula below), beryllium bis(benzoquinolin-10-olate) (Bebq₂), 9,10-di(naphthalene-2-yl)anthrascene (AND), and Compounds 501 and 502, but are not limited thereto:

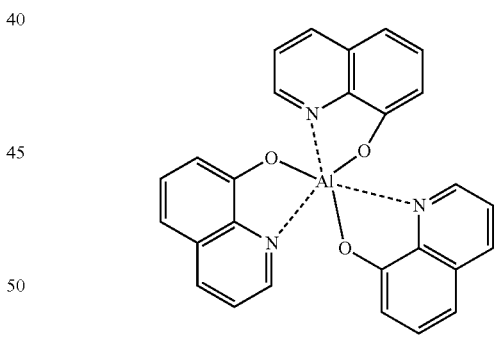

Alq3

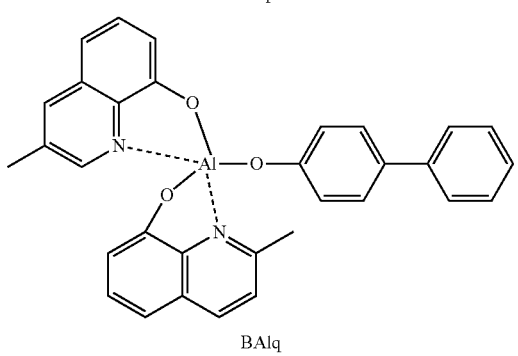

BAlq

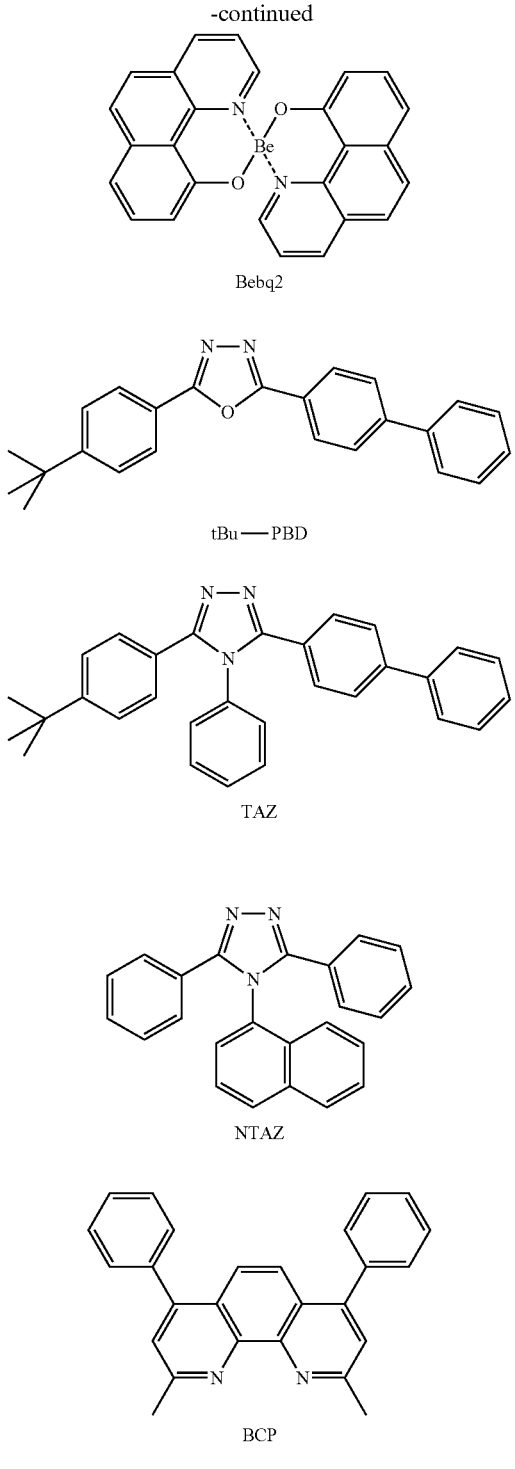

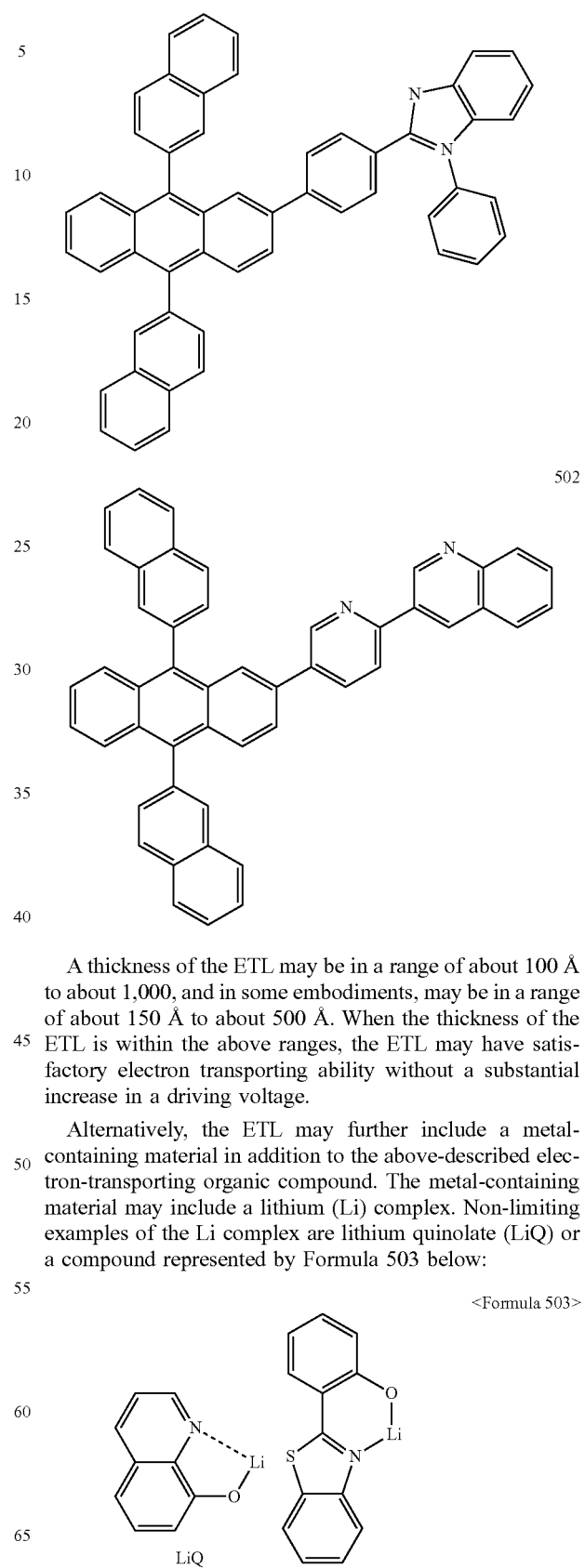

A thickness of the ETL may be in a range of about 100 Å to about 1,000, and in some embodiments, may be in a range of about 150 Å to about 500 Å. When the thickness of the ETL is within the above ranges, the ETL may have satisfactory electron transporting ability without a substantial increase in a driving voltage.

Alternatively, the ETL may further include a metal-containing material in addition to the above-described electron-transporting organic compound. The metal-containing material may include a lithium (Li) complex. Non-limiting examples of the Li complex are lithium quinolate (LiQ) or a compound represented by Formula 503 below:

In addition, the EIL, which facilitates injection of electrons from the cathode, may be formed on top of the ETL. Any suitable material of the EIL may be used to form the EIL.

Examples of the material of the EIL are LiF, NaCl, CsF, $Li_2O$, and BaO, which are known in the art. The deposition conditions may be similar to those used to form the HIL, although the deposition condition may vary depending on the material of the EIL.

A thickness of the EIL may be in a range of about 1 Å to about 100 Å, and in some embodiments, may be in a range of about 3 Å to about 90 Å. When the thickness of the ETL is within the above ranges, the ETL may have satisfactory electron transporting ability without a substantial increase in a driving voltage.

A second electrode 17 is disposed on top of the organic layer 15. The second electrode 17 may be the cathode, which is an electrode injecting electrode. Here, the material of the second electrode 17 may be a metal, an alloy, an electroconductive compound that have a low work function, and a mixture thereof. Examples of the material of the second electrode 17 are lithium (Li), magnesium (Mg), aluminum (Al), aluminum-lithium (Al—Li), calcium (Ca), magnesium-indium (Mg—In), magnesium-silver (Mg—Ag), and the like, and the material of the second electrode 17 may be formed as a thin film type transmission electrode. In some embodiments, to manufacture a top-emission light-emitting diode, the transmission electrode may be formed of indium tin oxide (ITO) or indium zinc oxide (IZO).

Hereinafter, the present invention will be described in detail with reference to the following synthesis examples and other examples. However, these examples are for illustrative purposes only and are not intended to limit the scope of the present invention.

SYNTHESIS EXAMPLE

Synthesis Example 1: Synthesis of Compound 7

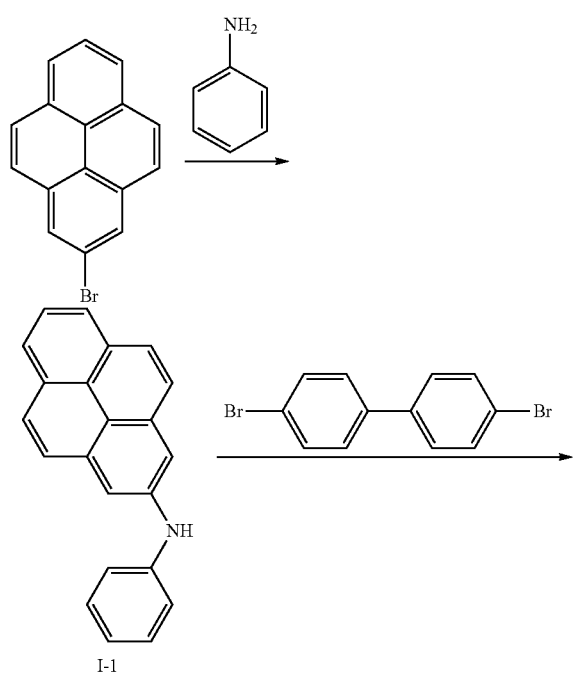

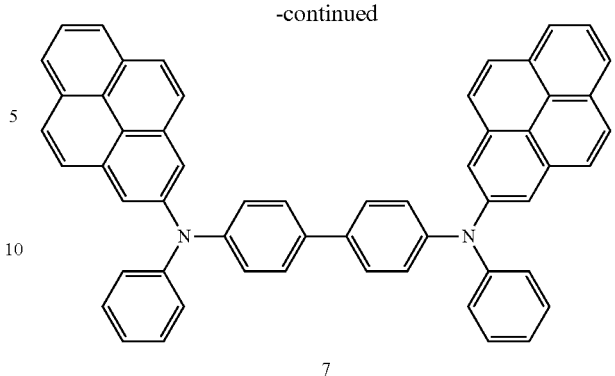

7

1) Synthesis of Intermediate I-1

1.41 g (5 mmol) of 2-bromopyrene (which is synthesized according to a known method in the reference literature of Chemistry-A European Journal 2012, 18, 5022-5035), 0.93 g (10 mmol) of aniline, 0.09 g (0.1 mmol) of $Pd_2(dba)_3$, 0.02 g (0.1 mmol) of $PtBu_3$, and 0.56 g (5.0 mmol) of KOtBu were dissolved in 50 mL of toluene, and then stirred at a temperature of 85° C. for 2 hours. The reaction solution was cooled to room temperature, and extracted three times with 50 mL of water and 50 mL of diethyl ether. An organic layer obtained therefrom was dried with magnesium sulfate, and a solvent was evaporated. The resulting residues were separated and purified using a silica gel tube column chromatography to obtain 1.25 g (Yield: 85%) of Intermediate I-1. The obtained compound was identified by LC-MS (C22H15N $M^+$: 293.0).

2) Synthesis of Compound 7

2.93 g (10 mmol) of Intermediate I-1, 1.56 g (5 mmol) of 4,4'-dibromo-biphenyl, 0.09 g (0.1 mmol) of $Pd_2(dba)_3$, 0.02 g (0.1 mmol) of $PtBu_3$, and 1.12 g (10.0 mmol) of KOtBu were dissolved in 50 mL of toluene, and then stirred at a temperature of 85° C. for 2 hours. The reaction solution was cooled to room temperature, and extracted three times with 50 mL of water and 50 mL of diethyl ether. An organic layer obtained therefrom was dried with magnesium sulfate, and a solvent was evaporated. The resulting residues were separated and purified using silica gel tube column chromatography to obtain 2.95 g (Yield 80%) of Compound 7. The obtained compound was identified by MS/FAB and $^1H$ NMR (C56H36N2: calculated 736.29, found 737.29).

$^1H$ NMR (400 MHz, $CDCl_3$) δ 8.30-8.28 (ss, 4H), 8.16-8.12 (m, 6H), 7.88-7.86 (ss, 4H), 7.76 (s, 4H), 7.72-7.68 (m, 4H), 7.55-7.50 (m, 4H), 7.44-7.40 (m, 2H), 7.36-7.32 (m, 4H), 7.20-7.16 (m, 4H)

Synthesis Example 2: Synthesis of Compound 8

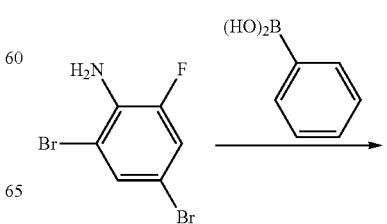

-continued

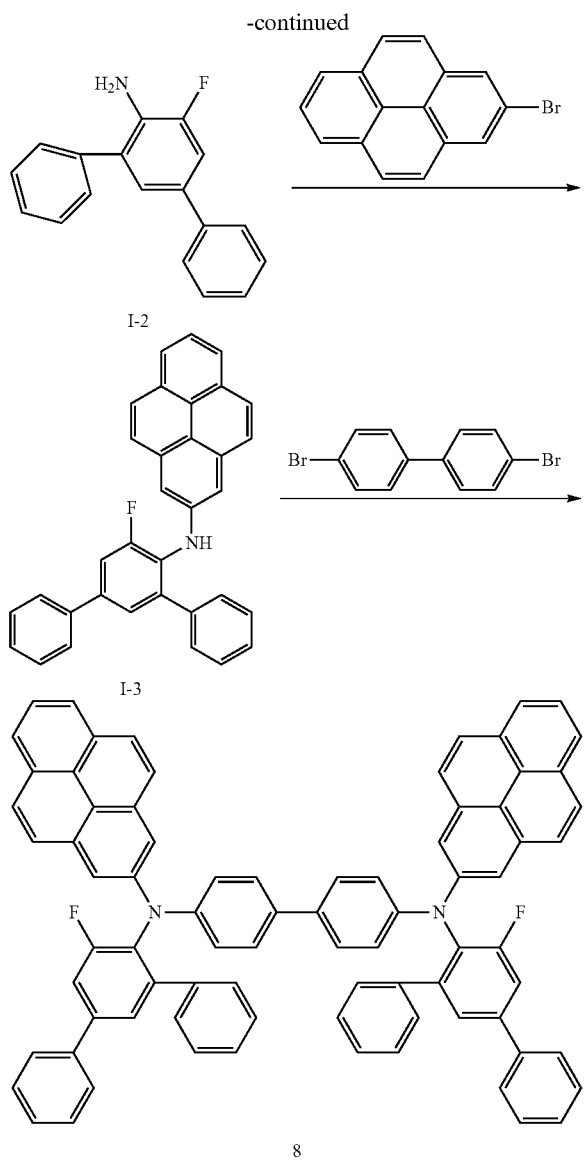

Synthesis of Intermediate I-2

2.69 g (10.0 mmol) of 2,4-dibromo-6-fluoro-phenylamine, 2.68 g (22.0 mmol) of phenylboronic acid, 0.58 g (0.5 mmol) of Pd(PPh$_3$)$_4$ (Tetrakis(triphenylphosphine)palladium(0)), and 6.21 g (45.0 mmol) of K$_2$CO$_3$ were dissolved in 40 mL of a mixture of tetrahydrofuran (THF) and H$_2$O at a ratio of 2/1, and then stirred at a temperature of 80° C. for 5 hours. The reaction solution was cooled to room temperature, and extracted three times with 40 mL of water and 40 mL of diethyl ether. An organic layer obtained therefrom was dried with magnesium sulfate, and a solvent was evaporated. The resulting residues were separated and purified using silica gel tube column chromatography to obtain 2.26 g (Yield: 86%) of Intermediate I-2. The obtained compound was identified by LC-MS (C18H14FN M$^+$ 263.0).

Synthesis of Intermediate I-3

3.94 g (Yield: 85%) of Intermediate I-3 was synthesized in the same manner as used to synthesize Intermediate I-1, except that Intermediate I-2 was used instead of aniline. The obtained compound was identified by LC-MS (C34H22FN M$^+$ 463.0).

Synthesis of Compound 8

4.26 g (Yield: 79%) of Compound 8 was synthesized in the same manner as used to synthesize Compound 7, except that Intermediate I-3 instead of Intermediate I-1 and 4,4'-dibromo-biphenyl were used (C80H50F2N2: calculated 1076.39, found 1077.39).

$^1$H NMR (400 MHz, CDCl$_3$) δ 8.30-8.28 (ss, 4H), 8.16-8.12 (m, 6H), 7.92-7.90 (m, 4H), 7.85 (s, 2H), 7.83-7.80 (m, 8H), 7.76-7.70 (m, 14H), 7.62-7.58 (m, 6H), 7.40-7.38 (m, 2H), 7.24-7.20 (m, 4H)

Synthesis Example 3: Synthesis of Compound 43

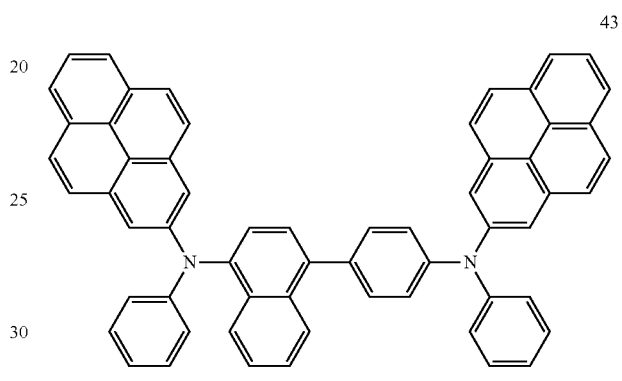

3.15 g (Yield: 80%) of Compound 43 was synthesized in the same manner as used to synthesize Compound 7, except that Intermediate I-1 and 1-bromo-4-(4-bromophenyl)-naphthalene instead of 4,4'-dibromo-biphenyl was used. The obtained compound was identified by MS/FAB and $^1$H NMR(C60H38N2: calculated 786.96, found 787.96).

$^1$H NMR (400 MHz, CDCl$_3$) δ 8.30-8.28 (ss, 4H), 8.16-8.12 (m, 6H), 7.90-7.88 (m, 1H), 7.75-7.73 (d, 2H), 7.70-7.68 (d, 2H), 7.60-7.55 (m, 6H), 7.52-7.50 (m, 3H), 7.30-7.26 (m, 4H), 7.20-7.16 (m, 2H), 7.10-7.08 (m, 2H), 7.02-7.00 (m, 2H), 6.92-6.90 (m, 2H), 6.88-6.86 (m, 2H)

Synthesis Example 4: Synthesis of Compound 48

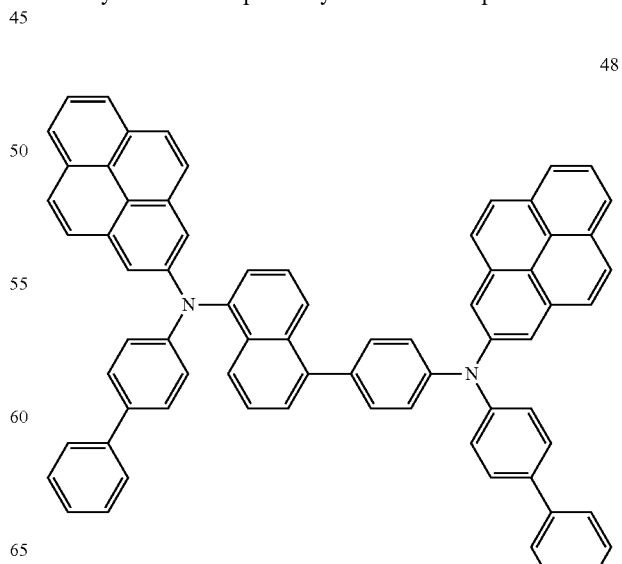

3.76 g (Yield: 80%) of Compound 48 was synthesized in the same manner as used to synthesize Compound 7, except that biphenyl-4-yl-amine was used instead of aniline, and 1-bromo-5-(4-bromophenyl)-naphthalene was used instead of 4,4'-dibromo-biphenyl. The obtained compound was identified by MS/FAB and ¹H NMR (C72H46N2: calculated 938.37, found 939.37).

¹H NMR (400 MHz, CDCl₃) δ 8.30-8.28 (ss, 4H), 8.16-8.12 (m, 6H), 7.90-7.88 (m, 1H), 7.76-7.73 (m, 5H), 7.70 (s, 1H), 7.68 (s, 1H), 7.66 (s, 1H), 7.60-7.42 (m, 20H), 7.22-7.20 (m, 1H), 7.16-7.12 (m, 2H), 7.08-7.04 (m, 4H)

Synthesis Example 5: Synthesis of Compound 56

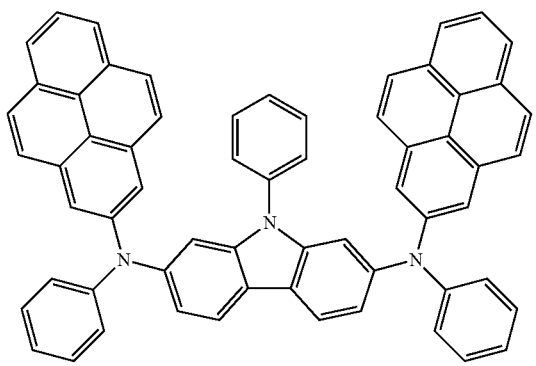

56

3.30 g (Yield: 80%) of Compound 56 was synthesized in the same manner as used to synthesize Compound 7, except that Intermediate I-1 and 2,7-dibromo-9-phenyl-9H-carbazole instead of 4,4'-dibromo-biphenyl 2,7-dibromo-9-phenyl-9H-carbazole was used. The obtained compound was identified by MS/FAB and ¹H NMR (C62H39N3: calculated 825.31, found 826.31).

¹H NMR (400 MHz, CDCl₃) δ 8.30-8.28 (ss, 4H), 8.16-8.12 (m, 6H), 7.95-7.93 (m, 2H), 7.90 (s, 2H) 7.86-7.76 (m, 10H), 7.70-7.60 (m, 1H), 7.54-7.50 (m, 4H), 7.46-7.44 (d, 2H), 7.38-7.28 (m, 4H), 7.18-7.14 (m, 4H)

Synthesis Example 6: Synthesis of Compound 63

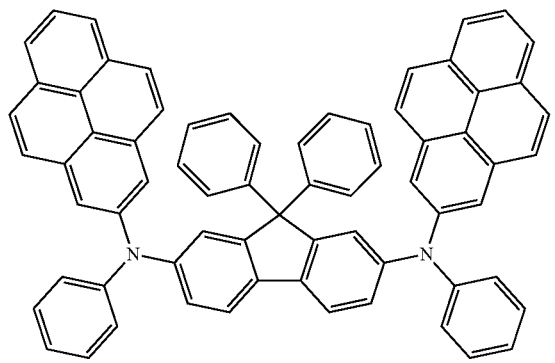

63

3.60 g (Yield: 80%) of Compound 63 was synthesized in the same manner as used to synthesize Compound 7, except that Intermediate I-1 and 2,7-dibromo-9,9-diphenyl-9H-fluoren instead of 4,4'-dibromo-biphenyl was used. The obtained compound was identified by MS/FAB and ¹H NMR (C69H44N2: calculated 900.35, found 901.35).

¹H NMR (400 MHz, CDCl₃) δ 8.30-8.28 (ss, 4H), 8.16-8.12 (m, 6H), 7.88-7.84 (m, 6H), 7.80 (s, 4H) 7.76-7.72 (m, 4H), 7.66-7.58 (m, 10H), 7.44-7.40 (m, 2H), 7.32-7.28 (m, 4H), 7.20-7.16 (m, 4H)

Synthesis Example 7: Synthesis of Compound 67

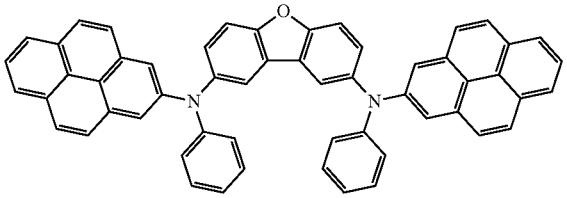

67

3.00 g (Yield: 80%) of Compound 67 was synthesized in the same manner as used to synthesize Compound 7, except that Intermediate I-1 and 2,8-dibromo-dibenzofuran instead of 4,4'-dibromo-biphenyl was used. The obtained compound was identified by MS/FAB and ¹H NMR (C56H34N2O: calculated 750.27, found 751.27).

¹H NMR (400 MHz, CDCl₃) δ 8.30-8.28 (ss, 4H), 8.16-8.12 (m, 6H), 7.95-7.93 (m, 2H), 7.85-7.80 (m, 6H), 7.74 (s, 4H), 7.45-7.40 (m, 4H), 7.32-7.30 (m, 2H), 7.25-7.20 (m, 2H), 7.15-7.10 (m, 4H)

Synthesis Example 8: Synthesis of Compound 15

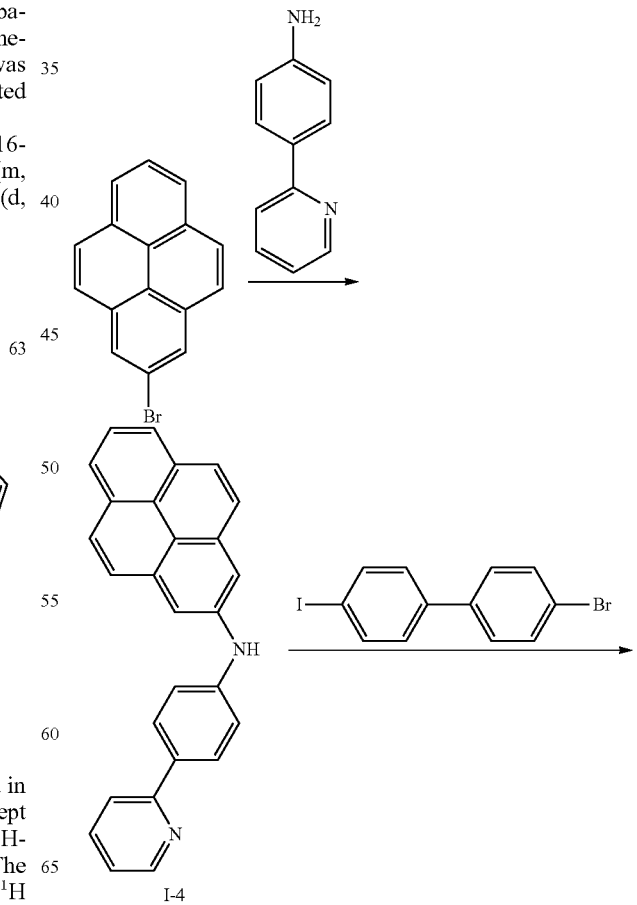

I-4

-continued

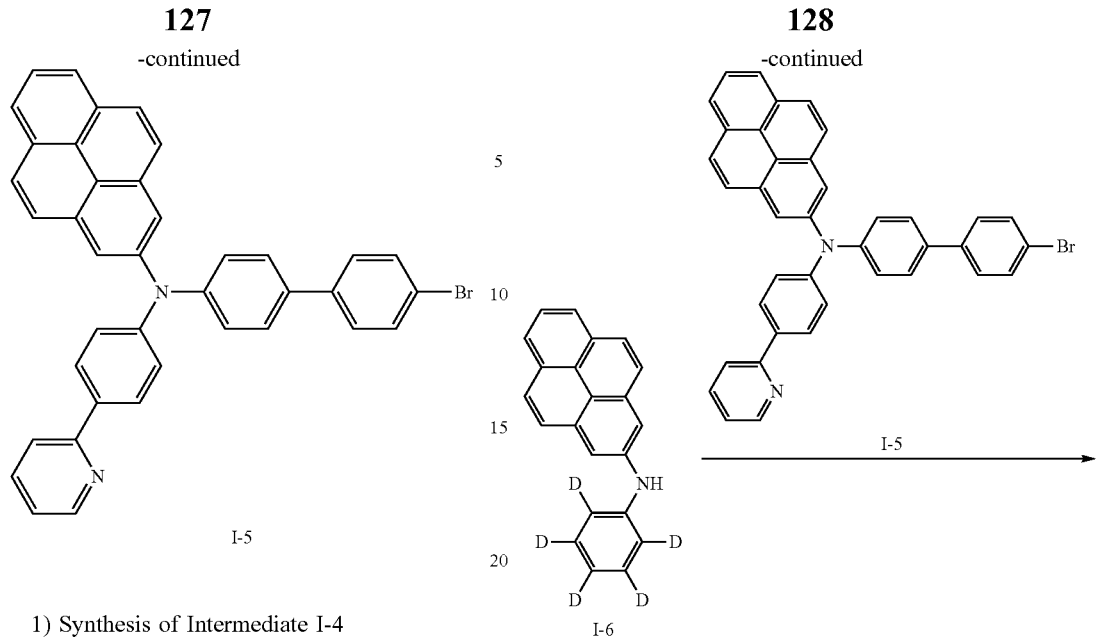

I-5

1) Synthesis of Intermediate I-4

1.41 g (5 mmol) of 2-bromopyrene, 1.70 g (10 mmol) of 4-pyridine-2-yl-phenylamine, 0.09 g (0.1 mmol) of $Pd_2(dba)_3$, 0.02 g (0.1 mmol) of $PtBu_3$, and 0.56 g (5.0 mmol) of KOtBu were dissolved in 50 mL of toluene, and then stirred at a temperature of 85° C. for 2 hours. The reaction solution was cooled to room temperature, and extracted three times with 50 mL of water and 50 mL of diethyl ether. An organic layer obtained therefrom was dried with magnesium sulfate, and a solvent was evaporated. The resulting residues were separated and purified using silica gel tube column chromatography to obtain 1.55 g (Yield: 84%) of Intermediate I-4. The obtained compound was identified by LC-MS ($C_{27}H_{18}N_2$ $M^+$: 370.0).

2) Synthesis of Intermediate I-5

1.85 g (5 mmol) of Intermediate I-4, 1.80 g (5 mmol) of 4-bromo-4'-iodo-biphenyl, 0.09 g (0.1 mmol) of $Pd_2(dba)_3$, 0.02 g (0.1 mmol) of $PtBu_3$, and 0.56 g (5.0 mmol) of KOtBu were dissolved in 50 mL of toluene, and then stirred at a temperature of 85° C. for 2 hours. The reaction solution was cooled to room temperature, and extracted three times with 50 mL of water and 50 mL of diethyl ether. An organic layer obtained therefrom was dried with magnesium sulfate, and a solvent was evaporated. The resulting residues were separated and purified using silica gel tube column chromatography to obtain 2.56 g (Yield: 85%) of Intermediate I-5.

The obtained compound was identified by LC-MS ($C_{39}H_{25}BrN_2$ $M^+$ 600.0).

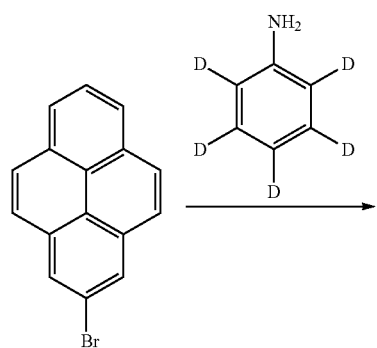

-continued

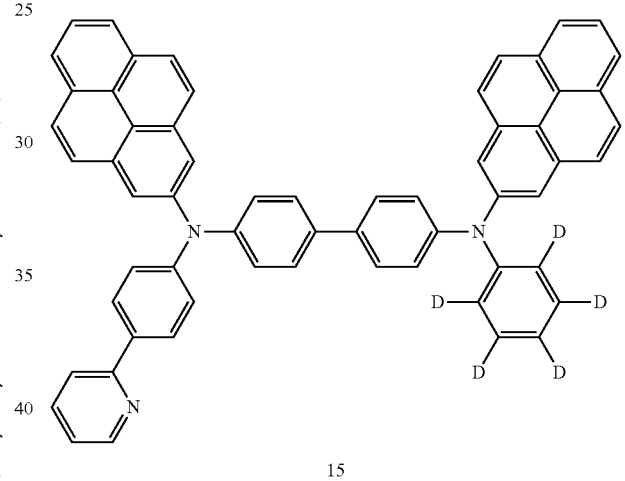

I-6

3) Synthesis of Intermediate I-6

1.41 g (5 mmol) of 2-bromopyrene, 0.98 g (10 mmol) of aniline-2,3,4,5,6-$d_5$, 0.09 g (0.1 mmol) of $Pd_2(dba)_3$, 0.02 g (0.1 mmol) of $PtBu_3$, and 0.56 g (5.0 mmol) of KOtBu were dissolved in 50 mL of toluene, and then stirred at a temperature of 85° C. for 2 hours. The reaction solution was cooled to room temperature, and extracted three times with 50 mL of water and 50 mL of diethyl ether. An organic layer obtained therefrom was dried with magnesium sulfate, and a solvent was evaporated. The resulting residues were separated and purified using silica gel tube column chromatography to obtain 1.25 g (Yield: 84%) of Intermediate I-6. The obtained compound was identified by LC-MS ($C_{22}H_{10}D_5N$ $M^+$ 298.0).

4) Synthesis of Compound 15

3.00 g (5 mmol) of Intermediate I-5, 1.49 g (5 mmol) of Intermediate I-6, 0.09 g (0.1 mmol) of $Pd_2(dba)_3$, 0.02 g (0.1 mmol) of $PtBu_3$, and 0.56 g (5.0 mmol) of KOtBu were dissolved in 50 mL of toluene, and then stirred at a temperature of 85° C. for 2 hours. The reaction solution was cooled to room temperature, and extracted three times with 50 mL of water and 50 mL of diethyl ether. An organic layer obtained therefrom was dried with magnesium sulfate, and a solvent was evaporated. The resulting residues were separated and purified using silica gel tube column chromatography to obtain 3.28 g (Yield: 80%) of Compound 15. The obtained compound was identified by MS/FAB and $^1$H NMR (C61H34D5N3: calculated 818.35, found 819.35).

$^1$H NMR (400 MHz, CDCl$_3$) δ 8.80-8.78 (m, 1H), 8.65-8.63 (d, 4H), 8.22-8.18 (m, 6H), 8.02-8.00 (m, 2H), 7.95-7.93 (m, 1H), 7.90-7.88 (m, 1H), 7.78-7.74 (d, 4H), 7.68-7.64 (d, 4H), 7.60-7.56 (m, 4H) 7.50-7.48 (m, 1H), 7.38-7.36 (m, 2H), 7.32-7.30 (m, 2H), 7.24-7.22 (m, 2H)

Synthesis Example 9: Synthesis of Compound 3

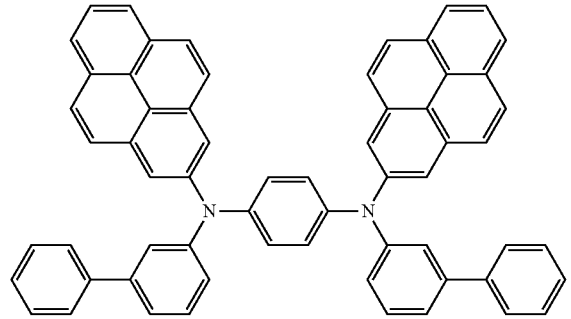

3

3.45 g (Yield: 85%) of Compound 3 was synthesized in the same manner as used to synthesize Compound 7, except that 3-phenylaniline was used instead of aniline, and 1,4-dibromobenzene was used instead of 4,4'-dibromo-biphenyl. The obtained compound was identified by MS/FAB and $^1$H NMR (C62H40N2: calculated 812.32, found 813.32).

$^1$H NMR (400 MHz, CDCl$_3$) δ 8.30-8.28 (ss, 4H), 8.16-8.12 (m, 6H), 7.90-7.86 (m, 8H), 7.80 (s, 4H), 7.75-7.68 (m, 6H), 7.50-7.46 (m, 2H), 7.32-7.28 (m, 2H), 7.20-7.18 (m, 2H), 7.10 (s, 4H), 7.08-7.06 (m, 2H)

Synthesis Example 10: Synthesis of Compound 6

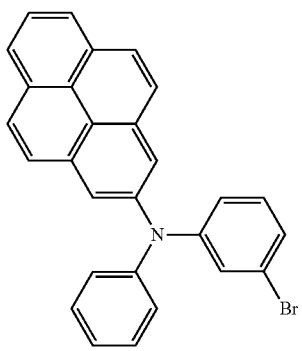

1-7

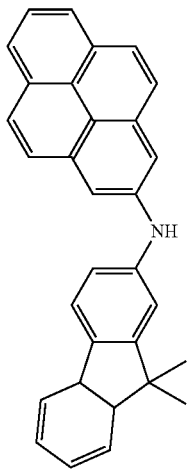

1-8

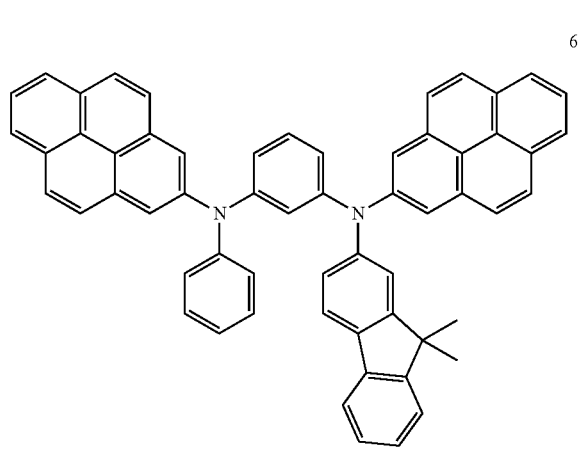

6

Intermediate I-7 was synthesized in the same manner as used to synthesize Intermediate I-5, except that Intermediate I-1 was used instead of Intermediate I-4, and 1-bromo-3-iodobenzene was used instead of 4-bromo-4'-iodo-biphenyl.

Intermediate I-8 was used in the same manner as used to synthesize Intermediate I-6, except that 9,9-dimethyl-9H-fluoren-2-amine was used instead of aniline-2,3,4,5,6-d$_5$.

3.34 g (Yield: 86%) of Compound 6 was synthesized in the same manner as used to synthesize Compound 15, except that Intermediate I-7 was used instead of Intermediate I-5, and Intermediate I-8 was used instead of Intermediate I-6. The obtained compound was identified by MS/FAB and $^1$H NMR (C59H40N2: calculated 776.32, found 777.32).

$^1$H NMR (400 MHz, CDCl$_3$) δ 8.30-8.28 (ss, 4H), 8.16-8.12 (m, 6H), 8.08-8.06 (m, 1H), 8.03-8.01 (m, 1H) 7.98 (s, 2H), 7.96 (s, 2H), 7.88-7.86 (m, 4H), 7.76-7.70 (m, 1H), 7.58-7.50 (m, 5H), 7.45-7.40 (m, 2H), 7.38 (d, 1H), 7.32-7.30 (m, 2H), 7.26-7.24 (m, 1H), 6.98-6.94 (m, 2H), 1.61 (s, 6H)

Synthesis Example 10: Synthesis of Compound 9

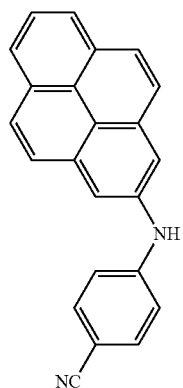

I-9

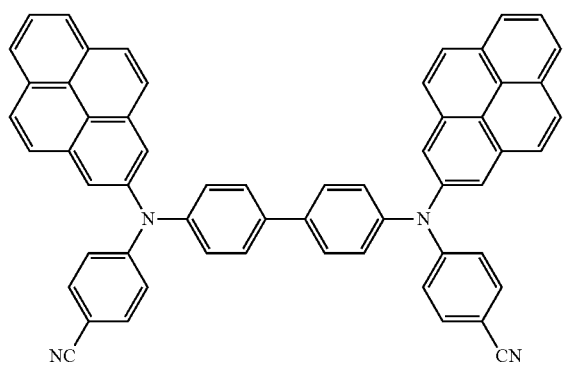

9

Intermediate I-9 was synthesized in the same manner as used to synthesize Intermediate I-1, except that 4-aminobenzonitrile was used instead of aniline. Then, 3.34 g (Yield: 85%) of Compound 9 was used in the same manner as used to synthesize Compound 7, except that Intermediate I-9 was used instead of Intermediate I-1. The obtained compound was identified by MS/FAB and $^1$H NMR (C58H34N4: calculated 786.28, found 787.28).

$^1$H NMR (400 MHz, CDCl$_3$) δ 8.30-8.28 (ss, 4H), 8.16-8.12 (m, 6H), 7.88-7.86 (ss, 4H), 7.76 (s, 4H), 7.72-7.68 (m, 4H), 7.62-7.58 (m, 4H), 7.36-7.32 (m, 4H), 7.20-7.16 (m, 4H)

Synthesis Example 11: Synthesis of Compound 10

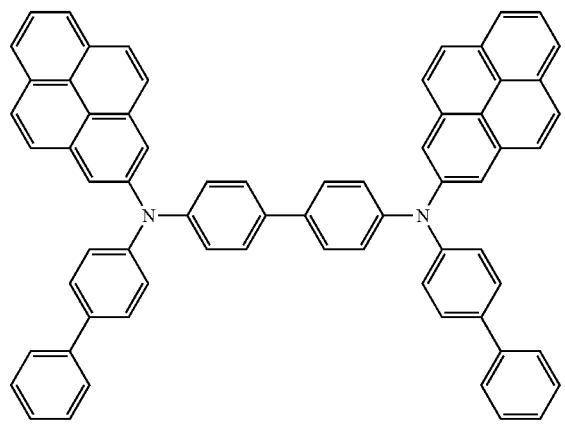

10

3.78 g (Yield: 85%) of Compound 10 was synthesized in the same manner as used to synthesize Compound 7, except that 4-phenylaniline was used instead of aniline. The obtained compound was identified by MS/FAB and $^1$H NMR (C68H44N2: calculated 888.35, found 889.35).

$^1$H NMR (400 MHz, CDCl$_3$) δ 8.30-8.28 (ss, 4H), 8.16-8.12 (m, 6H), 7.92-7.88 (m, 4H), 7.85-7.83 (ss, 4H), 7.78-7.68 (m, 18H), 7.40-7.36 (m, 4H), 7.28-7.24 (m, 4H)

Synthesis Example 12: Synthesis of Compound 13

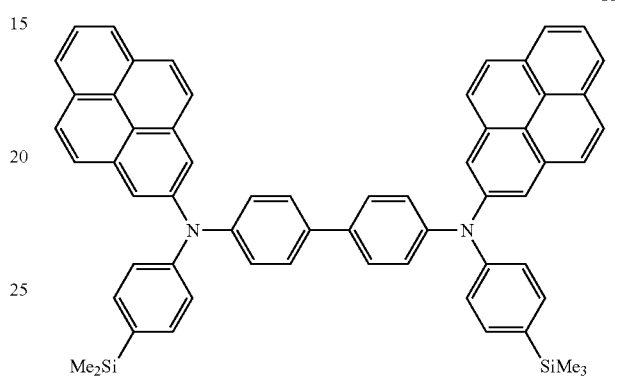

13

3.75 g (Yield: 85%) of Compound 13 was synthesized in the same manner as used to synthesize Compound 7, except that 4-(trimethylsilyl)aniline was used instead of aniline. The obtained compound was identified by MS/FAB and $^1$H NMR (C62H52N2Si2: calculated 880.37, found 881.37).

$^1$H NMR (400 MHz, CDCl$_3$) δ 8.30-8.28 (ss, 4H), 8.16-8.12 (m, 6H), 7.88-7.86 (ss, 4H), 7.80 (s, 4H), 7.74-7.70 (m, 4H), 7.68-7.64 (m, 4H), 7.40-7.36 (m, 4H), 7.30-7.26 (m, 4H), 0.25-0.23 (m, 18H)

Synthesis Example 13: Synthesis of Compound 14

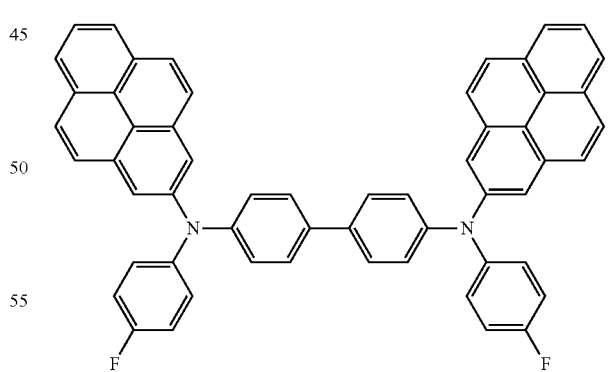

14

3.32 g (Yield: 86%) of Compound 14 was synthesized in the same manner as used to synthesize Compound 7, except that 4-fluoroaniline was used instead of aniline. The obtained compound was identified by MS/FAB and $^1$H NMR (C56H34F2N2: calculated 772.27, found 773.27).

$^1$H NMR (400 MHz, CDCl$_3$) δ 8.30-8.28 (ss, 4H), 8.16-8.12 (m, 6H), 7.88-7.86 (ss, 4H), 7.76 (s, 4H), 7.72-7.68 (m, 4H), 7.46-7.42 (m, 4H), 7.36-7.32 (m, 4H), 7.28-7.24 (m, 4H)

Synthesis Example 14: Synthesis of Compound 16

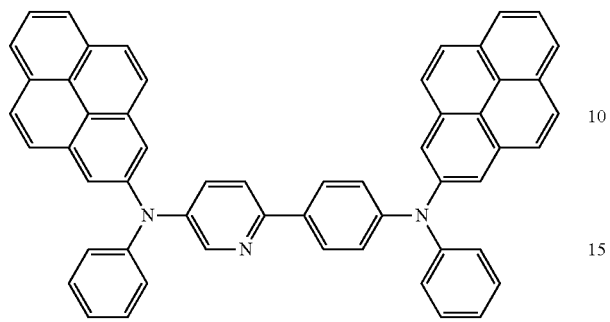

16

3.14 g (Yield: 85%) of Compound 16 was synthesized in the same manner as used to synthesize Compound 7, except that 2-(4-bromophenyl)-5-iodopyridine was used instead of 4,4'-dibromo-biphenyl. The obtained compound was identified by MS/FAB and $^1$H NMR (C55H35N3: calculated 737.28, found 738.28).

$^1$H NMR (400 MHz, CDCl$_3$) δ 8.30-8.28 (ss, 4H), 8.24 (m, 1H), 8.20-8.16 (m, 6H), 8.06-8.04 (m, 3H), 7.85-7.83 (d, 4H), 7.80 (s, 2H), 7.70 (s, 2H), 7.55-7.40 (m, 5H), 7.28-7.26 (m, 4H), 7.20-7.18 (m, 2H), 7.10-7.08 (m, 2H)

Synthesis Example 15: Synthesis of Compound 20

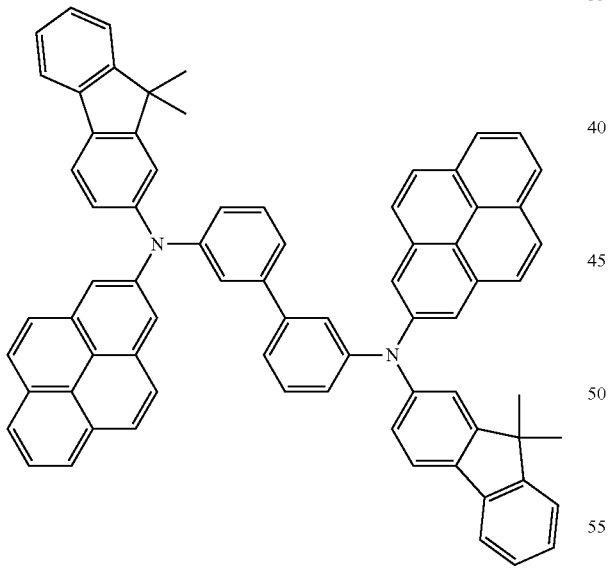

20

4.12 g (Yield: 85%) of Compound 20 was synthesized in the same manner as used to synthesize Compound 7, except that 9,9-dimethyl-9H-fluoren-2-amine was instead of aniline, and 3,3'-dibromo-biphenyl was used instead of 4,4'-dibromo-biphenyl. The obtained compound was identified by MS/FAB and $^1$H NMR (C59H40N2: calculated 968.41, found 969.41).

$^1$H NMR (400 MHz, CDCl$_3$) δ 8.30-8.28 (ss, 4H), 8.16-8.12 (m, 6H), 8.08-8.06 (m, 2H), 8.03-8.01 (m, 2H) 7.98 (s, 4H), 7.96 (s, 4H), 7.88-7.86 (m, 2H), 7.80-7.76 (m, 2H), 7.70-7.62 (m, 6H), 7.58-7.56 (m, 2H), 7.50-7.48 (m, 2H), 7.40-7.38 (m, 2H), 7.20-7.18 (m, 2H), 1.61 (s, 12H)

Synthesis Example 16: Synthesis of Compound 21

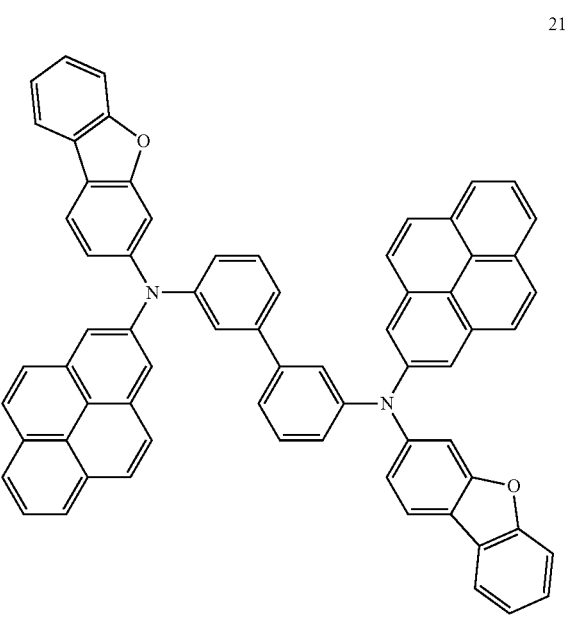 [SMILES: c1cc(-c2cccc(N(c3cc4ccc5cccc6ccc(c3)c4c56)c3ccc4c(c3)oc3ccccc34)c2)cc(N(c2cc3ccc4cccc5ccc(c2)c3c45)c2ccc3c(c2)oc2ccccc23)c1]

21

3.85 g (Yield: 84%) of Compound 21 was synthesized in the same manner as used to synthesize Compound 7, except that 3-dibenzofuranylamine was used instead of aniline, and 3,3'-dibromo-biphenyl was used instead of 4,4'-dibromo-biphenyl. The obtained compound was identified by MS/FAB and $^1$H NMR (C68H40N2O2: calculated 916.31, found 917.31).

$^1$H NMR (400 MHz, CDCl$_3$) δ 8.30-8.28 (ss, 4H), 8.18-8.14 (m, 6H), 8.12-8.10 (d, 2H), 8.08-8.06 (d, 2H), 8.04-8.02 (d, 2H), 7.98 (s, 4H), 7.94-7.90 (m, 6H), 7.88-7.86 (m, 2H), 7.78-7.76 (m, 2H), 7.74-7.70 (m, 2H), 7.66-7.62 (m, 4H), 7.58-7.56 (m, 2H), 7.40-7.38 (m, 2H)

Synthesis Example 17: Synthesis of Compound 24

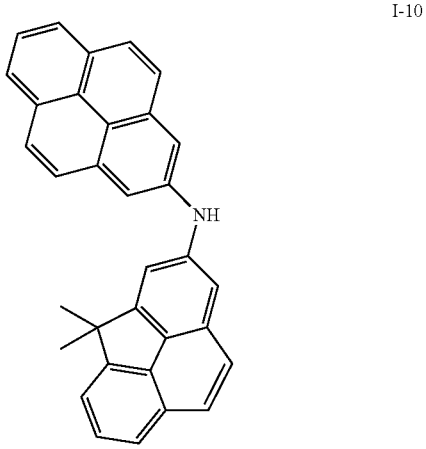

I-10

-continued

I-11

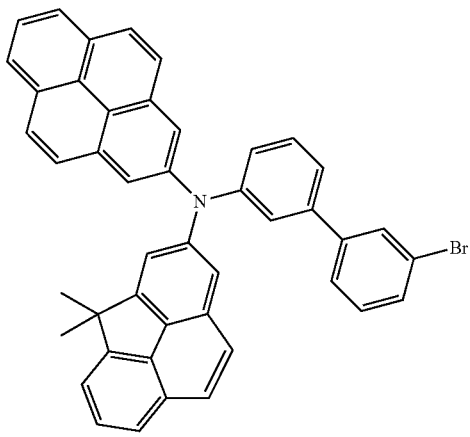

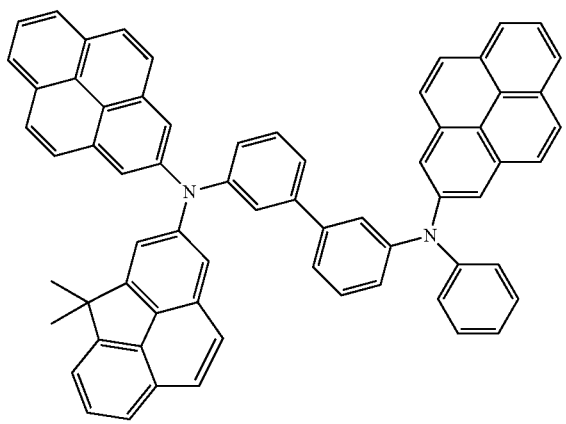

Intermediate I-10 was synthesized in the same manner as used to synthesize Intermediate I-4, except that 4,4-dimethyl-4H-cyclopenta[def]phenanthren-2-amine was used instead of 4-pyridine-2-yl-phenylamine.

Intermediate I-11 was synthesized in the same manner as used to synthesize Intermediate I-5, except that Intermediate I-10 was used instead of Intermediate I-4, and 3-bromo-3'-iodo-biphenyl was used instead of 4-bromo-4'-iodo-biphenyl.

Then, 3.60 g (Yield: 82%) of Compound 24 was synthesized in the same manner as used to synthesize Compound 15, except that Intermediate I-11 was used instead of Intermediate I-5, and Intermediate I-1 was used instead of Intermediate I-6. The obtained compound was identified by MS/FAB and 1H NMR (C67H44N2: calculated 876.35, found 877.35).

$^1$H NMR (400 MHz, CDCl$_3$) δ 8.30-8.28 (ss, 4H), 8.18-8.14 (m, 6H), 8.08-8.06 (dd, 1H), 7.98-7.96 (d, 1H), 7.92-7.90 (m, 1H), 7.85-7.83 (d, 4H), 7.80 (s, 4H), 7.75-7.73 (d, 1H), 7.60-7.58 (m, 1H), 7.53-7.50 (m, 3H), 7.46-7.42 (m, 4H), 7.28-7.26 (m, 2H), 7.20-7.18 (d, 1H), 7.16-7.14 (m, 1H), 7.10-7.06 (m, 3H), 7.02-6.98 (m, 1H), 1.89 (s, 6H)

Synthesis Example 18: Synthesis of Compound 25

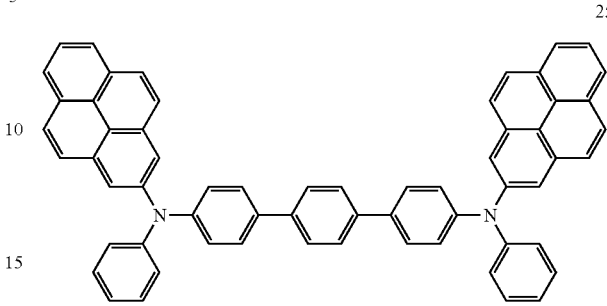

3.33 g (Yield: 82%) of Compound 25 was synthesized in the same manner as used to synthesize Compound 7, except that 4,4"-dibromo-p-terphenyl was used instead of 4,4'-dibromo-biphenyl. The obtained compound was identified by MS/FAB and 1H NMR (C62H40N2: calculated 812.32, found 813.32).

$^1$H NMR (400 MHz, CDCl$_3$) δ 8.30-8.28 (ss, 4H), 8.18-8.14 (m, 6H), 7.98 (s, 4H), 7.94-7.92 (m, 4H), 7.88-7.84 (m, 8H), 7.70-7.66 (m, 4H), 7.60-7.58 (m, 2H), 7.56-7.52 (m, 4H), 7.48-7.42 (m, 4H)

Synthesis Example 19: Synthesis of Compound 29

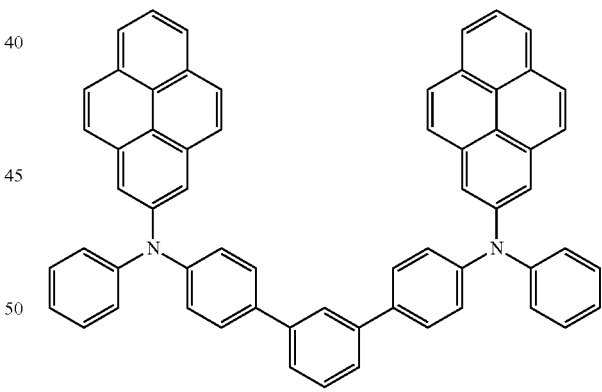

3.46 g (Yield: 85%) of Compound 29 was synthesized in the same manner as used to synthesize Compound 7, except that 1,3-di(4-bromophenyl)benzene was used instead of 4,4'-dibromo-biphenyl. The obtained compound was identified by MS/FAB and 1H NMR (C62H40N2: calculated 812.32, found 813.32).

$^1$H NMR (400 MHz, CDCl$_3$) δ 8.30-8.28 (ss, 4H), 8.18-8.14 (m, 6H), 8.02-8.00 (m, 1H), 7.96-7.94 (m, 4H), 7.90-7.86 (m, 10H), 7.82-7.80 (m, 1H), 7.78-7.74 (m, 4H), 7.68-7.66 (m, 2H), 7.60-7.56 (m, 4H), 7.50-7.48 (m, 4H)

Synthesis Example 20: Synthesis of Compound 35

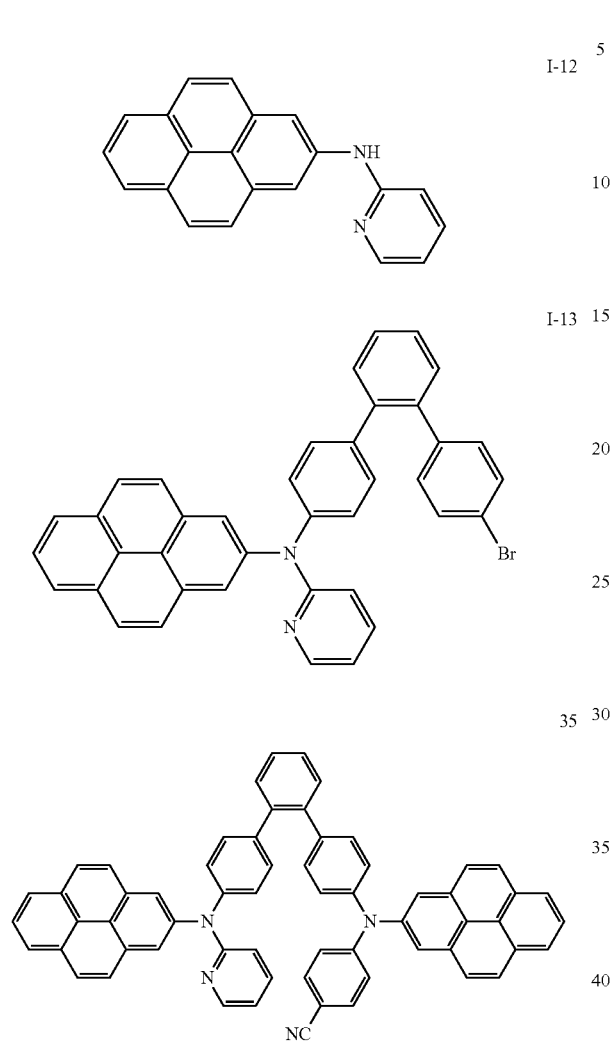

Intermediate I-12 was synthesized in the same manner as used to synthesize Intermediate I-2, except that 2-pyridyl amine was used instead of 4-pyridine-2-yl-phenylamine.

Intermediate I-13 was synthesized in the same manner as used to synthesize Intermediate I-5, except that Intermediate I-12 was used instead of Intermediate I-4, and 1-(4-bromophenyl)-2-(4-iodophenyl)benzene) was used instead of 4-bromo-4'-iodo-biphenyl.

Then, 3.57 g (Yield: 85%) of Compound 35 was used in the same manner as used to synthesize Compound 15, except that Intermediate I-13 was used instead of Intermediate I-5, and Intermediate I-12 was instead of Intermediate I-6. The obtained compound was identified by MS/FAB and $^1$H NMR (C62H38N4: calculated 838.31, found 839.31).

$^1$H NMR (400 MHz, CDCl$_3$) δ 8.30 (s, 2H), 8.28-8.25 (m, 3H), 8.12-8.08 (m, 6H), 7.86-7.80 (m, 9H), 7.76 (s, 1H), 7.72-7.68 (m, 4H), 7.64-7.58 (m, 5H), 7.38-7.36 (m, 1H), 7.30-7.28 (m, 2H), 7.25-7.22 (m, 3H), 7.12-7.08 (m, 2H)

Synthesis Example 21: Synthesis of Compound 38

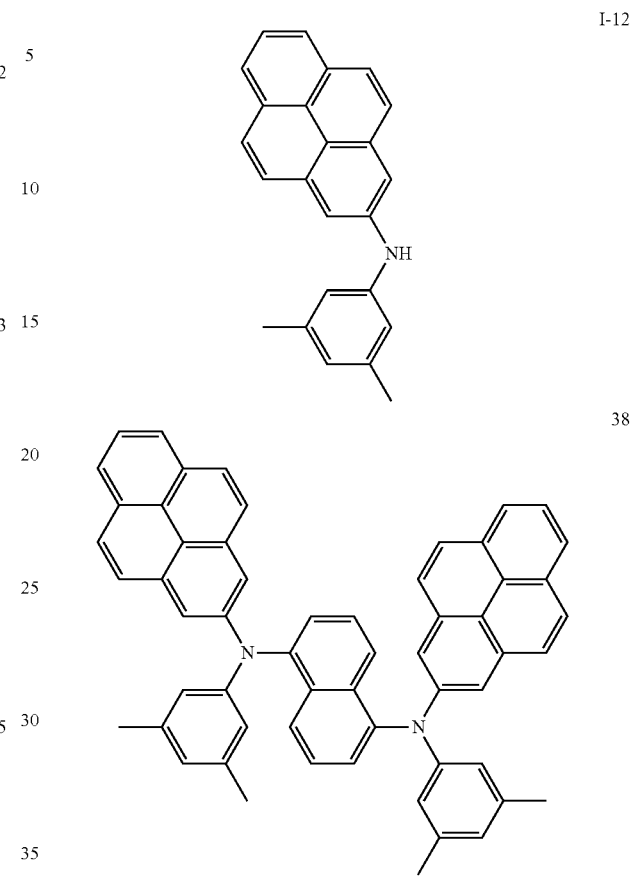

Intermediate I-12 was synthesized in the same manner as used to synthesize Intermediate I-1, except that 3,5-dimethylaniline was used instead of aniline. Then, 3.14 g (Yield: 82%) of Compound 38 was synthesized in the same manner as used to synthesize Compound 7, except that Intermediate I-12 was used instead of Intermediate I-1, and 1,5-dibromonaphthalene was used instead of 4,4'-dibromo-biphenyl. The obtained compound was identified by MS/FAB and 1H NMR (C58H42N2: calculated 766.33, found 767.33).

$^1$H NMR (400 MHz, CDCl$_3$) δ 8.30-8.28 (ss, 4H), 8.18-8.14 (m, 6H), 7.98-7.96 (d, 2H), 7.94-7.92 (d, 4H), 7.88 (s, 4H), 7.84-7.82 (m, 2H), 7.78-7.76 (m, 2H), 7.68-7.66 (d, 2H), 7.64-7.60 (m, 4H), 2.32 (m, 12H)

Synthesis Example 22: Synthesis of Compound 39

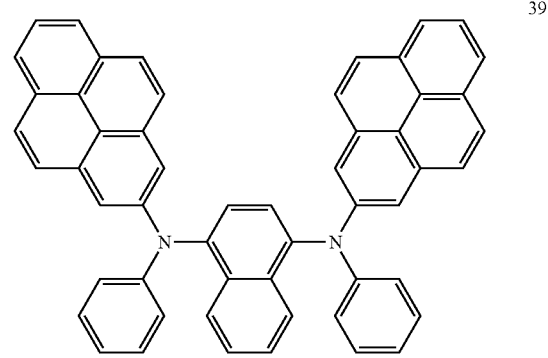 [SMILES: c1ccc(N(c2cc3ccc4cccc5ccc(c2)c3c45)c2ccc(N(c3ccccc3)c3cc4ccc5cccc6ccc(c3)c4c56)c3ccccc23)cc1]

3.02 g (Yield: 85%) of Compound 39 was synthesized in the same manner as used to synthesize Compound 7, except that 1,4-dibromonaphthalene was used instead of 4,4'-dibromo-biphenyl. The obtained compound was identified by MS/FAB and $^1$H NMR (C54H34N2: calculated 710.27, found 711.27).

$^1$H NMR (400 MHz, CDCl$_3$) δ 8.30-8.28 (ss, 4H), 8.18-8.14 (m, 6H), 7.98-7.96 (d, 2H), 7.94-7.92 (d, 4H), 7.88 (s, 4H), 7.84-7.82 (m, 2H), 7.78-7.76 (m, 2H), 7.68-7.66 (d, 2H), 7.64-7.60 (m, 4H), 2.32 (m, 12H)

Synthesis Example 23: Synthesis of Compound 41

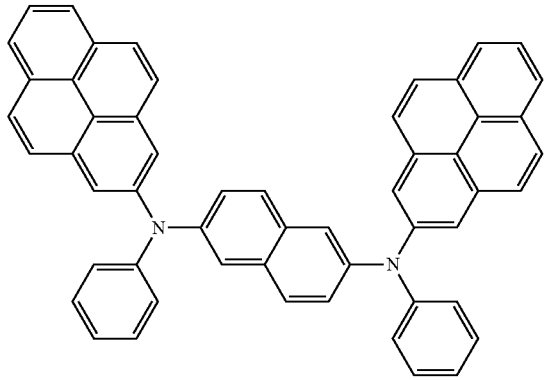

41

2.91 g (Yield: 82%) of Compound 41 was synthesized in the same manner as used to synthesize Compound 7, except that 2,6-dibromonaphthalene was used instead of 4,4'-dibromo-biphenyl. The obtained compound was identified by MS/FAB and $^1$H NMR (C54H34N2: calculated 710.27, found 711.27).

$^1$H NMR (400 MHz, CDCl$_3$) δ 8.30-8.28 (ss, 4H), 8.18-8.14 (m, 6H), 7.88-7.82 (m, 6H), 7.78 (s, 4H), 7.74-7.72 (d, 2H), 7.60-7.54 (m, 4H), 7.48-7.44 (m, 2H), 7.38-7.36 (m, 2H), 7.20-7.18 (m, 4H)

Synthesis Example 24: Synthesis of Compound 52

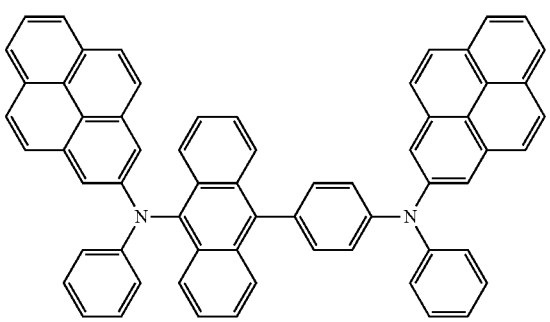

52

3.56 g (Yield: 85%) of Compound 52 was synthesized in the same manner as used to synthesize Compound 7, except that 10-bromo-9-(4-bromophenyl)anthracene was used instead of 4,4'-dibromo-biphenyl. The obtained compound was identified by MS/FAB and 1H NMR (C64H40N2: calculated 836.32, found 837.32).

$^1$H NMR (400 MHz, CDCl$_3$) δ 8.30-8.28 (ss, 4H), 8.18-8.14 (m, 6H), 7.87-7.77 (m, 8H), 7.70-7.66 (m, 4H), 7.60 (s, 2H), 7.58-7.54 (m, 4H), 7.50-7.46 (m, 6H), 7.40-7.36 (m, 2H), 7.34-7.32 (m, 2H), 7.28-7.26 (m, 2H)

Synthesis Example 25: Synthesis of Compound 54

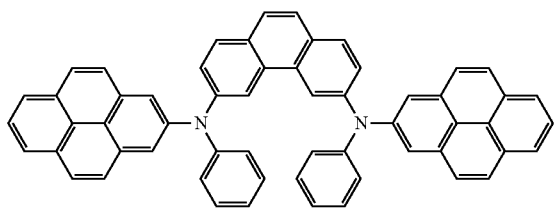

54

3.23 g (Yield: 85%) of Compound 54 was synthesized in the same manner as used to synthesize Compound 7, except that 3,6-dibromophenanthrene was used instead of 4,4'-dibromo-biphenyl. The obtained compound was identified by MS/FAB and 1H NMR (C58H36N2: calculated 760.29, found 761.29).

$^1$H NMR (400 MHz, CDCl$_3$) δ 8.30-8.28 (ss, 4H), 8.18-8.14 (m, 6H), 7.98-7.96 (d, 2H), 7.90 (s, 2H), 7.82-7.80 (d, 2H), 7.75 (s, 4H), 7.68-7.66 (m, 2H), 7.56-7.50 (m, 6H), 7.48-7.45 (m, 2H), 7.40-7.36 (m, 4H)

Synthesis Example 26: Synthesis of Compound 55

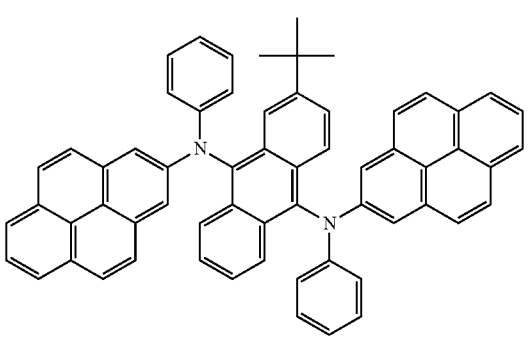

55

3.47 g (Yield: 85%) of Compound 55 was synthesized in the same manner as used to synthesize Compound 7, except that 2-tert-butyl-9,10-dibromoanthracene was used instead of 4,4'-dibromo-biphenyl. The obtained compound was identified by MS/FAB and 1H NMR (C62H44N2: calculated 816.35, found 817.35).

$^1$H NMR (400 MHz, CDCl$_3$) δ 8.30-8.28 (ss, 4H), 8.22-8.17 (m, 8H), 7.96-7.94 (d, 1H), 7.92-7.90 (d, 4H), 7.86-7.84 (m, 2H), 7.78-7.74 (m, 5H), 7.60-7.58 (m, 1H), 7.50-7.46 (m, 4H), 7.42-7.40 (m, 2H), 7.36-7.34 (m, 2H), 7.30-7.28 (m, 2H), 1.32 (s, 9H)

Synthesis Example 27: Synthesis of Compound 57

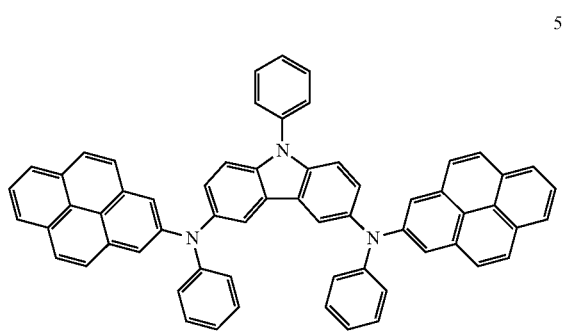

3.51 g (Yield: 85%) of Compound 57 was synthesized in the same manner as used to synthesize Compound 7, except that 3,6-dibromo-9-phenyl-9H-carbazole was used instead of 4,4'-dibromo-biphenyl. The obtained compound was identified by MS/FAB and 1H NMR (C62H39N3: calculated 825.31, found 826.31).

$^1$H NMR (400 MHz, CDCl$_3$) δ 8.30-8.28 (ss, 4H), 8.18-8.14 (m, 6H), 7.88-7.86 (d, 4H), 7.84-7.74 (m, 8H), 7.70-7.66 (m, 5H), 7.60-7.56 (m, 4H), 7.50-7.46 (dd, 2H), 7.40-7.38 (m, 2H), 7.31-7.28 (m, 4H)

Synthesis Example 28: Synthesis of Compound 60

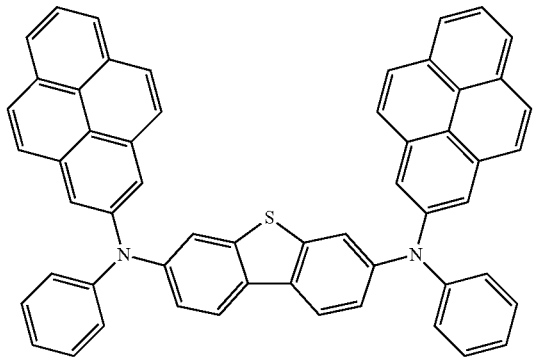

3.26 g (Yield: 85%) of Compound 60 was synthesized in the same manner as used to synthesize Compound 7, except that 3,7-dibromo-dibenzothiophene was used instead of 4,4'-dibromo-biphenyl. The obtained compound was identified by MS/FAB and 1H NMR (C56H34N2S: calculated 766.24, found 767.24).

$^1$H NMR (400 MHz, CDCl$_3$) δ 8.30-8.28 (ss, 4H), 8.18-8.14 (m, 6H), 7.98-7.96 (d, 2H), 7.82 (s, 2H), 7.80 (s, 2H), 7.78 (s, 4H), 7.68-7.66 (m, 2H), 7.64-7.58 (m, 4H), 7.50-7.46 (m, 2H), 7.40-7.38 (m, 2H), 7.30-7.28 (m, 4H)

Synthesis Example 29: Synthesis of Compound 68

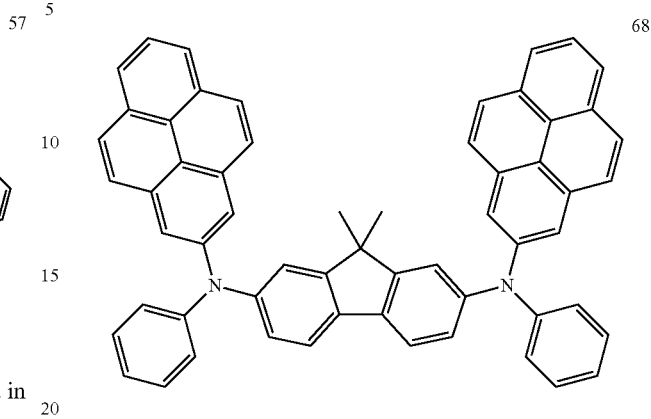

2.91 g (Yield: 85%) of Compound 68 was synthesized in the same manner as used to synthesize Compound 7, except that 2,7-dibromo-9,9-dimethyl-9H-fluoren was used instead of 4,4'-dibromo-biphenyl. The obtained compound was identified by MS/FAB and 1H NMR (C59H40N2: calculated 776.32, found 777.32).

$^1$H NMR (400 MHz, CDCl$_3$) δ 8.30-8.28 (ss, 4H), 8.18-8.14 (m, 6H), 7.98-7.96 (d, 2H), 7.90-7.88 (d, 4H), 7.84 (s, 4H), 7.78-7.72 (m, 4H), 7.69-7.64 (m, 4H), 7.58-7.56 (m, 2H), 7.38-7.32 (m, 4H), 1.57 (s, 6H)

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

An anode was prepared by cutting a Corning 15 Ω/cm$^2$ (1,200 Å) ITO glass substrate into a size of 50 mm×50 mm×0.5 mm, sonicating the substrate in isopropyl alcohol and pure water each for 5 minutes, and cleaning by irradiation of ultraviolet rays for 30 minutes. Then, 2-TNATA was vacuum-deposited on top of the ITO glass substrate to form an HIL having a thickness of 600 Å. Then, Compound 7 was vacuum-deposited on the HIL to form an HTL having a thickness of 300 Å. ADN and DPAVBi at a weight ratio of 98:2 were co-deposited on the HTL to form an EML having a thickness of 300 Å.

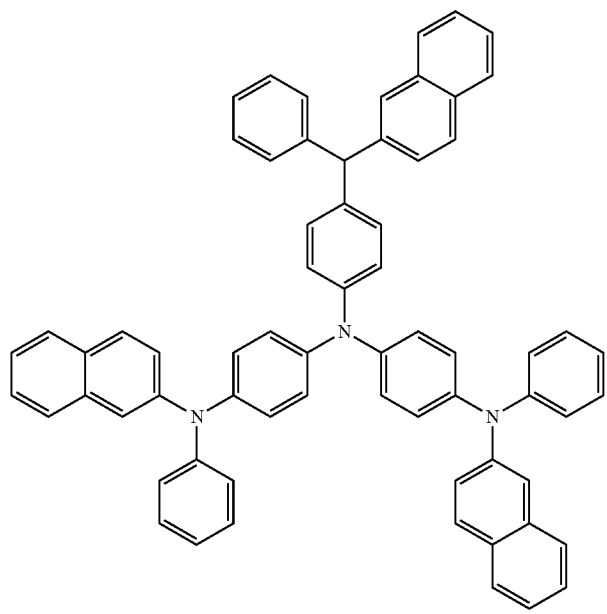

2-TNATA

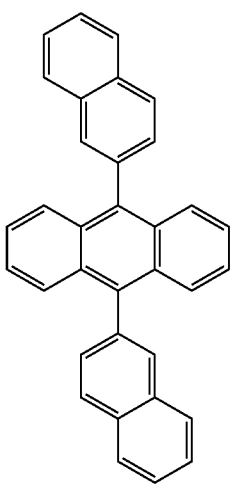

ADN

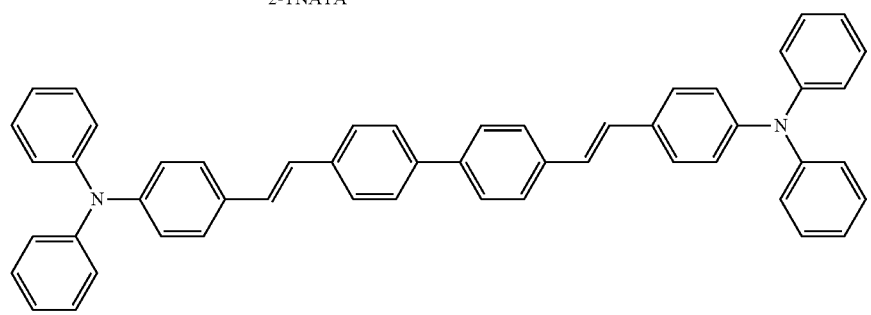

DPAVBi

Alga was vacuum-deposited on the EML to form an ETL having a thickness of 300 Å Then, LiF was vacuum-deposited on the ETL to form an EIL having a thickness of 10 Å. Al was vacuum-deposited on the ETL to form a cathode having a thickness of 3,000 Å to thereby complete the formation of the OLED.

Example 2

An OLED was manufactured in the same manner as in Example 1, except that Compound 15 was used instead of Compound 7 as a material of the HTL.

Example 3

An OLED was manufactured in the same manner as in Example 1, except that Compound 43 was used instead of Compound 7 as a material of the HTL.

Example 4

An OLED was manufactured in the same manner as in Example 1, except that Compound 56 was used instead of Compound 7 as a material of the HTL.

Example 5

An OLED was manufactured in the same manner as in Example 1, except that Compound 63 was used instead of Compound 7 as a material of the HTL.

Example 6

An OLED was manufactured in the same manner as in Example 1, except that Compound 67 was used instead of Compound 7 as a material of the HTL.

Example 7

An OLED was manufactured in the same manner as in Example 1, except that Compound 48 was used instead of 2-TNATA as a material of the HIL, and NPB was used instead of Compound 7 as a material of the HTL.

Example 8

An OLED was manufactured in the same manner as in Example 7, except that Compound 63 was used instead of Compound 48 as a material of the HIL.

Example 9

An OLED was manufactured in the same manner as in Example 7, except that Compound 67 was used instead of Compound 48 as a material of the HIL.

Example 10

An OLED was manufactured in the same manner as in Example 1, except that Compound 8 was used instead of DPAVBi as a material of the EML, and NPB was used instead of Compound 7 as a material of the HTL.

Example 11

An OLED was manufactured in the same manner as in Example 10, except that Compound 43 was used instead of Compound 8 as a material of the EML.

Example 12

An OLED was manufactured in the same manner as in Example 1, except that Compound 43 was used instead of Compound 7 as a material of the HTL, and Compound 8 was used instead of DPAVBi as a material of the EML.

Comparative Example 1

An OLED was manufactured in the same manner as in Example 1, except that NPB was used instead of Compound 7 as a material of the HTL.

Comparative Example 2

An OLED was manufactured in the same manner as in Example 1, except that Compound A-1 below was used instead of Compound 7 as a material of the HTL.

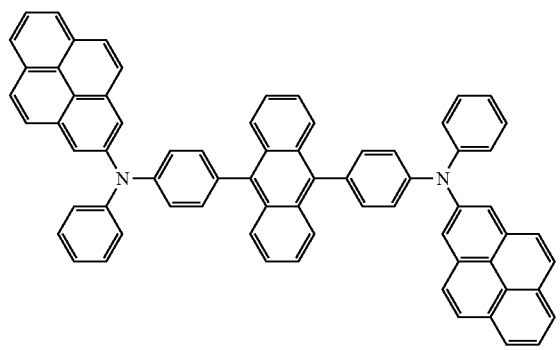

Comparative Example 3

An OLED was manufactured in the same manner as in Example 1, except that Compound A-2 below was used instead of Compound 7 as a material of the HTL.

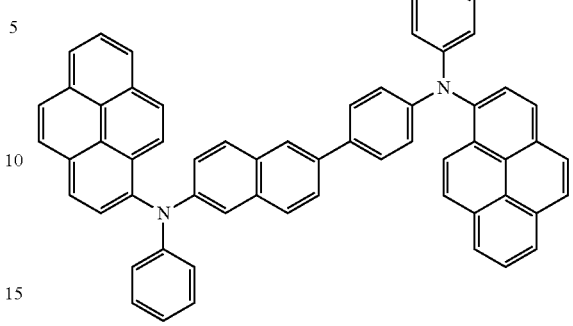

Comparative Example 4

An OLED was manufactured in the same manner as in Example 1, except that Compound A-3 below was used instead of Compound 7 as a material of the HTL.

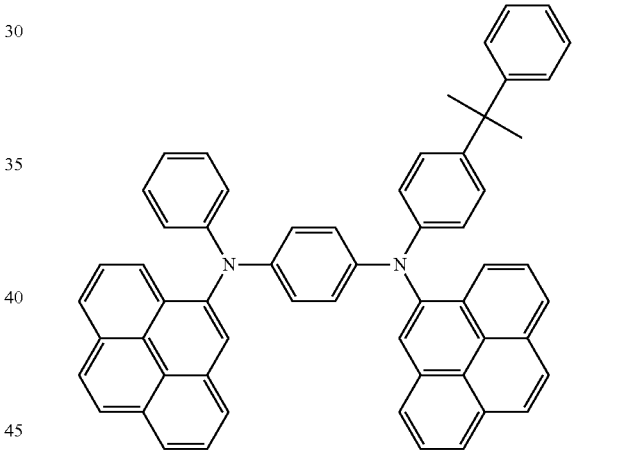

Comparative Example

In regard to the OLEDs of Examples 1 to 12, Comparative Examples 1 to 4, driving voltages, current densities, luminous, efficiencies, luminescence colors, and half-life lifetimes were evaluated by using PR650 Spectroscan Source Measurement Unit. (manufactured by PhotoResearch Inc. The results are shown in Table 1 below.

TABLE 1

| | Electron emission | Hole transport | Hole injection | Driving voltage (V) | Currnt densities (mA/cm$^2$) | Luminous (cd/m$^2$) | Efficiency (cd/A) | Luminescence color | Half-life lifetime [1] |
|---|---|---|---|---|---|---|---|---|---|
| Example 1 | DPAVBi ADN/ | Compound 7 | 2-TNATA | 6.20 | 50 | 3,210 | 6.42 | Blue | 252 |

TABLE 1-continued

|  | Electron emission | Hole transport | Hole injection | Driving voltage (V) | Current densities (mA/cm$^2$) | Luminous (cd/m$^2$) | Efficiency (cd/A) | Luminescence color | Half-life lifetime [1] |
|---|---|---|---|---|---|---|---|---|---|
| Example 2 | DPAVBi ADN | Compound 15 | 2-TNATA | 6.35 | 50 | 3,295 | 6.59 | Blue | 264 |
| Example 3 | DPAVBi ADN | Compound 43 | 2-TNATA | 5.85 | 50 | 3,445 | 6.89 | Blue | 340 |
| Example 4 | DPAVBi ADN | Compound 56 | 2-TNATA | 6.42 | 50 | 3,270 | 6.54 | Blue | 280 |
| Example 5 | DPAVBi ADN | Compound 63 | 2-TNATA | 5.50 | 50 | 3,485 | 6.97 | Blue | 322 |
| Example 6 | DPAVBi ADN | Compound 67 | 2-TNATA | 5.88 | 50 | 3,450 | 6.90 | Blue | 324 |
| Example 7 | DPAVBi ADN | NPB | Compound 48 | 6.70 | 50 | 3,195 | 6.39 | Blue | 240 |
| Example 8 | DPAVBi ADN | NPB | Compound 63 | 6.82 | 50 | 3,055 | 6.11 | Blue | 248 |
| Example 9 | DPAVBi ADN | NPB | Compound 67 | 6.69 | 50 | 3,140 | 6.28 | Blue | 258 |
| Example 10 | Compound 8/ ADN | NPB | 2-TNATA | 6.68 | 50 | 3,410 | 6.82 | Blue | 312 |
| Example 11 | Compound 43/ ADN | NPB | 2-TNATA | 6.37 | 50 | 3,355 | 6.71 | Blue | 305 |
| Example 12 | Compound 8/ ADN | Compound 43 | 2-TNATA | 5.86 | 50 | 3,560 | 7.12 | Blue | 344 |
| Comparative Compound 1 | DPAVBi ADN | NPB | 2-TNATA | 7.35 | 50 | 2,065 | 4.13 | Blue | 145 |
| Comparative Compound 2 | DPAVBi ADN | A-1 | 2-TNATA | 7.20 | 50 | 2,620 | 5.24 | Blue | 214 |
| Comparative Compound 3 | DPAVBi ADN | A-2 | 2-TNATA | 7.24 | 50 | 2,900 | 5.80 | Blue | 260 |
| Comparative Compound 4 | DPAVBi ADN | A-3 | 2-TNATA | 7.26 | 50 | 2,560 | 5.12 | Blue | 270 |

[1] Standard current density of half-time lifetime is 100 mA/cm$^2$

Referring to Table 1 above, it was confirmed that the OLEDs of Examples 1 to 12 have excellent performance in terms of all of the driving voltage, the luminous, the efficiency, and the lifetime, compared to those of Comparative Compound 1 to 4.

As described above, according to the one or more embodiments of the present invention, a novel OLED including a condensed cyclic compound has excellent characteristics, such as low-driving voltages, high luminous, high efficiency, and improved lifetime.

While the present invention has been particularly shown and described with reference to exemplary embodiments thereof, it will be understood by those of ordinary skill in the art that various changes in form and details may be made therein without departing from the spirit and scope of the present invention as defined by the following claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A condensed cyclic compound represented by Formula 1 below:

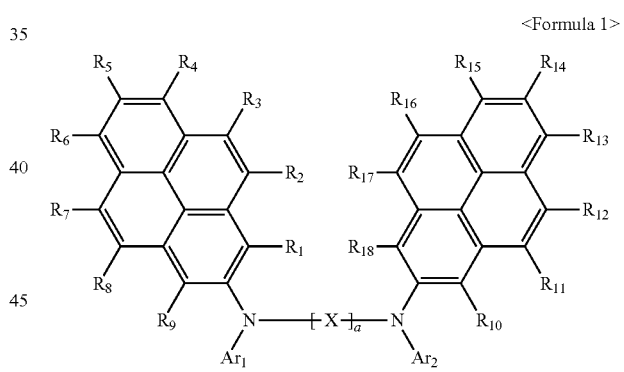

<Formula 1> wherein:

—[X]$_a$— is a group represented by one of Formulas 2-1 to 2-31 below:

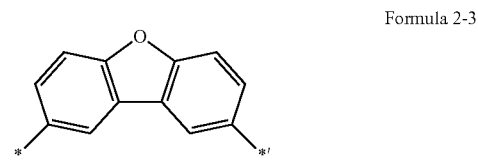

Formula 2-3

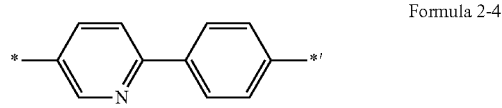

Formula 2-4

-continued
Formula 2-7
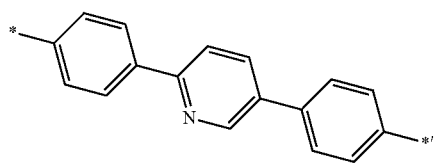
Formula 2-8
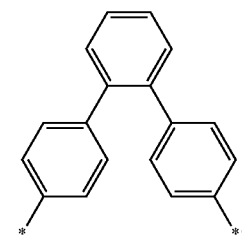
Formula 2-9
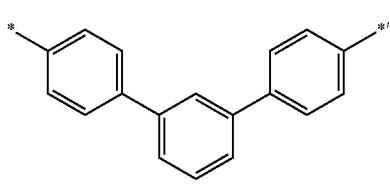
Formula 2-13
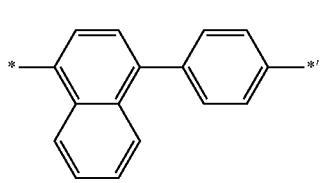
Formula 2-14
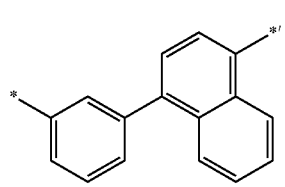
Formula 2-15
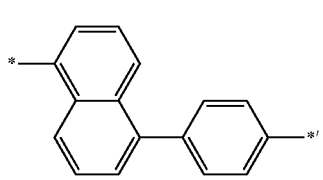
Formula 2-16
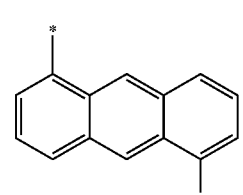
Formula 2-17
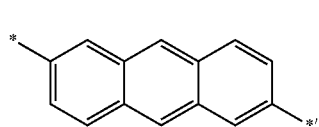
Formula 2-18
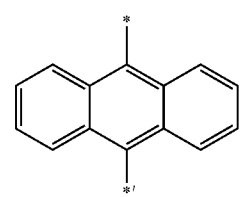
-continued
Formula 2-19
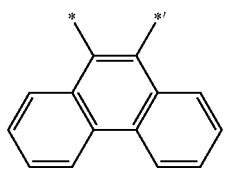
Formula 2-20
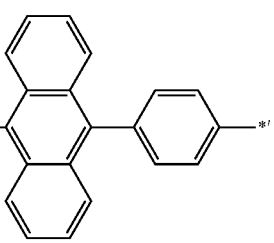
Formula 2-21
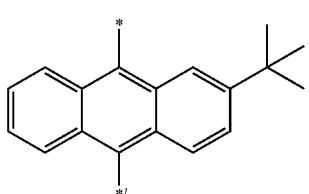
Formula 2-22
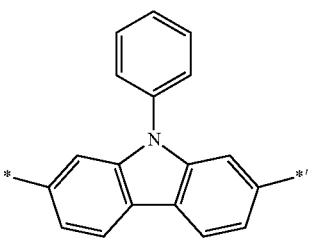
Formula 2-23
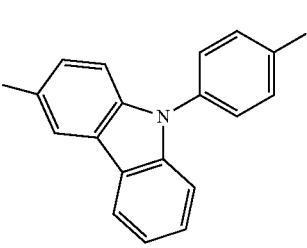
Formula 2-24
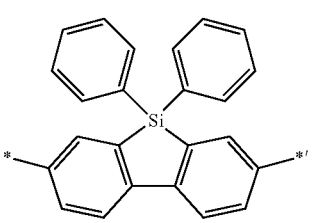
Formula 2-25
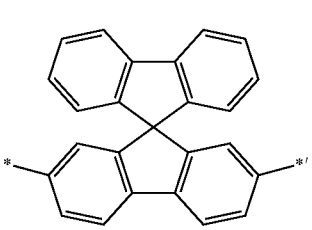

-continued

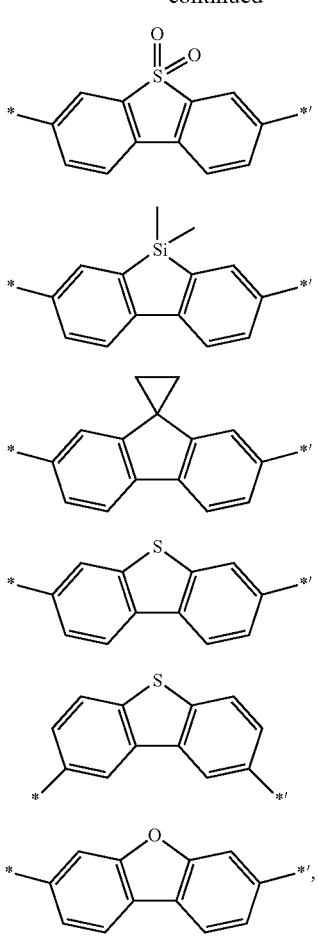

Formula 2-26

Formula 2-27

Formula 2-28

Formula 2-29

Formula 2-30

Formula 2-31 wherein * and *' are binding sites;

$Ar_1$ and $Ar_2$ are each independently at least one of a substituted or unsubstituted $C_6$-$C_{60}$ aryl group or a substituted or unsubstituted $C_3$-$C_{60}$ heteroaryl group;

$R_1$ to $R_{18}$ are each independently a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ aryloxy group, a substituted or unsubstituted $C_6$-$C_{60}$ arylthio group, $-Si(Q_1)(Q_2)(Q_3)$, or $-N(Q_4)(Q_5)$; and $Q_1$ to $Q_5$ are each independently a substituted or unsubstituted $C_1$-$C_{60}$ alkyl group, a substituted or unsubstituted $C_6$-$C_{60}$ aryl group, or a substituted or unsubstituted $C_2$-$C_{60}$ heteroaryl group.

2. The compound as claimed in claim 1, wherein $Ar_1$ and $Ar_2$ are each independently:

a substituted or unsubstituted phenyl group, a substituted or unsubstituted biphenyl group, a substituted or unsubstituted terphenyl group, a substituted or unsubstituted pentaphenyl group, a substituted or unsubstituted pentalenyl group, a substituted or unsubstituted indenyl group, a substituted or unsubstituted naphthyl group, a substituted or unsubstituted azulenyl group, a substituted or unsubstituted indacenyl group, a substituted or unsubstituted acenaphthyl group, a substituted or unsubstituted phenalenyl group, a substituted or unsubstituted fluorenyl group, a substituted or unsubstituted phenanthrenyl group, a substituted or unsubstituted anthryl group, a substituted or unsubstituted fluoranthenyl group, a substituted or unsubstituted dibenzofluorenyl group, a substituted or unsubstituted pyrenyl group, a substituted or unsubstituted naphthacenyl group, a substituted or unsubstituted chrysenyl group, a substituted or unsubstituted triphenylenyl group, a substituted or unsubstituted perylenyl group, a substituted or unsubstituted picenyl group, a substituted or unsubstituted hexacenyl group, a substituted or unsubstituted spiro-fluorenyl group, a substituted or unsubstituted pyrrolyl group, a substituted or unsubstituted furyl group, a substituted or unsubstituted pyrazolyl group, a substituted or unsubstituted imidazolyl group, a substituted or unsubstituted oxazolyl group, a substituted or unsubstituted isoxazolyl group, a substituted or unsubstituted triazolyl group, a substituted or unsubstituted tetrazolyl group, a substituted or unsubstituted oxadiazolyl group, a substituted or unsubstituted pyridyl group, a substituted or unsubstituted pyrimidinyl group, a substituted or unsubstituted pyrazinyl group, a substituted or unsubstituted pyridazinyl group, a substituted or unsubstituted triazinyl group, a substituted or unsubstituted pyranyl group, a substituted or unsubstituted thiophenyl group, a substituted or unsubstituted thiazolyl group, a substituted or unsubstituted isothiazolyl group, a substituted or unsubstituted indolyl group, a substituted or unsubstituted isoindolyl group, a substituted or unsubstituted indolizinyl group, a substituted or unsubstituted benzofuryl group, a substituted or unsubstituted isobenzofuryl group, a substituted or unsubstituted indazolyl group, a substituted or unsubstituted benzimidazolyl group, a substituted or unsubstituted benzoxazolyl group, a substituted or unsubstituted benzisoxazolyl group, a substituted or unsubstituted imidazopyridyl group, a substituted or unsubstituted purinyl group, a substituted or unsubstituted quinolyl group, a substituted or unsubstituted isoquinolyl group, a substituted or unsubstituted phthalazinyl group, a substituted or unsubstituted quinazolinyl group, a substituted or unsubstituted quinoxalinyl group, a substituted or unsubstituted naphthyridinyl group, a substituted or unsubstituted cinnolinyl group, a substituted or unsubstituted benzothiophenyl group, a substituted or unsubstituted benzothiazolyl group, a substituted or unsubstituted carbazolyl group, a substituted or unsubstituted benzocarbazolyl group, a substituted or unsubstituted pyridoindolyl group, a substituted or unsubstituted dibenzofuryl group, a substituted or unsubstituted phenanthridinyl group, a substituted or unsubstituted benzoquinolyl group, a substituted or unsubstituted phenazinyl group, a substituted or unsubstituted dibenzosilolyl group, or a substituted or unsubstituted dibenzothiophenyl group.

3. The compound as claimed in claim 1, wherein
$Ar_1$ and $Ar_2$ are each independently:
a substituted or unsubstituted phenyl group, a substituted or unsubstituted biphenyl group, a substituted or unsubstituted naphthyl group, a substituted or unsubstituted fluorenyl group, a substituted or unsubstituted phenanthrenyl group, a substituted or unsubstituted pyridyl group, a substituted or unsubstituted dibenzofuryl group, a substituted or unsubstituted dibenzosilolyl group, or a substituted or unsubstituted dibenzothiophenyl group.

4. The compound as claimed in claim 1, wherein
$Ar_1$ and $Ar_2$ are each independently a group represented by Formulas 4A to 4G below:

Formula 4A

Formula 4B
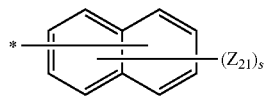

Formula 4C
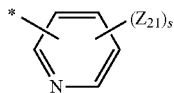

Formula 4D
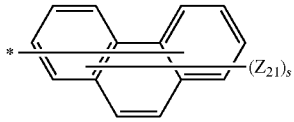

Formula 4E
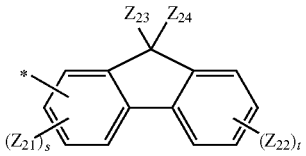

Formula 4F
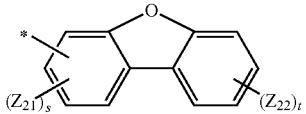

Formula 4G
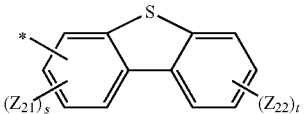

wherein:
$Z_{21}$ and $Z_{22}$ are each independently:
a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, or a $C_2$-$C_{20}$ heteroaryl group;
a $C_1$-$C_{20}$ alkyl group or a $C_1$-$C_{20}$ alkoxy group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, or a phosphoric acid group or a salt thereof; or
a $C_6$-$C_{20}$ aryl group or a $C_2$-$C_{20}$ heteroaryl group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, or a $C_2$-$C_{20}$ heteroaryl group,
wherein:
s is an integer ranging from 3 to 9,
t is 4,
* is a binding site, and
optionally 2 or more of $Z_{21}$ form a ring.

5. The compound as claimed in claim 1, wherein
$Ar_1$ and $Ar_2$ are each independently a group represented by one of Formulas 5A to 5V below:

Formula 5A
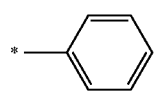

Formula 5B
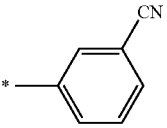

Formula 5C
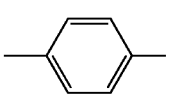

Formula 5D
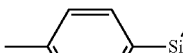

Formula 5E
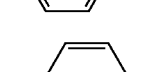

Formula 5F
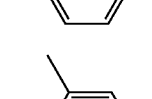

Formula 5G
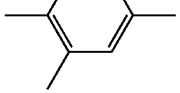

Formula 5H
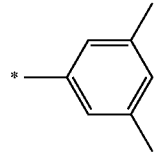

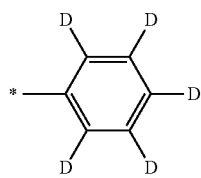

-continued

Formula 5I

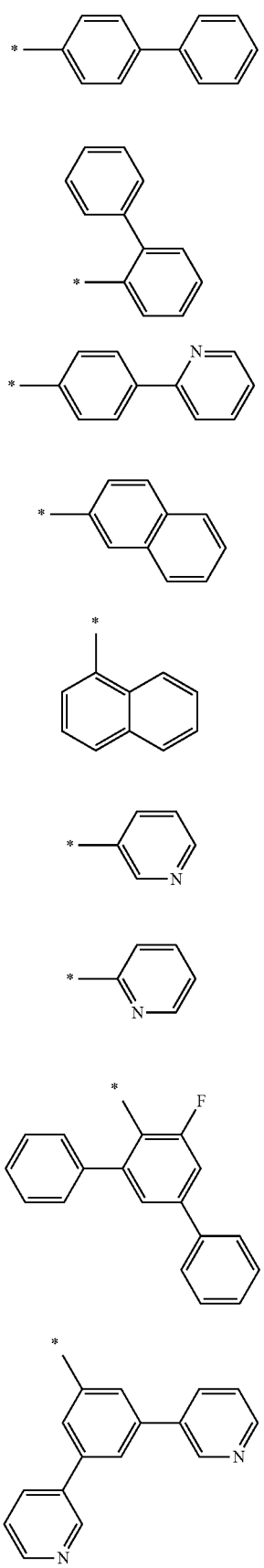

Formula 5J

Formula 5K

Formula 5L

Formula 5M

Formula 5N

Formula 5O

Formula 5P

Formula 5Q

-continued

Formula 5R

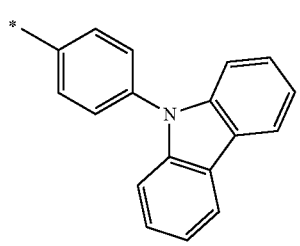

Formula 5S

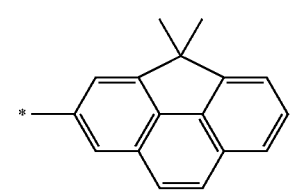

Formula 5T

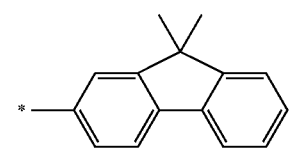

Formula 5U

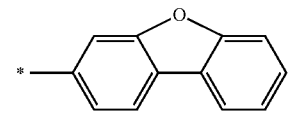

Formula 5V

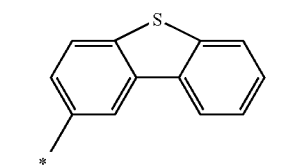

wherein * is a binding site.

6. The compound as claimed in claim 1, wherein $R_1$ to $R_{18}$ are each independently:
a hydrogen atom, a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, an anthryl group, a fluorenyl group, a dibenzofuranyl group, or a dibenzothiophenyl group; or
a $C_1$-$C_{10}$ alkyl group, a $C_1$-$C_{10}$ alkoxy group, a phenyl group, a naphthyl group, an anthryl group, a fluorenyl group, a dibenzofuranyl group, or a dibenzothiophenyl group, each substituted with at least one of a deuterium atom, a halogen group, a hydroxyl group, a cyano group, a nitro group, an amino group, an amidino group, a hydrazine group, a hydrazone group, a carboxyl group or a salt thereof, a sulfonic acid group or a salt thereof, or a phosphoric acid group or a salt thereof.

7. The compound as claimed in claim 1, wherein:
$R_1$ to $R_{18}$ are each independently:
a hydrogen atom, a deuterium atom, a halogen group, a methyl group, an ethyl group, a propyl group, a butyl group, a methoxy group, an ethoxy group, a propoxy group, a butoxy group, or a pentoxy group.

8. A compound that is one of compounds 1 to 6, 8 to 53, 55 to 56, 58 to 62, 64 to 67, and 70 represented below:
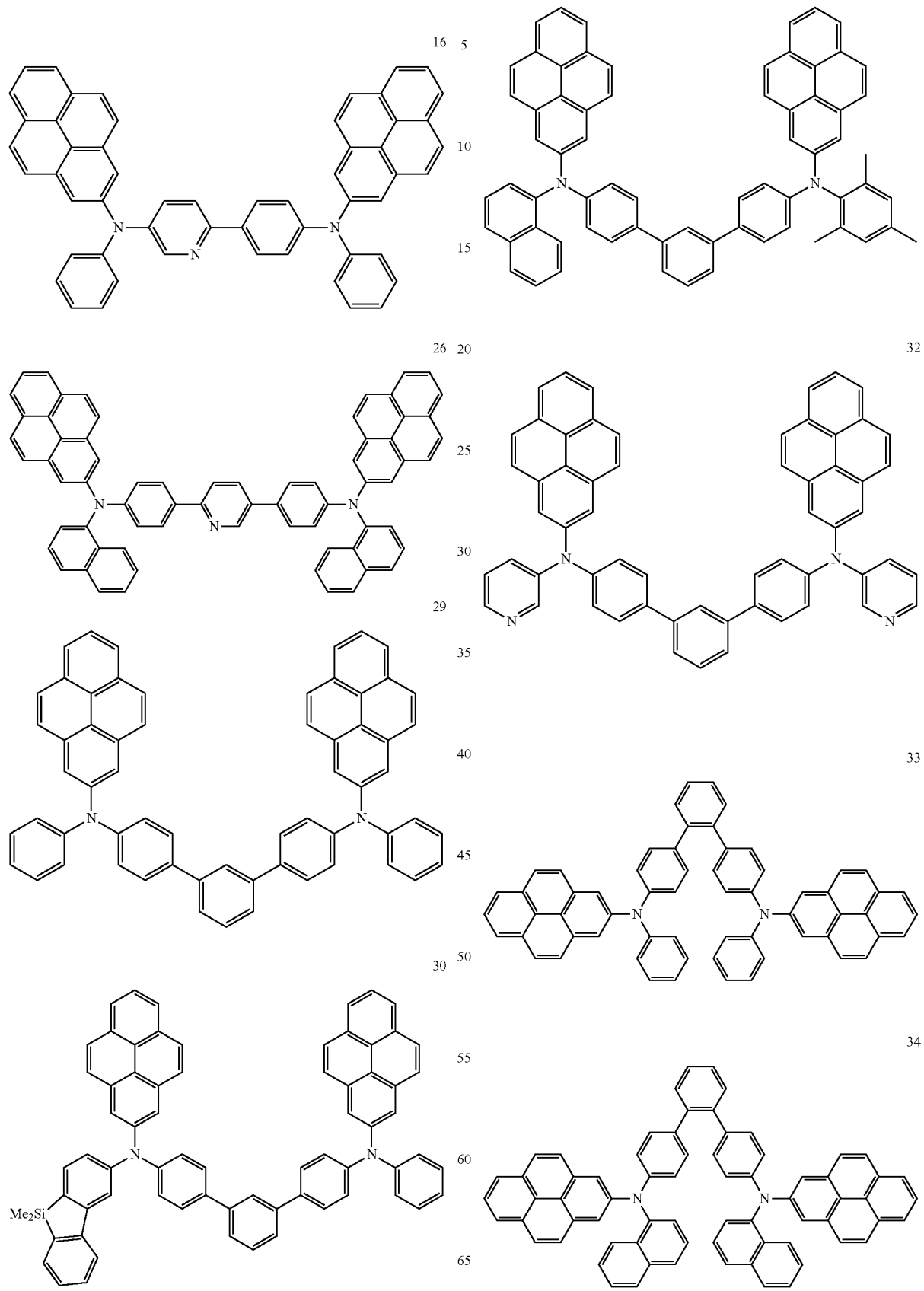

35
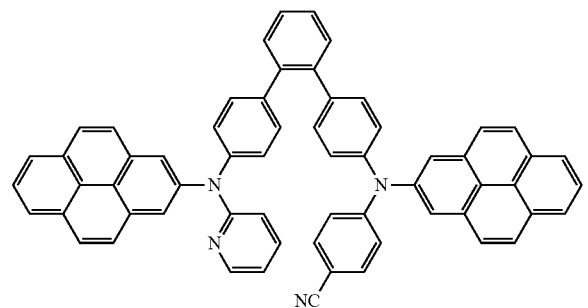
36
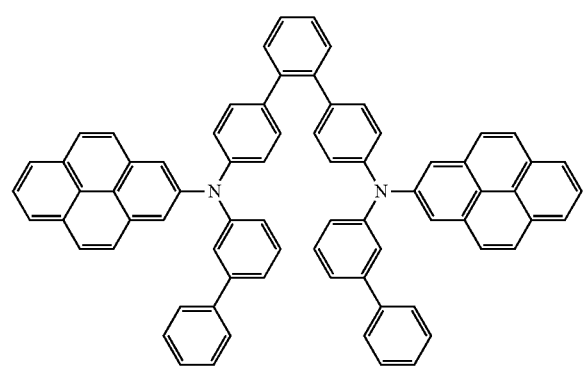
43
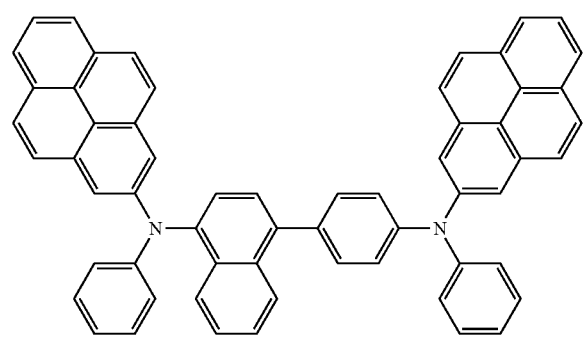
44
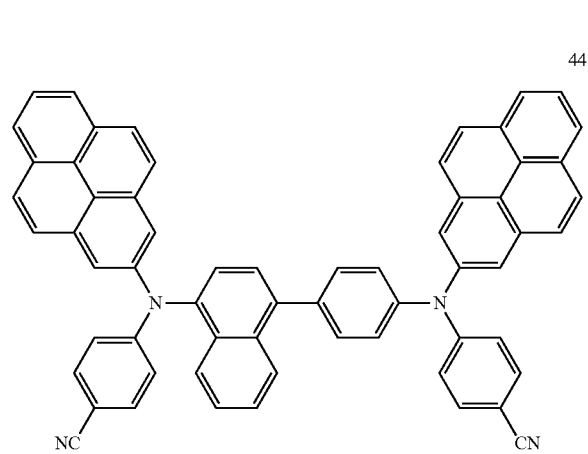
45
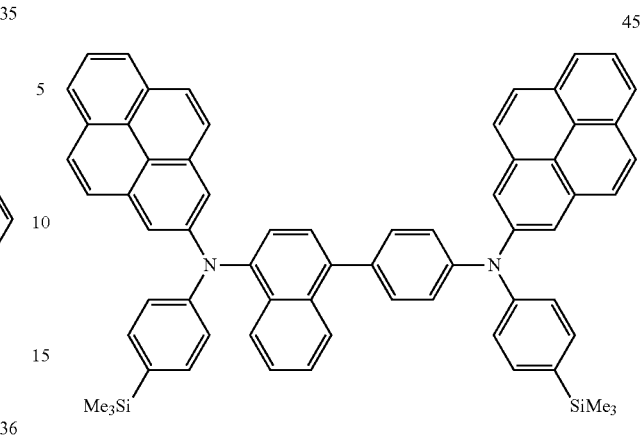
46
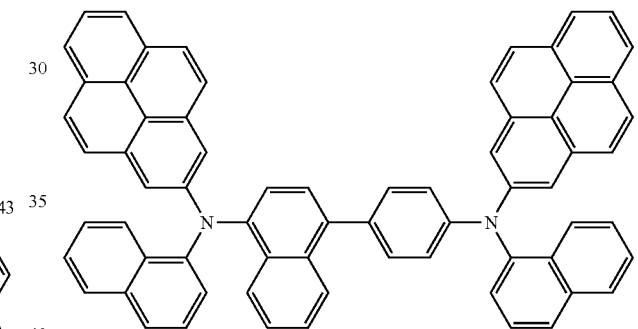
47
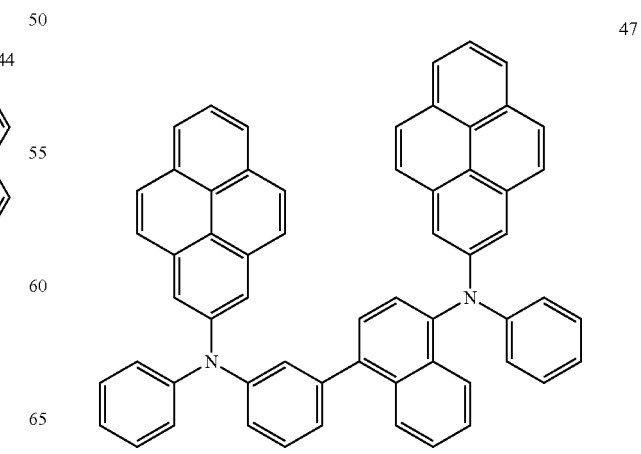

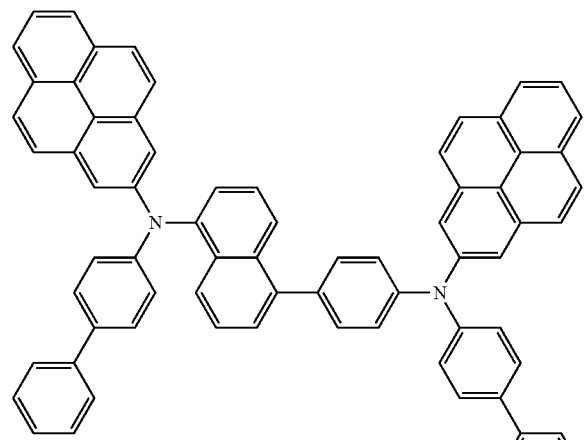
48
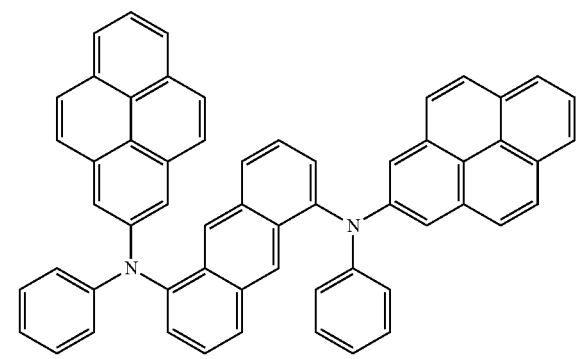
49
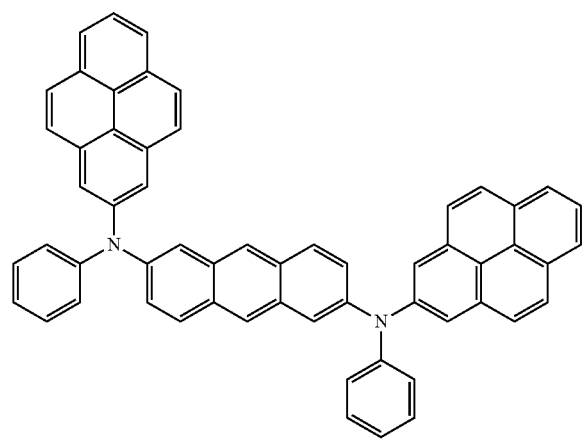
50
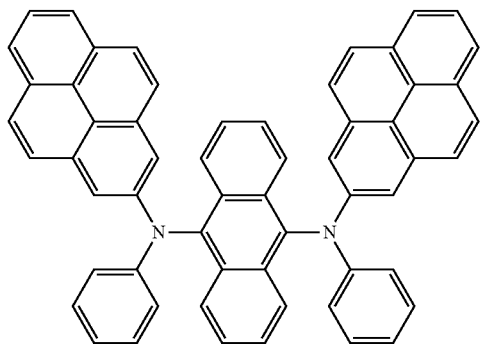
51
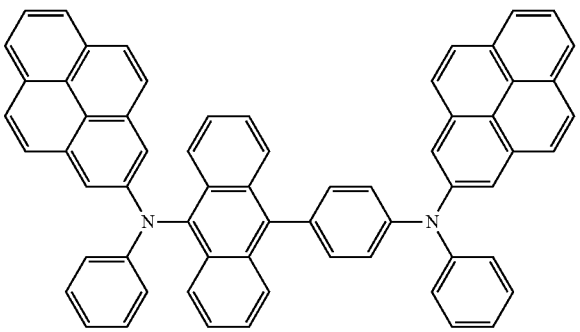
52
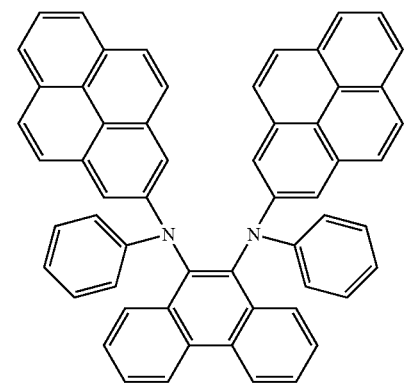
53
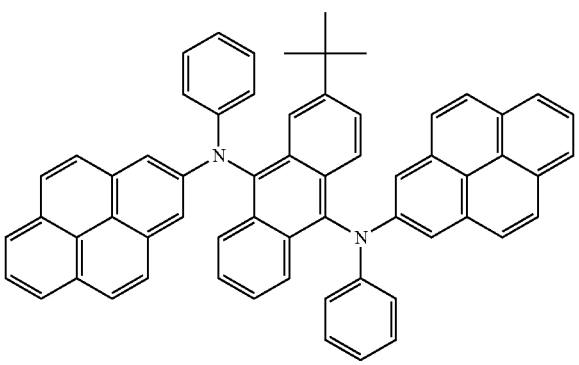
55

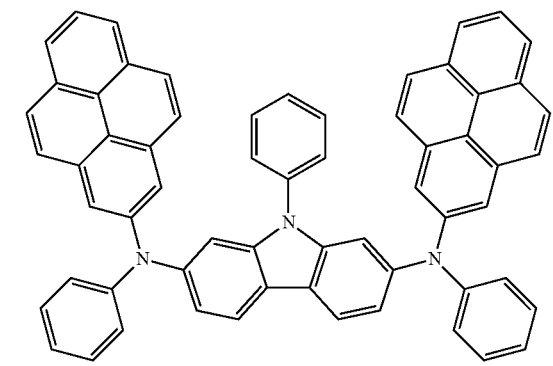
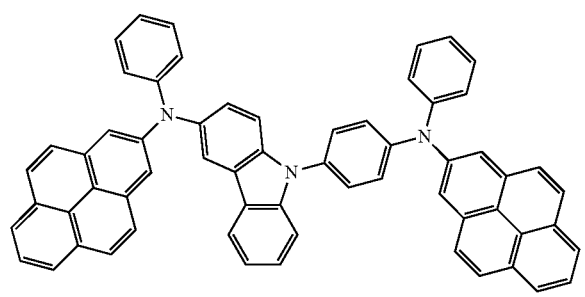
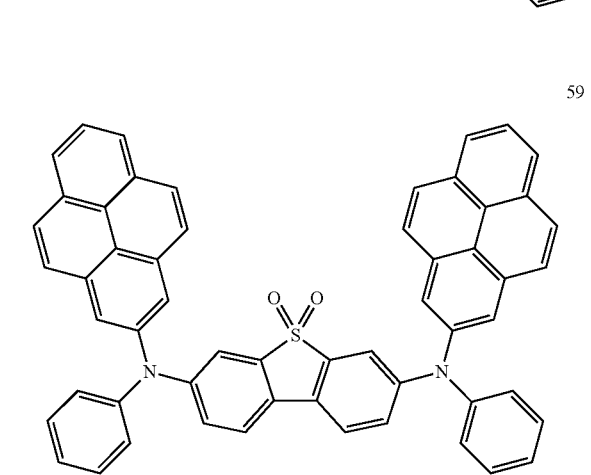
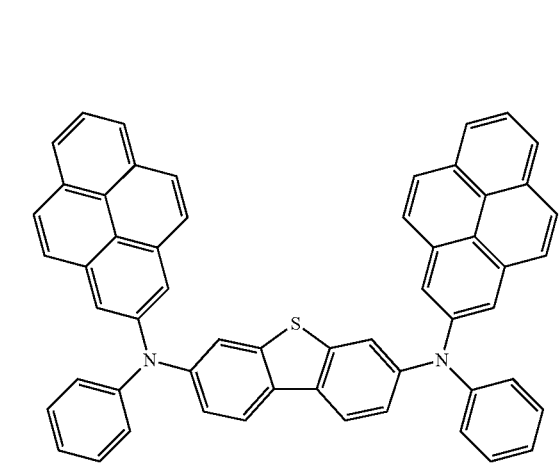
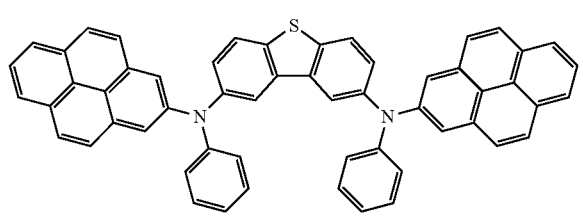
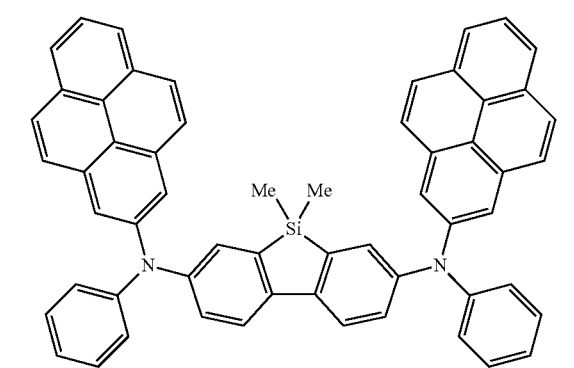
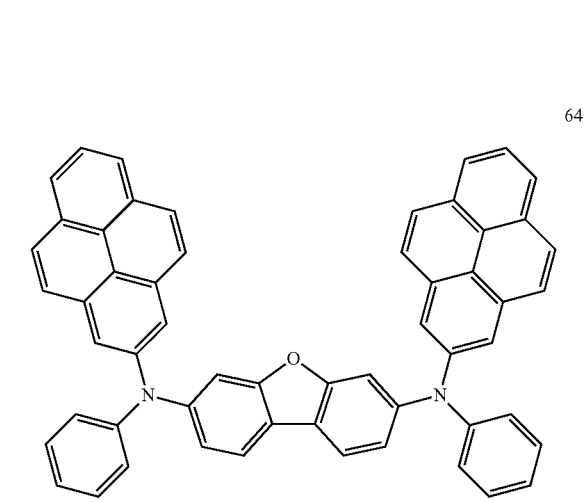 [SMILES: c1ccc(N(c2cc3ccc4cccc5ccc(c2)c3c45)c2ccc3c(c2)sc2cc(N(c4ccccc4)c4cc5ccc6cccc7ccc(c4)c5c67)ccc23)cc1]
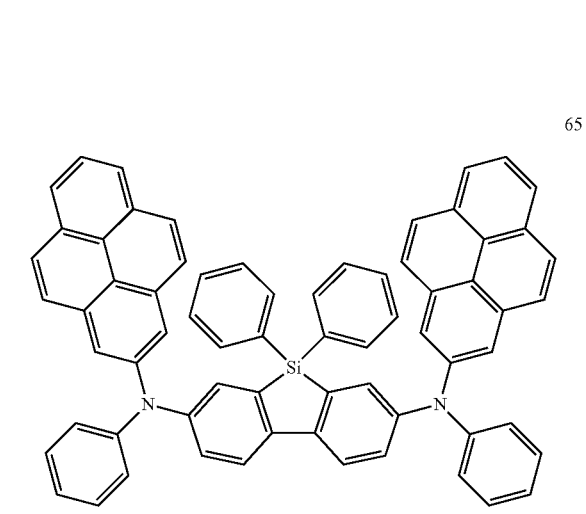

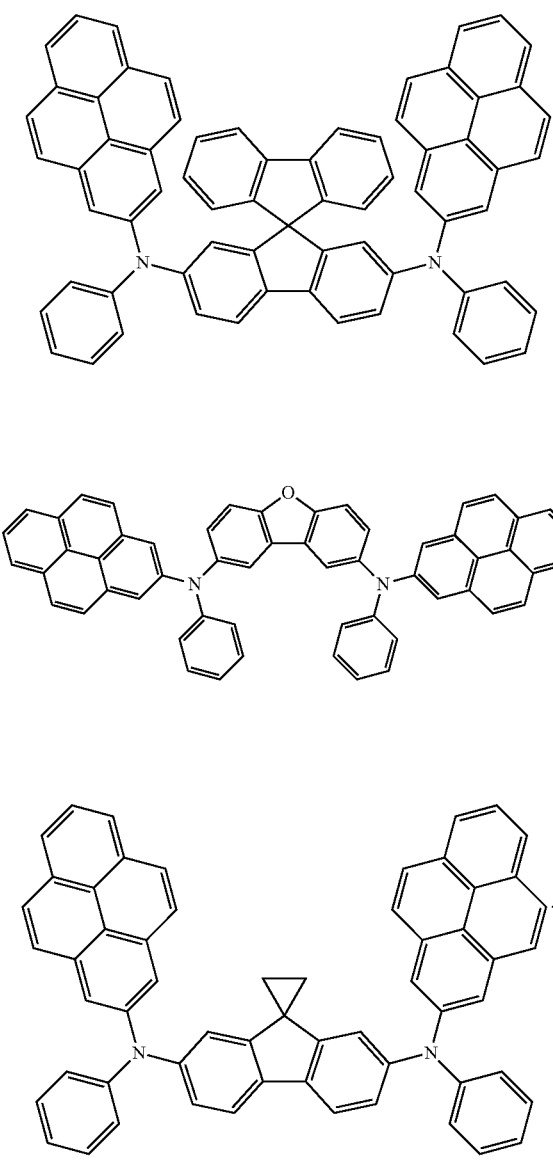

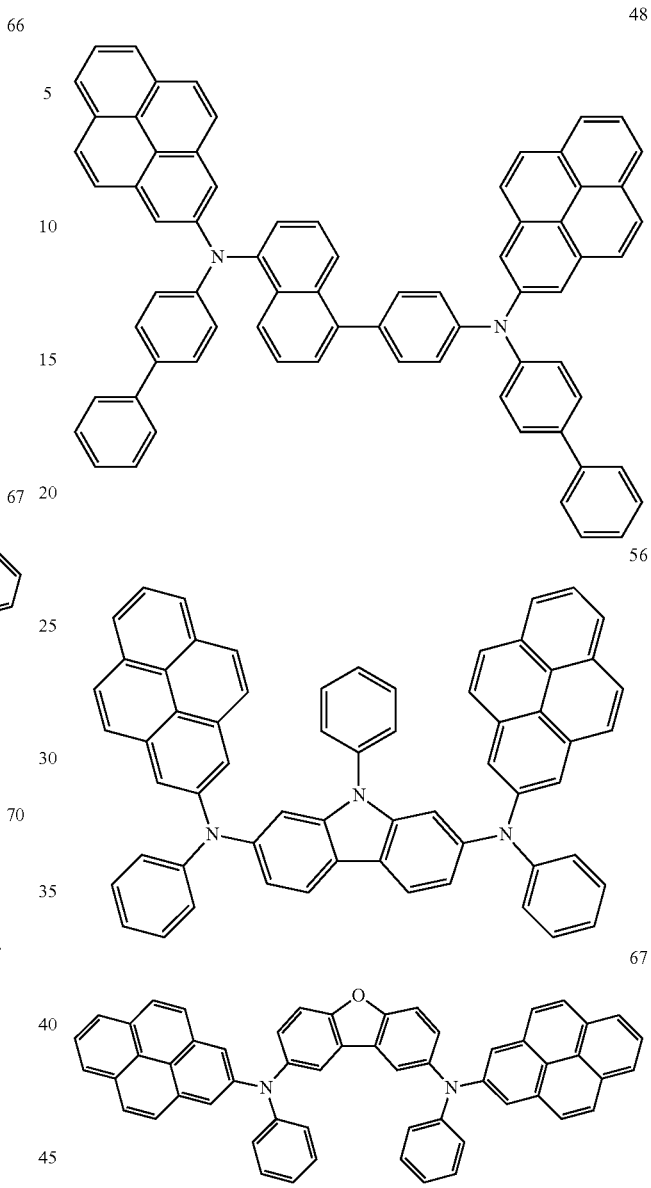

9. The compound as claimed in claim 8, wherein the compound is one of compounds 8, 15, 43, 48, 56, and 67:

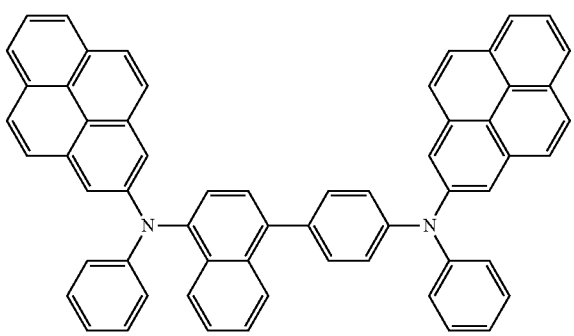

10. An organic light-emitting diode, comprising:
a substrate;
a first electrode on the substrate;
a second electrode disposed opposite to the first electrode; and
an organic layer interposed between the first electrode and the second electrode,
wherein the organic layer includes at least one layer, and the at least one layer includes a compound as claimed in claim 1.

11. The organic light-emitting diode as claimed in claim 10, wherein
the organic layer includes at least one of a hole injection layer, a hole transport layer, a hole injection-transport layer having both hole injection and hole transport capabilities at the same time, an emission layer, an electron injection layer, an electron transport layer, and an electron injection-transport layer having both electron injection and electron transport capabilities at the same time.

12. The organic light-emitting diode as claimed in claim 11, wherein
the organic layer includes at least one of the emission layer, the hole injection layer, the hole transport layer, and the hole injection-transport layer, and
at least one of the emission layer, the hole injection layer, the hole transport layer, and the hole injection-transport layer includes the compound.

13. The organic light-emitting diode as claimed in claim 11, wherein
the organic layer includes the emission layer, and the emission layer includes the compound.

14. The organic light-emitting diode as claimed in claim 11, wherein the emission layer includes a host and a dopant, and the dopant includes the compound.

15. The organic light-emitting diode as claimed in claim 11, wherein the emission layer includes an organometallic compound including Ir, Pt, Os, Re, Ti, Zr, Hf, Eu, Tb, Tm, or a combination thereof.

* * * * *